United States Patent
Ma et al.

(10) Patent No.: US 11,260,424 B2
(45) Date of Patent: Mar. 1, 2022

(54) CONTOURED ELECTRODE FOR CAPACITIVE MICROMACHINED ULTRASONIC TRANSDUCER

(71) Applicant: The Board of Trustees of the Leland Stanford Junior University, Stanford, CA (US)

(72) Inventors: Bo Ma, Palo Alto, CA (US); Jose Joseph, Stanford, CA (US); Kamyar Firouzi, Palo Alto, CA (US); Butrus T. Khuri-Yakub, Palo Alto, CA (US)

(73) Assignee: THE BOARD OF TRUSTEES OF THE LELAND STANFORD JUNIOR UNIVERSITY, Stanford, CA (US)

(*) Notice: Subject to any disclaimer, the term of this patent is extended or adjusted under 35 U.S.C. 154(b) by 0 days.

(21) Appl. No.: 17/152,555

(22) Filed: Jan. 19, 2021

(65) Prior Publication Data
US 2021/0220873 A1    Jul. 22, 2021

Related U.S. Application Data

(60) Provisional application No. 62/963,386, filed on Jan. 20, 2020, provisional application No. 62/963,393, filed on Jan. 20, 2020.

(51) Int. Cl.
*B06B 1/02* (2006.01)
*B06B 1/06* (2006.01)
(Continued)

(52) U.S. Cl.
CPC ........ *B06B 1/0215* (2013.01); *B06B 1/0292* (2013.01); *B06B 1/0651* (2013.01);
(Continued)

(58) Field of Classification Search
CPC ............... B06B 1/0292; B06B 1/0215; G01N 29/0654; G01N 29/2406; G01N 29/22;
(Continued)

(56) References Cited

U.S. PATENT DOCUMENTS

| 6,262,946 B1 | 7/2001 | Khuri-Yakub et al. |
| 6,430,109 B1 | 8/2002 | Khuri-Yakub et al. |
| (Continued) | | |

FOREIGN PATENT DOCUMENTS

| CN | 109174595 A | 1/2019 |
| EP | 3265801 | 1/2018 |
| (Continued) | | |

OTHER PUBLICATIONS

Robert McIntosh, Capacitive Transducers With Curved Electrodes, Feb. 2006, Published in IEEE sensors Journal, vol. 6, No. 1 (Year: 2006).*

(Continued)

*Primary Examiner* — Peter J Macchiarolo
*Assistant Examiner* — John M Royston
(74) *Attorney, Agent, or Firm* — Knobbe Martens Olson & Bear LLP

(57) ABSTRACT

Aspects of this disclosure relate to a capacitive micromachined ultrasonic transducer (CMUT) with a contoured electrode. In certain embodiments, the CMUT has a contoured electrode. The electrode may be non-planar to correspond to a deflected shape of the outer plate. A change in distance between the electrode and the plate after deflection may be greater than a minimum threshold across the width of the CMUT.

20 Claims, 31 Drawing Sheets

(51) Int. Cl.
  *B81B 3/00* (2006.01)
  *B81C 1/00* (2006.01)
  *G01N 29/06* (2006.01)
  *G01N 29/24* (2006.01)
  *G01N 29/22* (2006.01)

(52) U.S. Cl.
  CPC .......... *B06B 1/0662* (2013.01); *B81B 3/0021* (2013.01); *B81C 1/00166* (2013.01); *G01N 29/0654* (2013.01); *G01N 29/2406* (2013.01); *B06B 2201/55* (2013.01); *B81B 2201/0271* (2013.01); *B81B 2203/04* (2013.01); *B81C 2201/0157* (2013.01); *B81C 2201/0178* (2013.01); *G01N 29/22* (2013.01)

(58) Field of Classification Search
  CPC ........ B81C 1/00166; B81C 2201/0178; B81C 2201/0157; B81B 3/0021; B81B 2203/04; B81B 2201/0271
  See application file for complete search history.

(56) References Cited

U.S. PATENT DOCUMENTS

| | | |
|---|---|---|
| 6,493,288 B2 | 12/2002 | Khuri-Yakub et al. |
| 6,567,572 B2 | 5/2003 | Degertekin et al. |
| 6,789,426 B2 | 9/2004 | Yaralioglu et al. |
| 6,853,041 B2 | 2/2005 | Khuri-Yakub et al. |
| 6,854,338 B2 | 2/2005 | Khuri-Yakub et al. |
| 6,958,255 B2 | 10/2005 | Khuri-Yakub et al. |
| 7,274,623 B2 | 9/2007 | Bayram et al. |
| 7,305,383 B1 | 12/2007 | Khuri-Yakub et al. |
| 7,321,181 B2 | 1/2008 | Khuri-Yakub et al. |
| 7,530,952 B2 | 5/2009 | Huang et al. |
| 7,545,075 B2 | 6/2009 | Huang et al. |
| 7,564,172 B1 | 7/2009 | Huang |
| 7,612,635 B2 | 11/2009 | Huang |
| 7,615,834 B2 | 11/2009 | Khuri-Yakub et al. |
| 7,741,686 B2 | 6/2010 | Khuri-Yakub et al. |
| 7,745,248 B2 | 6/2010 | Park et al. |
| 7,745,973 B2 | 6/2010 | Bayram et al. |
| 7,747,301 B2 | 6/2010 | Cheng et al. |
| 7,759,839 B2 | 7/2010 | Huang |
| 7,764,003 B2 | 7/2010 | Huang |
| 7,779,696 B2 | 8/2010 | Huang |
| 7,843,022 B2 | 11/2010 | Kupnik et al. |
| 7,846,102 B2 | 12/2010 | Kupnik et al. |
| 7,880,565 B2 | 2/2011 | Huang |
| 7,956,510 B2 | 6/2011 | Huang |
| 8,004,373 B2 | 8/2011 | Huang |
| 8,008,105 B2 | 8/2011 | Huang |
| 8,018,301 B2 | 9/2011 | Huang |
| 8,105,941 B2 | 1/2012 | Huang |
| 8,120,229 B2 | 2/2012 | Huang |
| 8,247,945 B2 | 8/2012 | Huang |
| 8,276,433 B2 | 10/2012 | Kupnik et al. |
| 8,402,831 B2 | 3/2013 | Kupnik et al. |
| 8,451,693 B2 | 5/2013 | Nikoozadeh et al. |
| 8,531,919 B2 | 9/2013 | Cheng et al. |
| 8,787,116 B2 | 7/2014 | Petruzzello et al. |
| 8,796,901 B2 | 8/2014 | Huang |
| 8,852,104 B2 | 10/2014 | Oralkan et al. |
| 8,891,334 B2 | 11/2014 | Degertekin et al. |
| 8,926,517 B2 | 1/2015 | Huang |
| 8,952,595 B2 | 2/2015 | Huang |
| 8,975,984 B2 | 3/2015 | Huang |
| 9,132,450 B2 | 9/2015 | Huang |
| 9,224,648 B2 | 12/2015 | Huang |
| 9,242,273 B2 | 1/2016 | Ho et al. |
| 9,242,274 B2 | 1/2016 | Ho et al. |
| 9,327,967 B2 | 5/2016 | Huang |
| 9,586,233 B2 | 3/2017 | Apte et al. |
| 9,592,030 B2 | 3/2017 | Rothberg et al. |
| 9,660,554 B2 | 5/2017 | Huang |
| 9,676,617 B2 | 6/2017 | Huang |
| 9,864,190 B2 | 1/2018 | Mandella et al. |
| 10,029,912 B2 | 7/2018 | Huang |
| 10,123,782 B2 | 11/2018 | Bhuyan et al. |
| 10,773,277 B2 | 9/2020 | Van Rens |
| 2002/0039463 A1 | 4/2002 | Degertekin et al. |
| 2002/0048220 A1 | 4/2002 | Khuri-Yakub et al. |
| 2002/0075098 A1 | 6/2002 | Khuri-Yakub et al. |
| 2002/0083771 A1 | 7/2002 | Khuri-Yakub et al. |
| 2003/0029242 A1 | 2/2003 | Yaralioglu et al. |
| 2004/0085858 A1 | 5/2004 | Khuri-Yakub et al. |
| 2005/0187591 A1 | 8/2005 | Carter et al. |
| 2005/0219953 A1 | 10/2005 | Bayram et al. |
| 2005/0228285 A1 | 10/2005 | Huang et al. |
| 2005/0234342 A1 | 10/2005 | Bayram et al. |
| 2005/0236937 A1 | 10/2005 | Khuri-Yakub et al. |
| 2006/0004289 A1 | 1/2006 | Tian et al. |
| 2006/0075818 A1 | 4/2006 | Huang et al. |
| 2006/0224053 A1 | 10/2006 | Black et al. |
| 2006/0253007 A1 | 11/2006 | Cheng et al. |
| 2007/0089516 A1 | 4/2007 | Khuri-Yakub et al. |
| 2007/0093702 A1 | 4/2007 | Yu et al. |
| 2007/0215964 A1 | 9/2007 | Khuri-Yakub et al. |
| 2007/0287912 A1 | 12/2007 | Khuri-Yakub et al. |
| 2008/0048211 A1 | 2/2008 | Khuri-Yakub et al. |
| 2008/0221448 A1 | 9/2008 | Khuri-Yakub et al. |
| 2008/0259725 A1 | 10/2008 | Bayram et al. |
| 2009/0122651 A1 | 5/2009 | Kupnik et al. |
| 2009/0140357 A1 | 6/2009 | Kupnik et al. |
| 2009/0142872 A1 | 6/2009 | Park et al. |
| 2010/0152559 A1 | 6/2010 | Cheng et al. |
| 2010/0152591 A1 | 6/2010 | Yu et al. |
| 2010/0173437 A1 | 7/2010 | Wygant et al. |
| 2010/0225200 A1 | 9/2010 | Kupnik et al. |
| 2010/0268152 A1 | 10/2010 | Oralkan et al. |
| 2011/0023582 A1 | 2/2011 | Kupnik et al. |
| 2011/0050033 A1 | 3/2011 | Nikoozadeh et al. |
| 2011/0068654 A1 | 3/2011 | Cheng et al. |
| 2012/0086307 A1* | 4/2012 | Kandori ................ B06B 1/0292 310/300 |
| 2012/0330157 A1 | 12/2012 | Mandella et al. |
| 2013/0087867 A1 | 4/2013 | Ho et al. |
| 2013/0088118 A1 | 4/2013 | Ho et al. |
| 2013/0245505 A1 | 9/2013 | Khuri-Yakub et al. |
| 2013/0301394 A1* | 11/2013 | Chen ..................... B06B 1/0292 367/155 |
| 2014/0239770 A1 | 8/2014 | Apte et al. |
| 2015/0150503 A1 | 6/2015 | Pamnani et al. |
| 2015/0250388 A1 | 9/2015 | Arbabian et al. |
| 2015/0377837 A1 | 12/2015 | Apte et al. |
| 2016/0000412 A1 | 1/2016 | Bhuyan et al. |
| 2017/0232474 A1 | 8/2017 | Oralkan et al. |
| 2017/0360399 A1 | 12/2017 | Rothberg et al. |
| 2018/0280735 A1 | 10/2018 | Khuri-Yakub et al. |
| 2018/0376253 A1 | 12/2018 | Lutsky et al. |
| 2019/0076130 A1 | 3/2019 | Bhuyan et al. |
| 2019/0076674 A1 | 3/2019 | Ergun et al. |
| 2020/0254285 A1 | 8/2020 | Jang et al. |
| 2021/0220872 A1 | 7/2021 | Ma et al. |

FOREIGN PATENT DOCUMENTS

| | | |
|---|---|---|
| WO | WO 2006/123298 | 11/2006 |
| WO | WO 2006/123299 | 11/2006 |
| WO | WO 2006/123300 | 11/2006 |
| WO | WO 2006/123301 | 11/2006 |
| WO | WO 2006/134580 | 12/2006 |
| WO | WO 2007/015218 | 2/2007 |
| WO | WO 2007/015219 | 2/2007 |
| WO | WO 2007/115283 | 10/2007 |
| WO | WO 2007/115294 | 10/2007 |
| WO | WO 2018-115283 A1 | 6/2018 |

OTHER PUBLICATIONS

Dauba, Ambre, et al., "Evaluation of capacitive micromachined ultrasonic transducers for passive monitoring of microbubble-assisted ultrasound therapies," Journal of the Acoustical Society of America, 148, 2248 (2020).

(56) References Cited

OTHER PUBLICATIONS

Behnamfar, Parisa, et al., "Transceiver Design for CMUT-Based Super-Resolution Ultrasound Imaging," IEEE Transactions on Biomedical Circuits and Systems, vol. 10, No. 2, Apr. 2016.
Pirouz, Amirabbas, "Capacitive Micromachined Ultrasound Transducer (CMUT) Design and Fabrication for Intracardiac Echocardiography," Georgia Institute of Technology, May 2019.
International Search Report for International Application No. PCT/US2021/013997 dated May 12, 2021.
Cheng, Ching-Hsiang, et al., "A Flexible Capacitive Micromachined Ultrasonic Transducer (CMUT) Array with Increased Effective Capacitance from Concave Bottom Electrodes for Ultrasonic Imaging Applications," IEEE International Ultrasonics Symposium Proceedings, 2009.
Wong, Serena H., et al., "Capacitive Micromachined Ultrasonic Transducer Arrays for Integrated Diagnostic/Therapeutic Catheters," AIP Conference Proceedings 829, pp. 395-399, May 2006.
U.S. Appl. No. 17/152,563, filed Jan. 19, 2021, Pulse Train Excitation for Capacitive Micromachined Ultrasonic Transducer.

\* cited by examiner

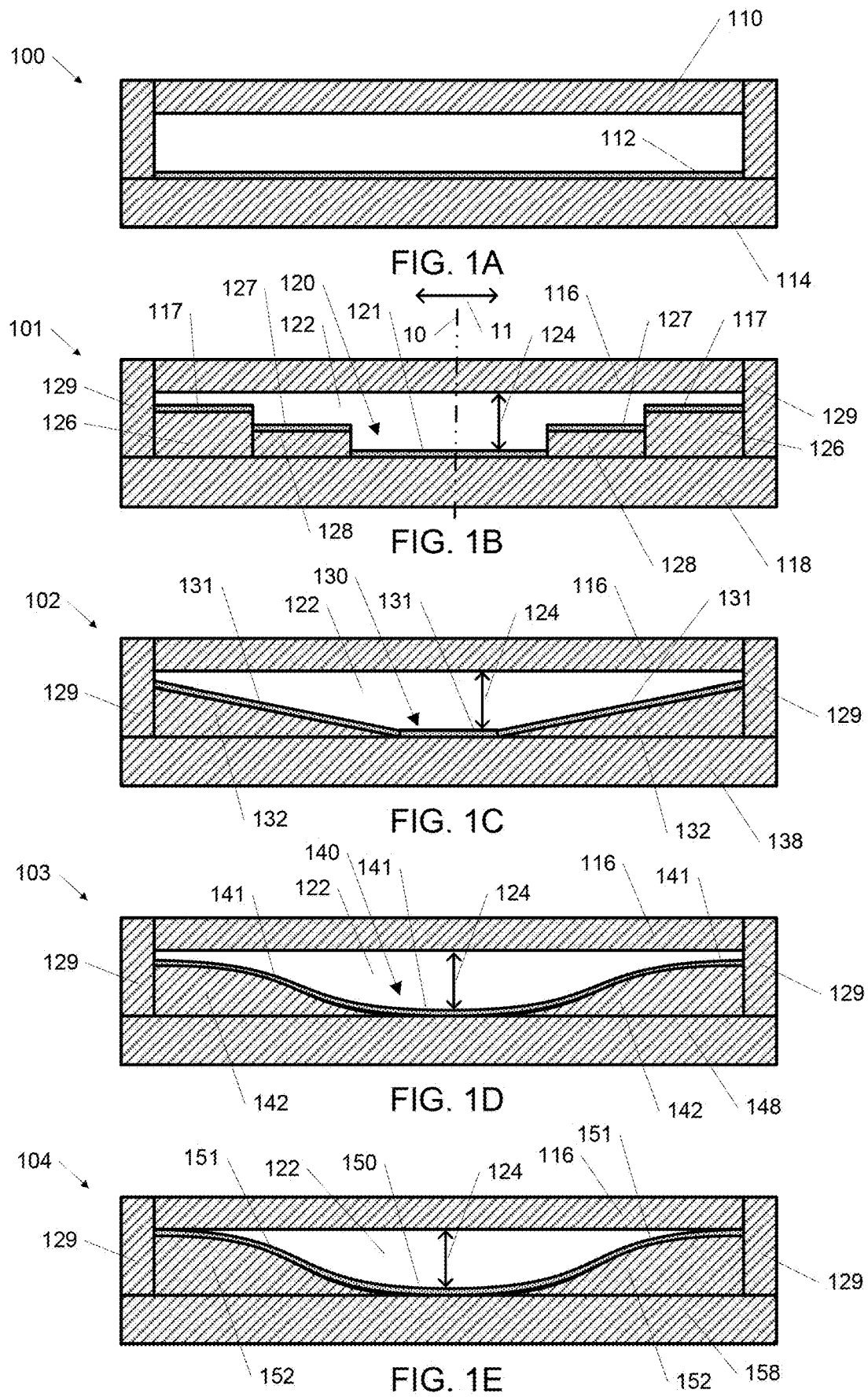

CONTOURED ELECTRODE FOR CAPACITIVE MICROMACHINED ULTRASONIC TRANSDUCER

CROSS REFERENCE TO PRIORITY APPLICATIONS

This application claims the benefit of priority of U.S. Provisional Patent Application No. 62/963,386, filed Jan. 20, 2020 and titled "CMUT with Contoured Substrate and Fabrication Method," the disclosure of which is hereby incorporated by reference in its entirety. This application also claims the benefit of priority of U.S. Provisional Patent Application No. 62/963,393, filed Jan. 20, 2020 and titled "Half wave pulse excitation of CMUTs for higher output pressure," the disclosure of which is hereby incorporated by reference in its entirety.

FEDERAL SUPPORT STATEMENT

This invention was made with Government support under contract 5R01EB023901-02 awarded by the National Institutes of Health. The Government has certain rights in the invention.

BACKGROUND

Technical Field

This development relates to ultrasonic transducers, such as capacitive micromachined ultrasonic transducers (CMUTs).

Description of Related Art

Capacitive Micromachined Ultrasonic Transducers (CMUTs) are an alternative to piezoelectric ultrasonic transducers. CMUTs can be used in a variety of applications, including medical imaging, other imaging, therapeutics, high intensity focused ultrasound (HIFU), and chemical sensing applications. CMUTs can be used to transmit and/or receive ultrasound. CMUTs used to transmit ultrasound energy have a transmit output pressure. CMUTs used in receiving applications have a receive sensitivity. Improvements to transmit output pressure and/or receive sensitivity for CMUTs are desirable.

SUMMARY OF CERTAIN INVENTIVE ASPECTS

The embodiments disclosed herein each have several aspects, no single one of which is solely responsible for the disclosure's desirable attributes. Without limiting the scope of this disclosure, its more prominent features will now be briefly discussed. After considering this discussion, and particularly after reading the section entitled "Detailed Description," one will understand how the features of the embodiments described herein provide advantages over existing systems, devices and methods for ultrasound using capacitive micromachined ultrasonic transducer (CMUT).

The following disclosure describes non-limiting examples of some embodiments. For instance, other embodiments of the disclosed systems and methods may or may not include the features described herein. Moreover, disclosed advantages and benefits can apply only to certain embodiments and should not be used to limit the disclosure.

CMUTs with a contoured electrode are described. The electrode may be non-planar to correspond to a deflected shape of an outer plate. The change in distance between the electrode and plate after deflection relative to an undeflected distance may be within a narrow range across the width of the transducer. A method for fabricating the contoured electrode is also described.

Methods of exciting a CMUT using half-wave pulse are also described. The half-wave pulse may have a period of zero amplitude and periodically repeat at the excitation frequency. The pulse sequence may be biased with a direct current.

In an aspect, a CMUT comprises a contoured electrode and a plate covering the contoured electrode to form a cavity. Voltage applied between the contoured electrode and the plate deflects the plate. The cavity has a non-uniform cavity spacing between the plate and the contoured electrode, and the cavity spacing is largest within a central region of the plate. In some embodiments, a two-dimensional cross-sectional profile of the contoured electrode may be one or more of: piece-wise linear, curved, and stepped. The contoured electrode may include one or more of the following: at least one planar portion, at least one concave portion, and at least one convex portion.

In another aspect, a capacitive micromachined ultrasonic transducer (CMUT), comprises a contoured electrode, a substrate and a plate. The contoured electrode defines a central axis, with the contoured electrode extending from a central electrode region that intersects the central axis to an outer electrode region. The substrate is supporting the contoured electrode. The plate is at least partially axially spaced apart from the contoured electrode forming a cavity therebetween, the plate extending from a central plate region that intersects the central axis to an outer plate region. A voltage applied across the contoured electrode and the plate deflects the plate from an undeflected configuration into a deflected configuration. In the undeflected configuration, a first axial distance from a point within the central plate region to a point within the central electrode region is greater than a second axial distance from a point within the outer plate region to a point within the outer electrode region.

Various embodiments of the various aspects may be implemented. When the plate is deflected, the first and second axial distances may each decrease at least 10% relative to when the plate is undeflected. The first axial distance when the plate is undeflected may be between 10 nanometers and 200 microns. A two-dimensional cross-sectional profile of the contoured electrode may be one or more of: piece-wise linear, curved, and stepped. The contoured electrode may include one or more of the following: at least one planar portion, at least one concave portion, and at least one convex portion. The substrate may comprise one or more of the following: silicon, silicon oxide, silicon nitride, glass, quartz, sapphire, diamond, metal, and polymer. The substrate may comprise an electrically conductive substrate, and the contoured electrode may be a contoured surface of the electrically conductive substrate. The contoured electrode may comprise metal on the substrate. In the undeflected configuration, at least a portion of the outer electrode region of the contoured electrode may contact at least a portion of the outer plate region of the plate. A thickness of the plate may be between 0.1 and 200 microns. The CMUT may further comprise a plate support surrounding the contoured electrode and contacting the plate.

In another aspect, a CMUT comprises a contoured electrode, a substrate, and a plate. The contoured electrode has a central electrode region, a mid electrode region, and an outer electrode region. The substrate is supporting the contoured electrode. The plate is at least partially spaced apart from the contoured electrode forming a cavity therebetween, with the plate having a central plate region, a mid plate region, and an outer plate region. An electrical potential between the contoured electrode and the plate deflects the plate from an undeflected configuration into a deflected configuration. When the plate is undeflected, a first distance between the central plate region and the central electrode region is greater than a second distance between the mid plate region and the mid electrode region, and the second distance is greater than a third distance between the outer plate region and the outer electrode region.

Various embodiments of the various aspects may be implemented. A two-dimensional cross-sectional profile of the contoured electrode may be one or more of: piece-wise linear, curved, and stepped. The contoured electrode may include one or more of the following: at least one planar portion, at least one concave portion, and at least one convex portion. When the plate is deflected, the first, second and third distances may each decrease at least 10% relative to when the plate is undeflected. The first distance when the plate is undeflected may be between 10 nanometers and 200 microns.

In another aspect, a CMUT array comprises a plurality of any of the CMUTs described herein.

In another aspect, a CMUT comprises a contoured electrode and a plate covering the contoured electrode to form a cavity, where voltage applied across the contoured electrode and the plate deflects the plate.

In another aspect, a CMUT array comprises a plurality of CMUTs. Each of the plurality of CMUTs has a contoured electrode, and a plate covering the contoured electrode to form a cavity. Voltage applied across the contoured electrode and the plate deflects the plate.

Various embodiments of any of the aspects may be implemented. The cavity may have non-uniform cavity spacing between the plate and the contoured electrode. The cavity spacing may define an axial distance between the plate and the contoured electrode, and the cavity spacing may be transversely non-uniform. The cavity spacing may be non-uniform when the plate is both deflected and undeflected. The cavity spacing may be largest near a center of the plate. A largest cavity spacing, when the plate is undeflected, may be between 10 nanometers and 200 microns.

The cavity may be under vacuum. A pressure of the cavity may be 1 millitorr or less. The cavity may be vented to an external environment. The cavity may be at atmospheric pressure. A differential pressure across the plate may be less than 100 atmospheres.

The CMUT may further comprise a plate support surrounding the contoured electrode and contacting the plate. The plate support may contact one or more edges of the plate. At least part of the plate support may be electrically insulating. The plate support may comprise one or more of silicon, silicon oxide, and silicon nitride. The contoured electrode and the plate support may be formed from one layer of an electrically insulating material.

A profile of the contoured electrode may be one or more of: piece-wise linear, curved, and stepped. The contoured electrode may include at least one planar portion. At least a portion of the contoured electrode may be concave. At least a portion of the contoured electrode may be convex.

The CMUT may further comprise a substrate with the contoured electrode. The substrate may comprise one or more of: silicon, silicon oxide, silicon nitride, glass, quartz, sapphire, diamond, metal, and polymer. The substrate may comprise an electrically conductive substrate, and the contoured electrode may be a contoured surface of the electrically conductive substrate. The contoured electrode may comprise metal on the substrate.

An electrode perimeter of the contoured electrode may be circular, and a plate perimeter of the plate may be circular. Each of the electrode perimeter and the plate perimeter may have a radius between 5 microns and 5 millimeters. The plate may contact the substrate along the plate perimeter. The CMUT may further comprise a plate support that contacts the plate and at least partially encircles the contoured electrode. At least part of the plate support may be electrically insulating. The plate support may continuously encircle the contoured electrode, and the plate may continuously contact the plate support along the plate perimeter. An electrode perimeter of the contoured electrode may be rectangular, and a plate perimeter of the plate may be rectangular. Each edge of the electrode perimeter may have a length between 5 microns and 5 millimeters, and each edge of the plate perimeter may have a length between 5 microns and 5 millimeters. One pair of opposite edges of the plate perimeter may contact the substrate. All edges of the plate perimeter may contact the substrate.

The CMUT may further comprise a plate support that contacts the plate and at least partially surrounds the contoured electrode. At least part of the plate support may be electrically insulating. One pair of opposite edges of the plate perimeter may contact the plate support. All edges of the plate perimeter may contact the plate support. The plate support may continuously surround the contoured electrode, and the plate may continuously contact the plate support along each of its edges. The CMUT may further comprise at least one electrically non-conductive post joining the plate to the contoured electrode. A thickness of the plate may be between 0.1 and 200 microns.

The CMUT array may have a plurality of CMUTs forming a one-dimensional array. The plurality of CMUTs may form a two-dimensional array. The two-dimensional array may comprise a plurality of rows and a plurality of columns. The CMUT array may further comprise a plurality of row electrodes and a plurality of column electrodes, where each of the plurality of row electrodes may be electrically connected to all of the CMUTs in a corresponding one of the plurality of rows, and where each of the plurality of column electrodes may be electrically connected to all of the CMUTs in a corresponding one of the plurality of columns. Each of the plurality of row electrodes may electrically connect to the contoured electrode of each of the CMUTs in the corresponding one of the plurality of rows, and each of the plurality of column electrodes may electrically connect to the plate of each of the CMUTs in the corresponding one of the plurality of columns. The plurality of CMUTs may form at least one concentric circle.

In another aspect, a method for fabricating a CMUT comprises oxidizing a silicon wafer to create a uniform passivation layer over a uniform silicon layer; depositing, after said oxidizing, silicon nitride onto the passivation layer; oxidizing, after said depositing, the silicon wafer to convert a top portion of the uniform silicon layer into silicon oxide; and removing, after said converting, the silicon oxide and the silicon nitride, where a top surface of the silicon layer, after said removing, is contoured.

Various embodiments of the various method aspects may be implemented. A thickness of the top portion of the silicon wafer may be based on a thickness of the overlying passivation layer. The method may further comprise depositing metal onto the top surface to create a contoured electrode.

The method may further comprise bonding a plate to the silicon wafer such that the plate covers the top surface to form a cavity.

In another aspect, a method for fabricating a CMUT comprises transforming, using grayscale lithography, a uniform silicon oxide layer into a non-uniform silicon oxide layer, the silicon oxide layer contacting a planar top surface of a silicon wafer; oxidizing, after said transforming, the silicon wafer to convert a top portion of the silicon wafer into silicon oxide; and removing, after said oxidizing, the silicon oxide layer, where the top surface of the silicon wafer, after said removing, is contoured.

Various embodiments of the various method aspects may be implemented. A thickness of the top portion of the silicon wafer may be based on a thickness of the overlying silicon oxide layer. The method may further comprise depositing metal onto the top surface to create a contoured electrode. The method may further comprise bonding a plate to the silicon wafer such that the plate covers the top surface to form a cavity.

In another aspect, a method for fabricating a CMUT comprises oxidizing a silicon wafer to create a uniform passivation layer over a uniform silicon layer; depositing, after said oxidizing, a silicon-nitride diffusion pattern onto the uniform passivation layer; converting a top portion of the uniform silicon layer into silicon oxide by oxidizing the silicon wafer after said depositing; and removing, after said converting, the silicon oxide and the silicon nitride, where a top surface of the silicon layer, after said removing, is contoured.

Various embodiments of the various method aspects may be implemented. The method may further comprise depositing metal onto the top surface to create a contoured electrode. The method may further comprise bonding a plate to the silicon wafer such that the plate covers the top surface to form a cavity.

In another aspect, a method for fabricating a CMUT comprises depositing photoresist onto a silicon wafer; forming an initial aperture in the photoresist; initially etching the silicon wafer with the initial aperture; removing, after said initially etching, the photoresist around the initial aperture to enlarge the initial aperture into an enlarged aperture; subsequently etching the silicon with the enlarged aperture; and removing, after said subsequently etching, remaining photoresist, where a top surface of the silicon layer, after said removing, is contoured.

Another aspect of this disclosure is a method for driving a capacitive micromachined ultrasonic transducer (CMUT). The method includes electrically exciting the CMUT with a pulse train of unipolar pulses. The electrically exciting causes the CMUT to operate in a continuous wave mode.

Each of the unipolar pulses can be positive relative to a baseline of the pulse train. The baseline can be zero Volts.

Each of the unipolar pulses can be negative relative to a baseline of the pulse train. The baseline can be zero Volts.

The method can include generating the pulse train such that each of the unipolar pulses is shaped as one of: a half-sine pulse, a Gaussian pulse, or a rectangular pulse.

The method can include adjusting one or more of a pulse width of each of the unipolar pulses, a repetition period of the pulse train, and an amplitude of each of the unipolar pulses such that a plate of the CMUT, during said electrically exciting, does not physically contact an underlying substrate of the CMUT.

The method can include applying a bias voltage to the CMUT to adjust the baseline of the pulse train. The bias voltage can be zero Volts. The bias voltage can be non-zero and less than a pull-in voltage of the CMUT. The bias voltage can be non-zero and greater than or equal to a pull-in voltage of the CMUT.

The method can include generating a final unipolar pulse of the pulse train, in which the final unipolar pulse starts at a first bias voltage and ends at a second bias voltage different from the first bias voltage. The method can include continuously outputting the second bias voltage after the final unipolar pulse ends. Generating the final unipolar pulse can include shaping the final unipolar pulse to form at least part of a half-sine pulse. The first bias voltage can be less than the second bias voltage. The first bias voltage can be zero Volts. The second bias voltage can be less than a pull-in voltage of the CMUT. The method can include generating one or more intermediate unipolar pulses of the pulse train, where each of the one or more intermediate unipolar pulses start at the first bias voltage and end at the first bias voltage. Generating the one or more intermediate unipolar pulses can include shaping each of the one or more intermediate unipolar pulses to form a complete half-sine pulse. The method can include generating an initial unipolar pulse of the pulse train, in which the initial unipolar pulse starts at a third bias voltage and ends at the first bias voltage. The method can include continuously outputting the third bias voltage before the initial unipolar pulse starts. The third bias voltage can be zero Volts. The third bias voltage can be similar to the second bias voltage. Generating the initial unipolar pulse can include shaping the initial unipolar pulse to form at least part of a half-sine pulse.

Each of the unipolar pulses can be shaped as a half-sine pulse. The method can include generating a final unipolar pulse of the pulse train. The final unipolar pulse can start at 0° of the half-sine pulse and end at a first phase of the half-sine pulse, in which the first phase is greater than 0°. The method can include continuously outputting a non-zero bias voltage after the final unipolar pulse ends. The non-zero bias voltage can be similar to a final voltage of the final unipolar pulse. The non-zero bias voltage can be less than a pull-in voltage of the CMUT. The method can include generating one or more intermediate unipolar pulses of the pulse train, in which each of the one or more intermediate unipolar pulses starting at 0° and ending at 180°. The method can include generating an initial unipolar pulse of the pulse train, in which the initial unipolar pulse starts at a second phase of the half-sine pulse and ends at 180°. The method can include continuously outputting a non-zero bias voltage before the initial unipolar pulse starts, in which the non-zero bias voltage is similar to an initial voltage of the initial unipolar pulse. The second phase can be 0°. The second phase can be similar to the first phase.

The CMUT can transmit high intensity focused ultrasound in response to being electrically excited by the pulse train. The CMUT can transmit haptic energy to a person in response to being electrically excited by the pulse train.

The CMUT can include a contoured substrate.

Another aspect of this disclosure is a system for generating ultrasound. The system includes a capacitive micromachined ultrasonic transducer (CMUT) and excitation circuitry. The excitation circuitry is configured to generate a pulse train of unipolar pulses and drive the CMUT with the pulse train such that the CMUT outputs ultrasound energy in a continuous wave mode.

The system can include receive circuitry configured to process a signal received from the CMUT in a receive mode. The excitation circuitry can be configured to generate the pulse train such that a final pulse of the pulse train starts at a first bias voltage and ends at a second bias voltage different from the first bias voltage. The excitation circuitry can be configured to apply the second bias voltage to the CMUT in the receive mode.

Yet another aspect of this disclosure is a method of using a capacitive micromachined ultrasonic transducer. The method includes electrically exciting the capacitive micromachined ultrasonic transducer with a pulse train of unipolar pulses, wherein a final pulse of the pulse train starts at a first bias voltage and ends at a second bias voltage different from the first bias voltage; maintaining the second bias voltage after the final pulse ends; and processing a signal received by at least the capacitive micromachined ultrasonic transducer operating in a receive mode, wherein the signal is received by the capacitive micromachined ultrasonic transducer while the second bias voltage is applied to the capacitive micromachined ultrasonic transducer.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the drawing, can be arranged, substituted, combined, and designed in a wide variety of different configurations, all of which are explicitly contemplated and make part of this disclosure. For example, it will be understood that certain embodiments can include more elements than illustrated in a drawing and/or a subset of the elements illustrated in a drawing. As another example, some embodiments can incorporate any suitable combination of features from two or more drawings.

FIG. 1A is a cross-sectional view of an embodiment of a capacitive micromachined ultrasonic transducer (CMUT) having a flat electrode.

FIG. 1B is a cross-sectional view of an embodiment of a CMUT having a contoured electrode with a stepped profile.

FIG. 1C is a cross-sectional view of an embodiment of a CMUT having a contoured electrode with a piece-wise linear profile.

FIG. 1D is a cross-sectional view of an embodiment of a CMUT having a contoured electrode with concave and convex portions.

FIG. 1E is a cross-sectional view of an embodiment of a CMUT having a contoured electrode with concave and convex portions where outer edges of the electrode contact an upper plate.

DETAILED DESCRIPTION OF CERTAIN EMBODIMENTS

Figure 1F:
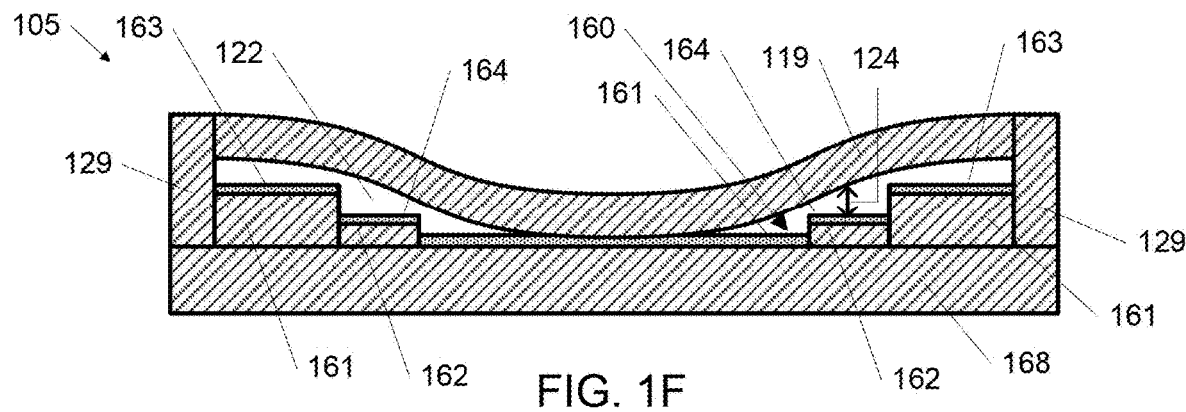
FIG. 1F is a cross-sectional view of an embodiment of a CMUT having a contoured electrode with a stepped profile where the upper plate contacts a central region of the electrode.

The following detailed description is directed to certain specific embodiments of the technology. In this description, reference is made to the drawings wherein like parts or steps may be designated with like numerals throughout for clarity. Reference in this specification to "one embodiment," "an embodiment," or "in some embodiments" means that a particular feature, structure, or characteristic described in connection with the embodiment is included in at least one embodiment of the invention. The appearances of the phrases "one embodiment," "an embodiment," or "in some embodiments" in various places in the specification are not necessarily all referring to the same embodiment, nor are separate or alternative embodiments necessarily mutually exclusive of other embodiments. Moreover, various features are described which may be exhibited by some embodiments and not by others. Similarly, various requirements are described which may be requirements for some embodiments but may not be requirements for other embodiments. Reference will now be made in detail to embodiments of the technology, examples of which are illustrated in the accompanying drawings. Plots in the drawings may be results of finite element analysis instead of measurement data. The plots in the drawings indicate desirable operation of CMUTs and/or excitation of CMUTs disclosed herein. The present disclosure relates to U.S. Pat. No. 17,152,563, titled "PULSE TRAIN EXCITATION FOR CAPACITIVE MICROMACHINED ULTRASONIC TRANSDUCER," filed on Jan. 19, 2021, and the disclosure of which is hereby incorporated by reference in its entirety herein.

Capacitive Micromachined Ultrasonic Transducers (CMUTs) are an alternative to piezoelectric ultrasonic transducers in a variety of applications, such as medical imaging, therapeutics, high intensity focused ultrasound (HIFU), and chemical sensing applications. A capacitive micromachined ultrasonic transducer (CMUT) with a contoured electrode is described. The electrode may be non-planar. The contour of the electrode may correspond to a non-planar deflected shape of an outer plate. The change in distance between the electrode and plate after deflection relative to an undeflected distance may be greater than a particular threshold percentage across the width of the electrode. A method for fabricating the contoured electrode is also described. The contoured electrode and the fabrication method can be used for the CMUTs operating in both conventional and collapse modes. "Conventional" mode as used herein has its usual and customary meaning, and includes without limitation CMUTs where the plate is not contacting the electrode at all times during the operation of the CMUT. "Collapse" mode as used herein has its usual and customary meaning, and includes without limitation CMUTs where the plate is contacting the electrode at all times during operation of the CMUT. The contoured electrode and related fabrication methods are described with respect to FIGS. 1A-12.

Further described are methods of exciting a CMUT using half-wave pulse techniques. The half-wave pulse may have a period of zero amplitude and periodically repeat at the excitation frequency. The pulse sequence may be biased with a direct current. In some embodiments, the half-wave pulse methods may be used with the contoured electrodes. The contoured electrode and related fabrication methods are described with respect to FIGS. 13A-28B.

A full sine wave with a direct current (DC) bias is being widely used as an excitation waveform for a CMUT. However, the electrostatic force resulting from the excitation is typically attractive regardless of the polarity of the electrodes. Therefore, the electrostatic force generated by the negative amplitude of the sine wave counteracts some part of the restoring elastic force and, thus, impedes the vibrating plate of the CMUT to fully return to an equilibrium position. The negative voltage can be inefficient. The negative voltage can limit the amplitude of the vibrations and consequently the ultrasound output pressure. A sine with a DC bias excitation waveform can create relatively strong harmonics, which are desirable to suppress in applications such as medical imaging. Also, with full sine wave excitation, toggling between receive and transmit modes involves switching electronics.

Methods and systems for exciting CMUTs are disclosed. The CMUTs can transmit a continuous wave of ultrasound energy in a continuous wave mode of operation. The continuous wave mode can be used in applications such as HIFU and haptic applications. CMUT excitation disclosed herein can provide improved transmit and/or receive performance. Pulse train excitation of a CMUT is disclosed. Such an excitation can include a half-wave pulse sequence to drive CMUTs harmonically. An excitation pulse train can be applied to a CMUTs operating in either conventional mode or collapse mode.

Aspects of this disclosure relate to a method of driving a CMUT that includes exciting the CMUT with a pulse train where each pulse of the pulse train is unipolar. The pulse train causes the CMUT to output a continuous wave of ultrasound energy. The pulses can be voltage pulses. A duration of each pulse can be less than a pulse repetition period. If each pulse is shaped as a full-cycle sine pulse, then the pulse repetition period is greater than the pulse duration. Each pulse of the pulse train is unipolar relative to a baseline. The baseline can be a zero Volts. The baseline can be a non-zero DC bias voltage. For example, pulses of the pulse train can be positive relative to the baseline. As another example, pulses of the pulse train can be negative relative to the baseline. Pulses of the pulse train can be shaped as a half-sine pulse, a Gaussian pulse, or a rectangular pulse. In certain applications, one or more of pulse width, pulse repetition period, pulse phase, or pulse amplitude can be adjusted. A bias voltage can be applied to the CMUT to adjust the baseline of the pulse train. The bias voltage can be non-zero and have a magnitude that is less than a magnitude of a pull-in voltage of the CMUT. Related ultrasound systems are disclosed where a pulse train of unipolar pulses excites one or more CMUTs. In certain applications, a CMUT with a contoured electrode can be excited by the pulse train of unipolar pulses.

Advantages of CMUT excitation disclosed herein include, but are not limited to, one or more of (1) increased transmit output ultrasound pressure, (2) suppression of higher frequency harmonics, (3) the ability to achieve an improved and/or optimal receive sensitivity and an improved and/or maximum output pressure without the need for switching electronics between transmit and receive modes, (4) lower excitation voltage, and (5) energy efficiency. For example, CMUT excitation disclosed herein can result in transmit output pressure being improved at least by 50% and at least by 150% improvement of the receive sensitivity. As another example, higher frequency harmonics can be reduced by at least 10 dB using CMUT excitation disclosed herein, compared to a conventional excitation waveform.

A. Contoured Electrodes

FIG. 1A is a cross-sectional view of an embodiment of a CMUT 100 having a completely flat or planar electrode 112 on a substrate 114 with a flat plate 110 or membrane. Flat or planar electrodes limit the electromechanical transformer ratio because the deformed plate or membrane cannot move in parallel with the substrate. There are various advantages of the contoured electrodes described herein. For example, relative to a flat electrode, with the contoured electrodes described herein, the transmit output pressure increases, the receive sensitivity is improved, there can be nearly 100% utilization of the active region, the electromechanical transformer ratio increases, and/or the driving voltage decreases. There are various advantages of the method for fabricating the contoured electrode. For example, it simplifies fabrication of 3D structures, only one mask is needed to achieve sloping or multi-step electrode, and/or the electrode profile can be more precisely controlled. There may be other features of the CMUT 100 that are not shown for clarity. For example, there may be an insulator layer as well.

FIGS. 1B-1I are cross-sectional views of various embodiments of CMUTs having contoured electrodes. "Contoured" as used herein has its usual and customary meaning and includes, without limitation, a surface having portions of varying elevation. Thus a two-dimensional profile of the electrode will have varying heights. In some embodiments, the contour is designed such that the electrode has a shape that generally corresponds to the configuration of the deflected upper plate under an applied voltage. By having the electrode profile correspond generally to the shape of the deflected plate, there is a larger percentage change in the axial separation of the plate as compared to the flat electrode of FIG. 1A. This in turn increases the transmit output pressure and improves the receive sensitivity, among other advantages described herein.

Some example embodiments of the contoured electrode are shown and described herein. The contoured electrode may be a multiple-step electrode (see FIG. 1B) or a multiple-segment sloping electrode (see FIG. 1C). The contoured electrode may be a curved electrode with the same or similar profile of the deformed plate driving by a large DC bias or AC excitation signal (see FIG. 1D). The contoured electrode or a substrate may contact the plate at the edge (see FIG. 1E), where curvature of the curved electrode can be designed and optimized for obtaining linear response by using the nonlinear increase of plate stiffness and the nonlinear gap to counteract the nonlinear electrostatic force, and/or significantly improving receive sensitivity by increasing driving voltage beyond the pull-in voltage. The contoured electrode also can be used for CMUTS that operate in collapse mode, as shown in FIGS. 1F-1I. There may be other features of the CMUTs shown in FIGS. 1B-1I that are not shown for clarity. For example, there may be an insulator layer as well.

Compared with a flat electrode (shown in FIG. 1A), the most active region in the contoured electrode with a strong electrical field can be increased up to 100%, thus resulting in an increased electromechanical transformer ratio. The electromechanical transformer ratio of flat CMUT designs is limited by the relatively small size of the maximally active region, which is typically less than 20%, resulting in lower transmit output pressure and lower receive sensitivity. Example advantages of the contoured electrode described herein are decreased driving voltage, an active region of nearly 100% of the cell, enhanced electrical field, increased transmit ultrasound output pressure, improved receive sensitivity, and the potential to achieve linear response with the nonlinear electrostatic actuator and significantly improve receive sensitivity without being limited by the pull-in effect. The transmit output pressure and the receive sensitivity can be improved at least by 100% compared to the flat CMUTs at the same time.

FIG. 1B is a cross-sectional view of an embodiment of a CMUT 101 having a contoured electrode 120 with a stepped profile. The CMUT 101 has a lower substrate 118 supporting the electrode 120 thereon. The electrode 120 includes a central portion 121, a mid portion 127, and an outer portion 117. The substrate 118 includes an outer portion 126 having the outer electrode portion 117 thereon. The substrate 118 includes a mid portion 128 having the mid electrode portion 127 thereon. The central portion 121 may be in a central region of the electrode 120. The central region may be only a central part of the central portion 121. The plate 116 may have a corresponding central and outer region located above the respective regions of the electrode 120.

The central and outer regions of the plate 116 and electrode 120 may have varying radial widths. The central regions of the electrode 120 and plate 116 may include a region that spans symmetrically across 5%, 10%, 15%, 20%, 25%, 30%, 35%, 40%, 45%, 50% or more of the radial width of the electrode 120 and plate 116, respectively. The central regions of the electrode 120 and plate 116 may span symmetrically across 5% or more, 10% or more, 15% or more, 20% or more, 25% or more, 30% or more, 35% or more, 40% or more, 45% or more, or 50% or more, of the radial width of the electrode 120 and plate 116, respectively. The central region may span symmetrically across 5% or less, 10% or less, 15% or less, 20% or less, 25% or less, 30% or less, 35% or less, 40% or less, 45% or less, or 50% or less, of the radial width of the electrode 120 and plate 116, respectively. The electrode 120 may extend continuously across the substrate. For example, the central electrode portion 121 may be connected to the mid electrode portion 127 by a vertical electrode portion therebetween. Similarly, the mid electrode portion 127 may be connected to the outer electrode portion 117 by a vertical electrode portion therebetween. The electrode 120 may or may not extend all the way to the plate supports 129.

A central axis 10 intersects the electrode 120 at a geometric center thereof. For reference, a radial direction 11 is shown, which refers to directions that are perpendicular to the central axis 10. "Outward" may refer to directions away from the central axis 10, and "inward" may refer to directions toward the central axis 10. Because the CMUT 101 is three-dimensional, the substrate portions 118, 128, 126 and electrode portions 121, 127, 117 are shown symmetrically about the axis 10. The electrode 120 may be circular, square, rectangular, polygonal, or other suitable shapes.

An upper plate 116 spans across the electrode 120. The plate 116 may be a membrane that behaves mechanically similar to a plate when deflected due to an applied voltage to the CMUT 101. The plate 116 may be a thin layer that vibrates to generate and receive ultrasonic signals. There may be only a single plate 116 as shown. In some embodiments, there may be multiple plates 116. The plate 116 may be formed of silicon, silicon nitride, silicon carbide, diamond, metal, or other suitable materials. The plate 116 may be circular, square, rectangular, polygonal, or other suitable shapes.

A plate support 129 supports the plate 116. The plate support 129 may surround the contoured electrode 120 and contact the plate 116. The plate 116 may be a three-dimensional structure with the plate support 129 supporting the plate 116 along an outer perimeter or outer region of the plate 116. The plate support 129 may be circular, square, rectangular, polygonal, or other suitable shapes. The plate support 129 may contact one or more edges of the plate 116. There may be multiple plate supports 129. The plate support 129 may be a post. The plate support 129 may extend upward through the plate 116. The plate 116 may sit on top of plate supports 129. In a CMUT in accordance with any of the embodiments disclosed herein, the plate of a CMUT can be positioned over plate supports. At least part of plate support 129 may be electrically insulating. The plate support 129 may include one or more of silicon, silicon oxide, silicon nitride, or other suitable materials. The contoured electrode 120 and the plate support 129 may be formed from one layer of an electrically insulating material.

The plate 116 is axially separated from the electrode 120 to define a cavity 122 therebetween. An axial distance 124 separates an upper surface of the electrode 120 from a lower surface of the plate 116 within the cavity 122. The cavity 122 may have a non-uniform axial distance 124 or cavity spacing between the plate 116 and the contoured electrode 120. The cavity spacing may define the axial distance 124 between the plate 116 and the contoured electrode 120, and the cavity spacing may be transversely (axially) non-uniform. The axial distance 124 may be non-uniform when the plate 116 is both deflected and undeflected. The axial distance 124 may be largest near a center of the plate. A largest axial distance 124, when the plate is undeflected, may be between 10 nanometers and 200 microns.

The cavity 122 may be under vacuum. A pressure of the cavity 122 may be 1 millitorr or less. The cavity 122 may be vented to an external environment. The cavity 122 may be at atmospheric pressure.

The axial distance 124 is shown measured at the central electrode portion 121 for illustration. The axial distance 124 may be measured at any location in the cavity 122. The axial distance 124 may be measured from within the central region of the electrode 120 to within the central region of the plate 116, from within the outer region of the electrode 120 to within the outer region of the plate 116, from locations between these two locations, or from other locations. The axial distance 124 as measured at the central electrode portion 121 may be greater than the axial distance 124 as measured at the mid electrode portion 127, which may be greater than the axial distance 124 as measured at the outer electrode portion 117.

When a voltage potential exists between the plate 116 and the electrode 120, the plate 116 will deflect. The plate 116 may deflect inward, toward the electrode 120 to form a concave shape. The axial distance 124 may decrease when the plate 116 deflects. The decrease in the length of the deflected axial distance 124 may be 5% or more, 10% or more, 15% or more, 20% or more, or 25% or more of the length of the undeflected axial distance 124. Flat electrodes, such as shown in FIG. 1A, will have very small percentage decreases in axial distance at the outer regions for a given deflection of the upper plate 110. This decreases output pressure capability and reduces sensitivity. In contrast, the contoured electrode 120 improves these parameters by having a larger relative decrease in the axial distance 124, due to the shape of the contoured electrode 120, for that same given deflection of the upper plate 110. In this manner, a similar voltage applied to the CMUT 101 and to the CMUT 100 will result in the CMUT 101 having greater sensitivity, output pressure, etc. as compared to the CMUT 100.

The above description of the CMUT 101 may apply to the embodiments of CMUTs described herein with reference to FIGS. 1C-1I, unless otherwise stated.

FIG. 1C is a cross-sectional view of an embodiment of a CMUT 102 having a contoured electrode 130 with a piece-wise linear profile. The CMUT 102 includes the plate 116 and the plate support 129. The electrode 130 may have the same features as the electrode 120, except the electrode 130 has a planar central portion 131 and ramped linear outer portion 131. The axial distance 124 is greatest at the central portion 131 and decreases radially outwardly along the outer portion 131. There may be a gap in the cavity 122 at the radially outermost edge between outer edges of the electrode portion 131 and plate 116. In some embodiments, the electrode portion 131 may contact the plate 116 at this outer edge. A substrate 138 may have an outer substrate portion 132 supporting the outer electrode portion 131. The outer substrate portion 132 has a ramped or angled upper surface. The substrate 138 may otherwise have the same features as the substrate 118.

FIG. 1D is a cross-sectional view of an embodiment of a CMUT 103 having a contoured electrode 140. The CMUT 103 includes the plate 116 and the plate support 129. The electrode 140 may have the same features as the electrode 120, except the electrode 140 includes concave and convex portions. As shown, the electrode 140 has a planar and/or concave portion at the central region, and a convex portion at the outer region. There may be one or more concave portions, one or more convex portions, and/or one or more linear portions. The axial distance 124 is greatest at a central portion 141 of the electrode 140 and decreases radially outwardly along an outer portion 141. There may be a gap in the cavity 122 at the radially outermost edge between outer edges of the electrode portion 141 and plate 116. In some embodiments, the electrode portion 141 may contact the plate 116 at this outer edge (e.g., See FIG. 1E). A substrate 148 may have an outer substrate portion 142 supporting the outer electrode portion 141. The substrate 148 may otherwise have the same features as the substrate 118.

FIG. 1E is a cross-sectional view of an embodiment of a CMUT 104 having a contoured electrode 150 with concave and convex portions. The CMUT 104 includes the plate 116, the plate support 129 and a substrate 158 with an outer substrate portion 152. The electrode 150 and substrate 158 may have the same features as the electrode 140 and substrate 148, respectively, except that the outer edges of the electrode 150 contact the upper plate 116. There is therefore no gap at the outermost edge of the cavity 122.

FIG. 1F is a cross-sectional view of an embodiment of a CMUT 105 having a contoured electrode 160. The CMUT 105 includes a deflected plate 119 and the plate support 129. The deflected plate 119 may have the same features as the plate 116 except for the deflection. The deflected plate 119 may by the plate 116 in a deflected configuration. The plate 116 may be the deflected plate 119 in an undeflected configuration.

The electrode 160 may have the same features as the electrode 120, except the electrode 140 includes a stepped profile. Further, the deflected plate 119 contacts a central region of the electrode 160. The electrode 160 includes a central portion 161, a mid portion 164, and an outer portion 163, which may have the same features as the central portion 121, the mid portion 127, and the outer portion 117 of the electrode 120 in FIG. 1B. The central portion 161, mid portion 164, and outer portion 163 may be, respectively, radially wider or narrower and/or axially taller or shorter than the central portion 121, the mid portion 127, and the outer portion 117. The CMUT 105 includes a substrate 168 having an outer substrate portion 161 and mid substrate portion 162, similar to the substrate 118 of the electrode 120 in FIG. 1B. The mid substrate portion 162 supports the mid electrode portion 164 and the outer substrate portion 161 supports the outer electrode portion 163. There may be less than two stepped portions, or there may be more than two stepped portions for the electrodes 160 or 120.

A lower surface of the deflected plate 117 contacts an upper surface of the central portion 161 of the electrode 160. A central region of the deflected plate 117 may contact a central region of the electrode 160. The deflected plate 117 may contact the electrode 160 when the plate is in the deflected configuration.

Figure 1G:
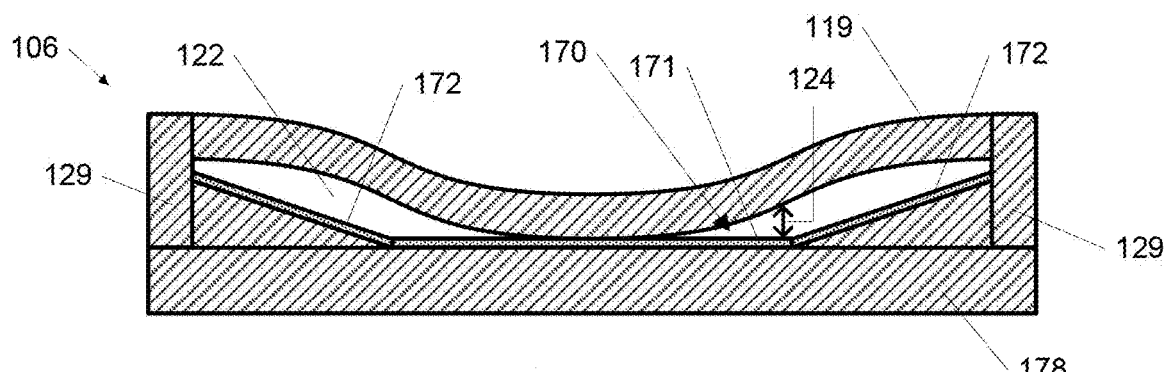
FIG. 1G is a cross-sectional view of an embodiment of a CMUT having a contoured electrode with a piece-wise linear profile where the upper plate contacts a central region of the electrode.

FIG. 1G is a cross-sectional view of an embodiment of a CMUT 106 having a contoured electrode 170 and substrate 178. The contoured electrode 170 has a piece-wise linear profile. The electrode 170 and the substrate 178 may have the same features as the electrode 130 and substrate 138 of FIG. 1C. A central electrode portion 171 may be radially wider or narrower than the central electrode portion 131. An outer electrode portion 172 may be longer or shorter, and/or at the same or different angle, as the outer electrode portion 131. The deflected plate 117 contacts a central region of the electrode 170 at the central electrode portion 171.

Figure 1H:
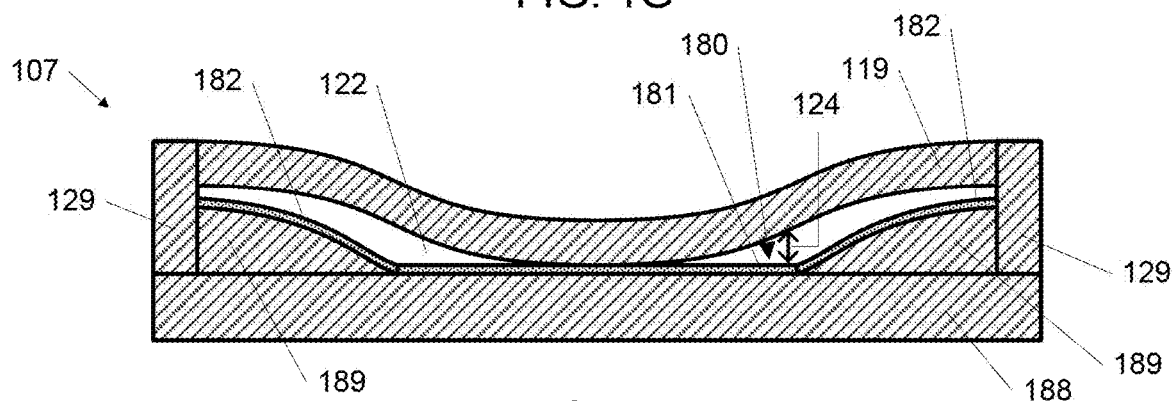
FIG. 1H is a cross-sectional view of an embodiment of a CMUT having a contoured electrode with a planar portion and a convex portion where the upper plate contacts a central region of the electrode.

FIG. 1H is a cross-sectional view of an embodiment of a CMUT 107 having a contoured electrode 180. The electrode 180 includes a planar central electrode portion 181 at the central region and a convex outer electrode portion 182 at the outer region. The CMUT 108 includes a substrate 188 having an outer substrate portion 189 supporting the outer electrode portion 182. The outer substrate portion 189 has a convex upper surface. The deflected upper plate 119 contacts the central region of the electrode 180 at the central electrode portion 181.

Figure 1I:
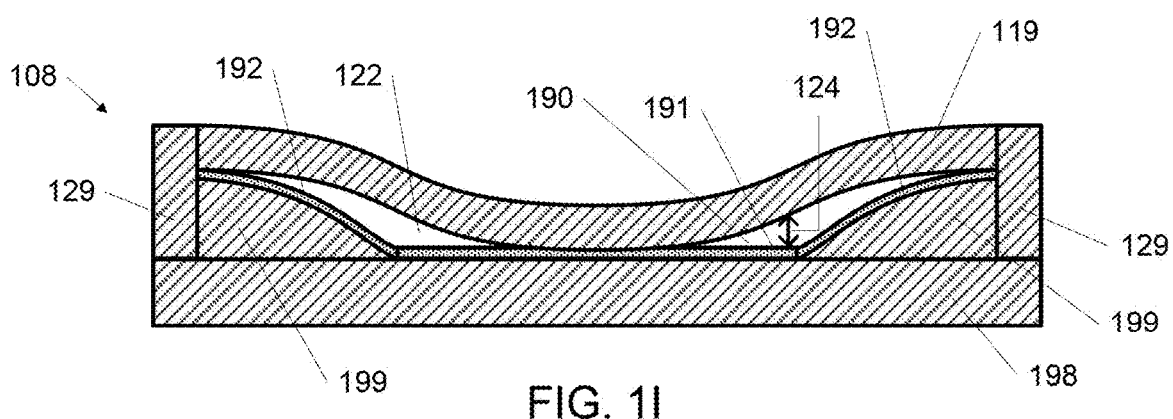
FIG. 1I is a cross-sectional view of an embodiment of a CMUT having a contoured electrode with a planar portion and a convex portion where the upper plate contacts a central region of the electrode and outer edges of the electrode contact an upper plate.

FIG. 1I is a cross-sectional view of an embodiment of a CMUT 108. The CMUT 108 includes a contoured electrode 190 and substrate 198, which may be similar respectively to the contoured electrode 180 and substrate 188. The electrode 190 includes a planar central electrode portion 191 and convex outer electrode portion 192. The substrate 188 includes a planar central portion and convex outer substrate portion 199. The CMUT 108 includes the deflected plate 119 contacting the outer electrode portion 192 at the radially outermost edge region. The deflected plate 119 contacts a central region of the electrode 190 at the central electrode portion 191.

Figure 2A:
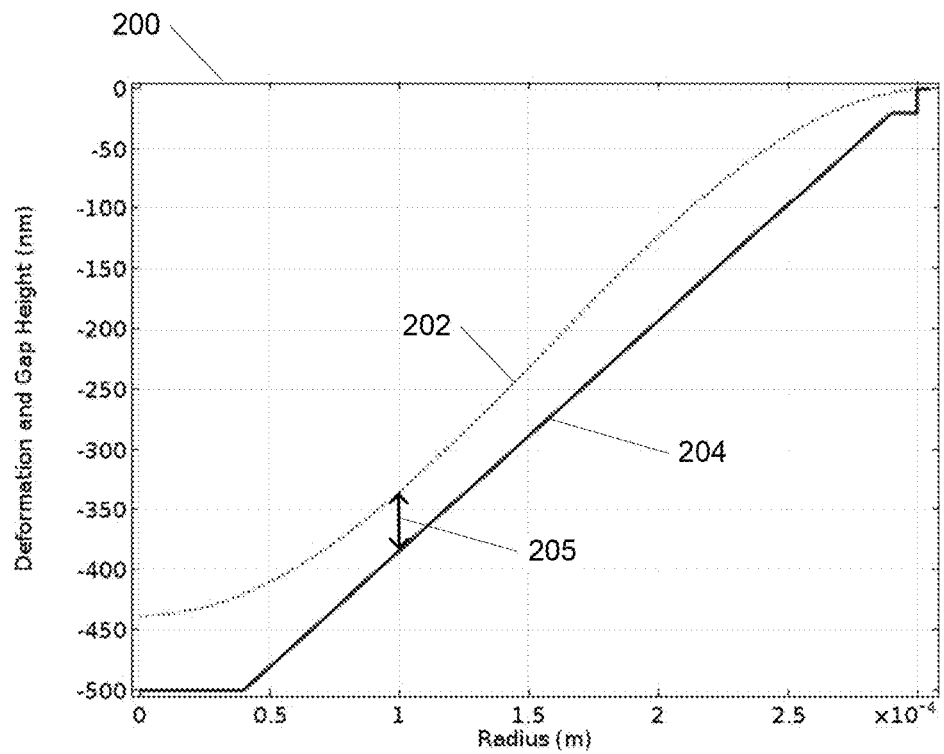
FIGS. 2A and 2B are data plots showing, respectively, cavity height for a CMUT with a contoured electrode contacting the plate at the outer edge with a curved portion, and output pressures for the CMUT with the contoured electrode versus a CMUT with a flat electrode.
Figure 2B:
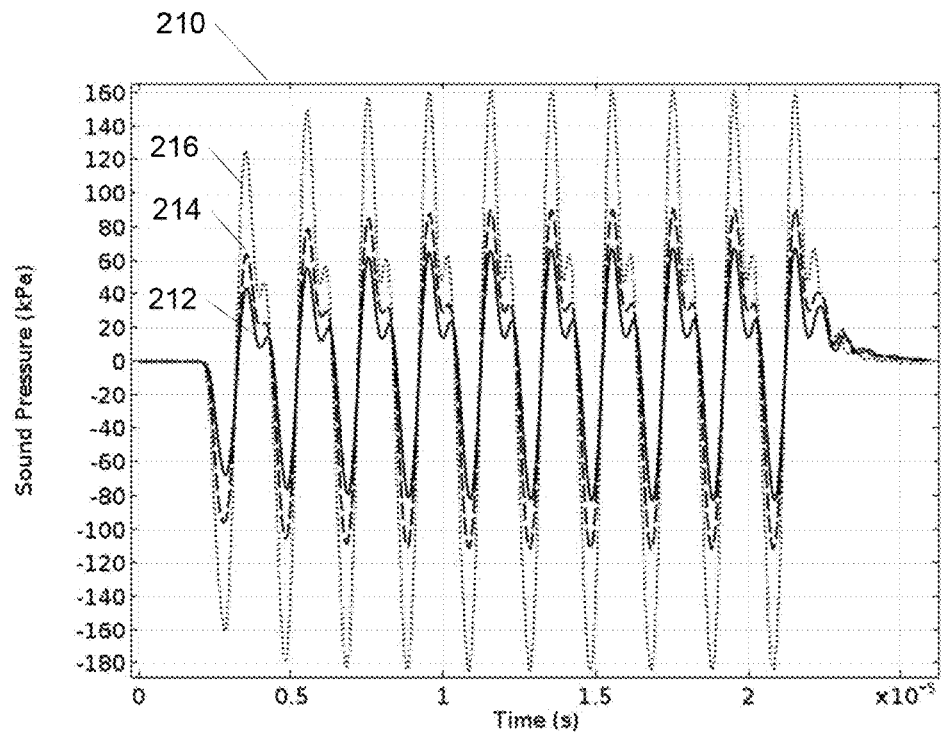

FIGS. 2A and 2B are data plots 200, 210 showing cavity height deflection and improved output pressure, respectively, for an embodiment of a CMUT having a contoured electrode relative to a flat electrode. The flat electrode may be similar to the CMUT 100 shown in FIG. 1A. FIG. 2A shows the data plot 200 with gap height in nanometers along the Y axis, and radius from the central axis in meters along the X axis. The gap height on the Y axis in FIG. 2A corresponds to an axial distance from the electrode to the plate. A data line 202 (dotted line) corresponds to the top plate deflection profile for the contoured electrode after the plate has deflected into a deformed or deflected configuration, and a line 204 (solid line) corresponds to the surface profile of the contoured electrode (e.g., see FIG. 1C). FIG. 2B shows line 212 for CMUT in configuration FIG. 1A, line 214 for CMUT in configuration FIG. 1B, and line 216 for CMUT in configuration FIG. 1C. In FIG. 1A, the data line 202 corresponds to a maximum AC being applied. The CMUT with contoured electrode was operated in conventional mode with a working frequency of 0.5 MHz. To decrease the geometric nonlinearity, a 20 micrometers (μm) thick plate was chosen. The radius was 350 μm for the CMUT with a flat electrode. The gap height was set to 0.5 µm to obtain a reasonable driving voltage. The pull-in voltage of the flat electrode CMUT is 32.12 V. In contrast, the pull-in voltage of the contoured electrode CMUT would decrease by around 50% of that value, benefitting from the larger active region. The radius was reduced to 300 µm to keep the same resonance frequency constant.

FIG. 2A also shows an example change 205 in axial distance or height of a cavity at a particular radial location of $1 \times 10^{-4}$ m. With the contoured electrode, the distance between the plate and substrate is smaller, so the same vibration of the plate gives a larger relative change in capacitance and hence more current. The height changes from about −385 nm to about −335 nm, for a total absolute change of about 50 nm, or about 10% reduction in the height. Further, the change in reduction of the height may be 10% or greater at a given radial location across a majority of the width of the electrode, for example across 51% or more, 60% or more, 70% or more, 80% of more, or 90% or more of the total width (e.g. diameter) of the electrode. FIG. 2A thus shows the distance 205 between the plate and the bottom electrode at a particular radius with a particular DC bias voltage. The distance may be about 50 nm. When the plate moves, the change in this distance is large relative to the 50 nm static gap. Due to the sloping electrode, this condition can be maintained across a large portion of the electrode radius or width, for example 51% or more, 60% or more, 70% or more, or 90% of more. This result is not believed to be achievable with a flat electrode.

FIG. 2B is the data plot 210 showing the transmit output sound pressure in kilopascals (kPa) on the Y axis generated by three different CMUTs. The data line 212 (solid line) corresponds to a flat electrode, the data line 214 (dashed line) corresponds to a contoured electrode with triple-step profile (e.g., see FIG. 1B), and the data line 216 (dotted) corresponds to a contoured electrode with sloping profile see FIG. 1C). The contoured electrodes can generate more than 2.2 times the output ultrasound pressure with lower DC and AC voltages, as compared to the flat electrode.

Figure 3A:
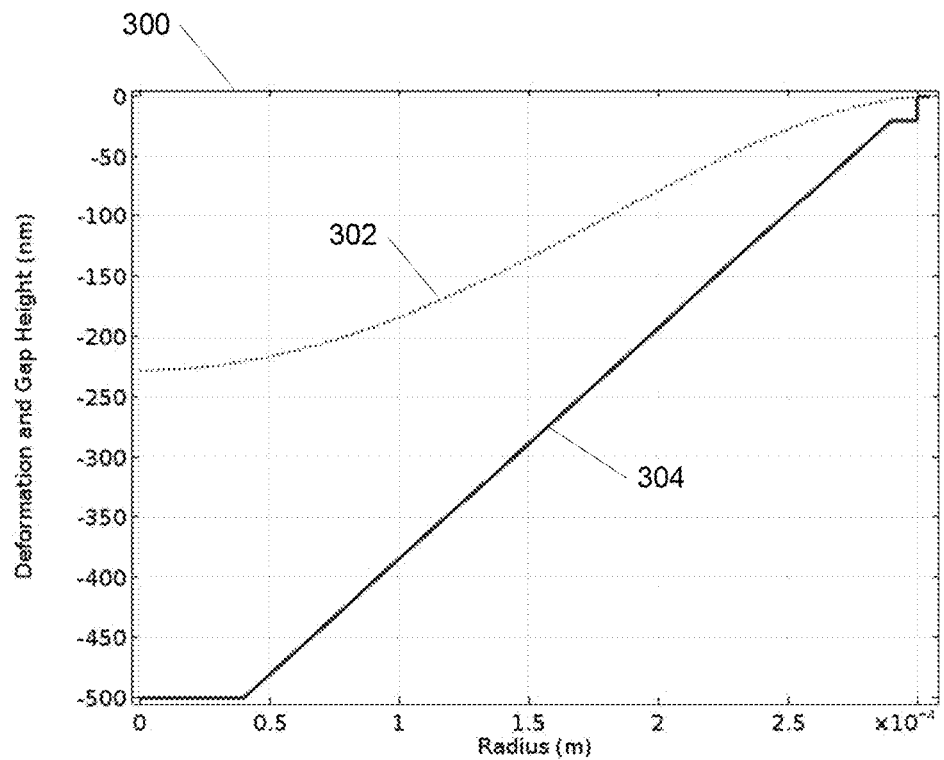
FIGS. 3A and 3B are data plots showing, respectively, cavity height deflection for a CMUT with a contoured electrode contacting the plate at the outer edge with a curved portion, and receive sensitivity for an embodiment of the CMUT having the contoured electrode relative to a CMUT having a flat electrode.
Figure 3B:
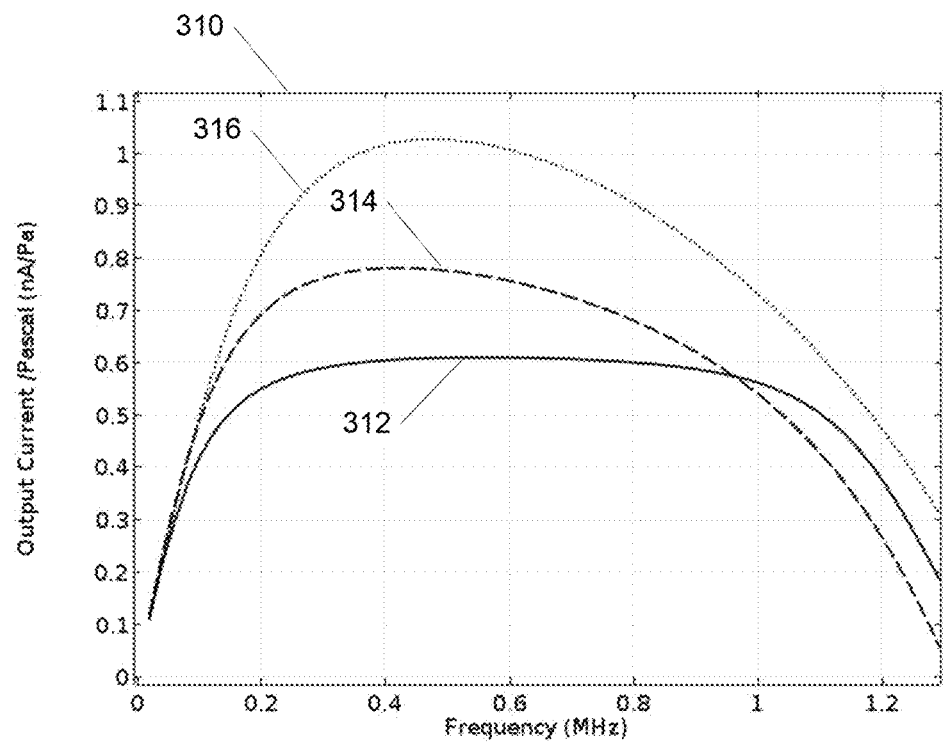

FIGS. 3A and 3B are data plots 300, 310 showing, respectively, cavity height deflection for a CMUT with a contoured electrode contacting the plate at the outer edge with a curved portion, and receive sensitivity for an embodiment of the CMUT having the contoured electrode relative to a CMUT having a flat electrode. The data plots 300, 310 correspond to the electrodes operating in conventional mode. In FIG. 3A, the cavity height is shown in nanometers on the Y axis, and the radius in meters on the X axis. A data line 302 (dotted line) corresponds to the cavity height for the contoured electrode after the plate has deflected into a deformed or deflected configuration, and a line 304 (solid line) corresponds to the surface profile of the contoured electrode (e.g., see FIG. 1C). The data line 302 shows the deflection with a DC bias set to 90% of the pull-in voltage. FIG. 3A may show the deflection of the plate due to DC bias and atmospheric pressure.

FIG. 3B is the data plot 310 showing the receive sensitivity of a CMUT with the sloping contoured electrode operating in conventional mode. The data plot 310 shows the output current in nanoamperes per Pascal (nA/Pa) on the Y axis versus the frequency in megahertz (MHz) on the X axis. FIG. 3B shows the output current for the same receive pressure as FIG. 3A of 1 Pascal. The data plot 312 (solid line) corresponds to a flat electrode (see FIG. 1A), the data line 314 (dashed line) corresponds to a contoured electrode with triple-step profile (see FIG. 1B), and the data line 316 (dotted line) corresponds to a contoured electrode with sloping profile (see FIG. 1C). The DC bias is set to 90% of the pull-in voltage. Compared with the conventional CMUT (e.g., see FIG. 1A), the receive sensitivity is improved more than 1.7 times for the contoured electrode.

Figure 4A:
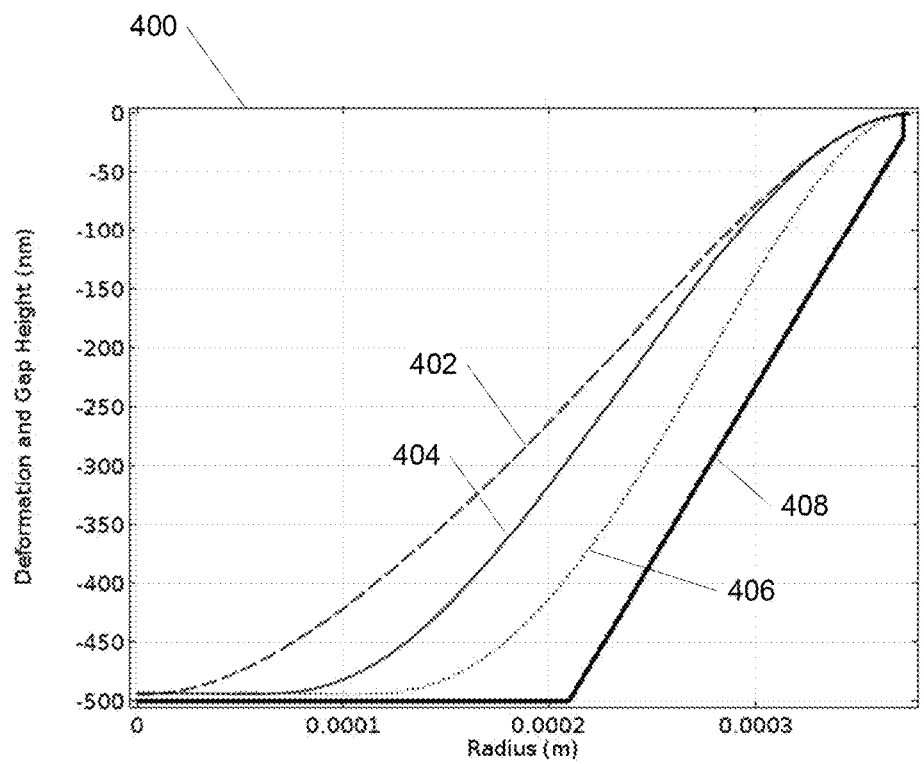
FIGS. 4A and 4B depict data plots showing, respectively, deflected cavity height for a CMUT with the contoured electrode contacting the plate at the outer edge with a curved portion, and output pressures for the CMUT with the contoured electrode versus a CMUT with a flat electrode operating in collapse mode.
Figure 4B:
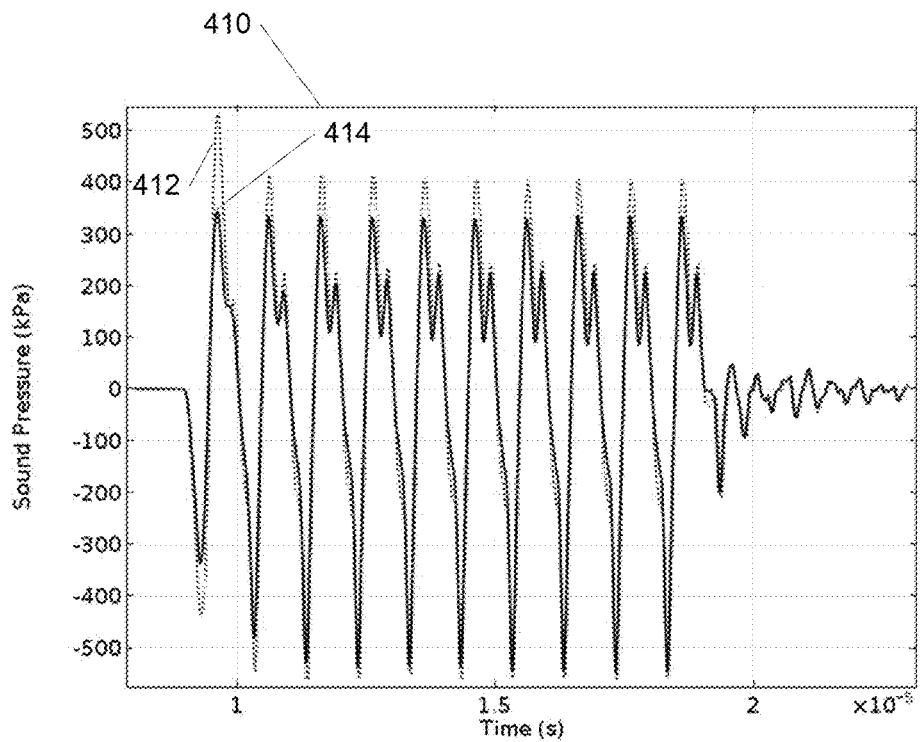

FIGS. 4A and 4B depict data plots 400, 410 showing, respectively, deflected cavity height for the contoured electrode and output pressure improvements for an embodiment of a CMUT with a contoured electrode and operating in collapse mode. The radius is set to 372 µm (chosen according to the pitch). The gap height is set to 0.5 µm to obtain a reasonable driving voltage. The pull-in voltage is 21.6 V. The DC bias is set 1.8 times of the pull-in voltage, which makes the plate collapse downward onto the substrate. The static deformation of the plate for the contoured electrode after collapsing and the maximum vibration amplitude are shown in FIG. 4A. The data line 404 is the position of the plate for a DC bias that is 1.8 times the collapse voltage, corresponding to the balance position. The data lines 402 and 406 correspond respectively to the minimum and maximum plate displacement in response to the applied AC excitation wave. When a conventional sine wave is applied to the plate to get maximum output pressure the plate will swing between positions shown by data lines 406 and 402. The line 408 (solid line) corresponds to the surface profile of the contoured electrode (e.g., see FIG. 1G).

FIG. 4B shows the output pressure and comparison of the contoured electrode in data line 412 with the traditional CMUT with a flat electrode in data line 414. The output pressure of the contoured electrode is 1.1 times that of the conventional electrode but with a 6% reduction of the maximum applied voltage. Further, the whole plate for the contoured electrode has a strong electrical field, which can significantly improve the electromechanical transformer ratio.

Figure 5A:
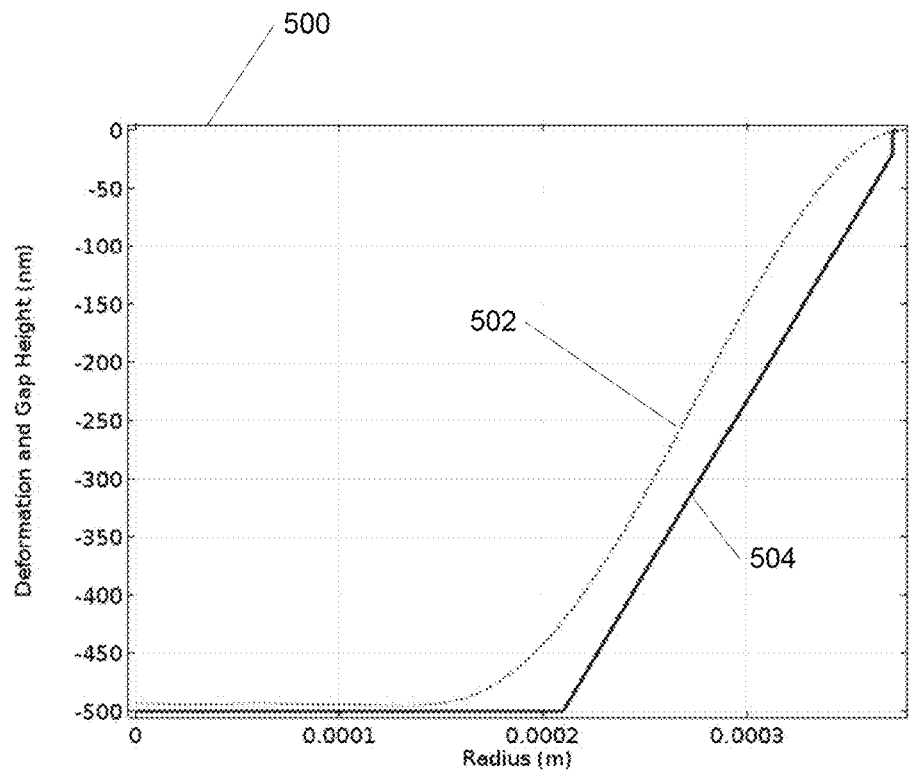
FIGS. 5A and 5B depict, data plots showing, respectively, the cavity height for a MUTT with a sloping contoured electrode contacting the plate at the outer edge with a curved portion, and receive sensitivity for the CMUT with the contoured electrode versus a CMUT with a flat electrode operating in collapse mode.
Figure 5B:
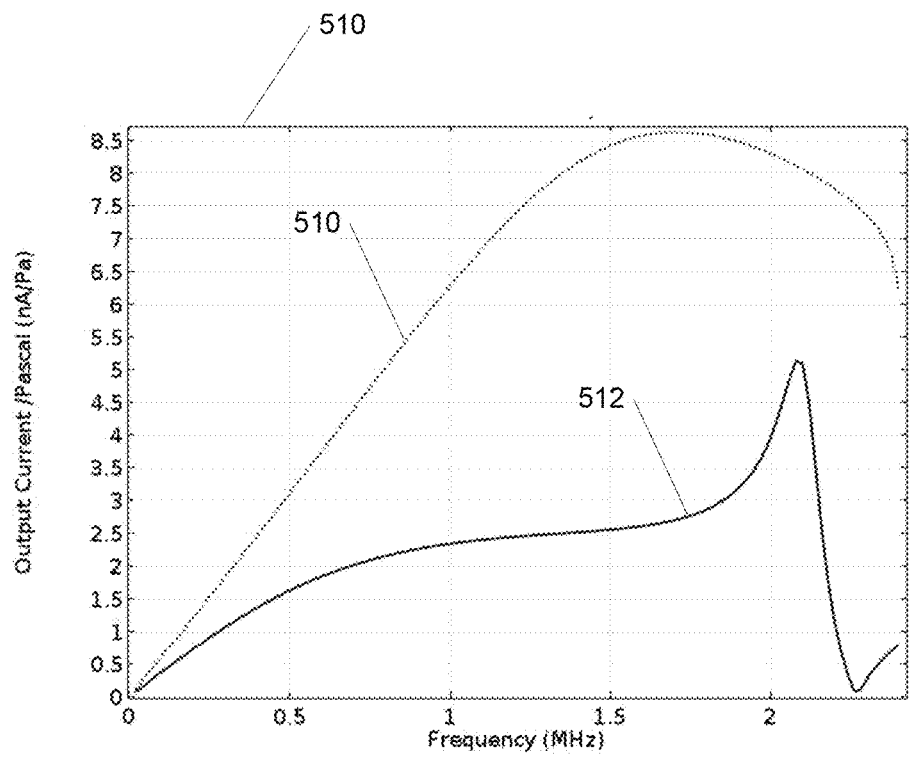

FIGS. 5A and 5B depict data plots 500, 510 showing, respectively, the cavity height for a CMUT with a sloping contoured electrode contacting the plate at the outer edge with a curved portion, and receive sensitivity for an embodiment of a CMUT with the sloping contoured electrode operating in collapse mode compared to a flat electrode. The static deformation of the plate after collapsing is shown in FIG. 5A, The data line 502 (dotted) corresponds to the deflected height with a DC voltage set to 263% of the pull-in voltage, and the line 504 (solid line) corresponds to the surface profile of the contoured electrode (e.g., see FIG. 1G).

FIG. 5B shows the receive sensitivity for CMUT with the sloping contoured electrode operating in collapse mode. The data line 510 (dotted) corresponds to the contoured electrode, and the data line 512 (solid) corresponds to a flat electrode. The driving voltage can be increased to 2.63 times of the pull-in voltage to increase the electrical field, Therefore, the receive sensitivity can be significantly improved, as shown. The receive sensitivity for the contoured electrode has been improved around 2.7 times at 1 MHz relative to the flat electrode.

Figure 6A:
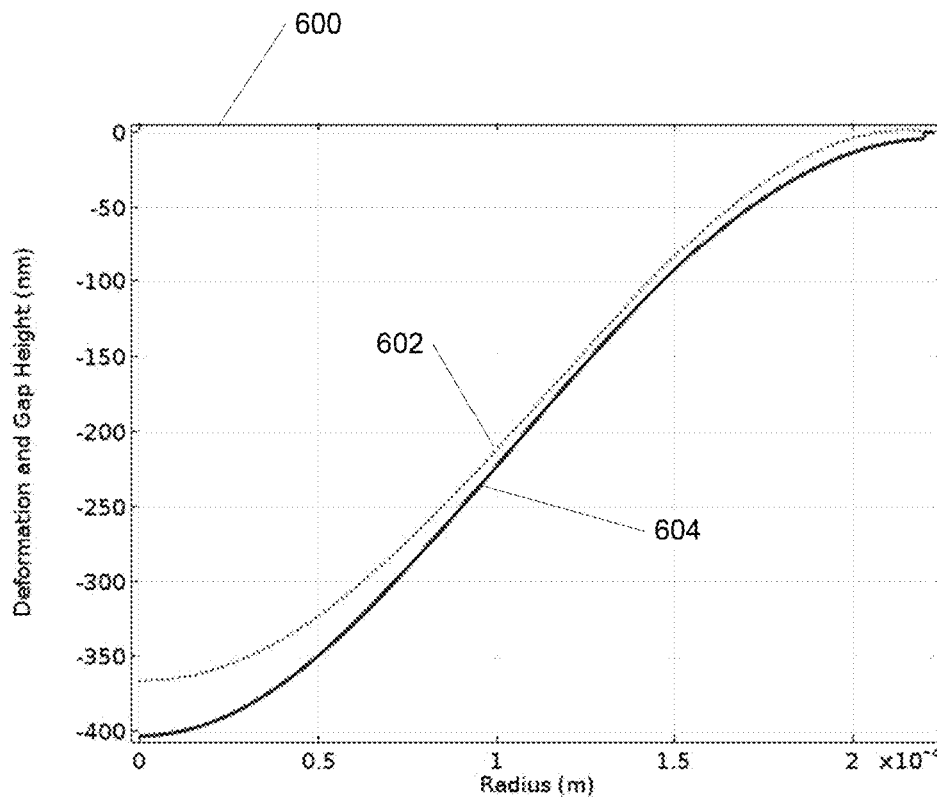
FIGS. 6A and 6B are data plots showing, respectively, cavity heights for a contoured electrode contacting the plate at the outer edge with a curved portion, and output pressures for the contoured electrode versus a flat electrode.
Figure 6B:
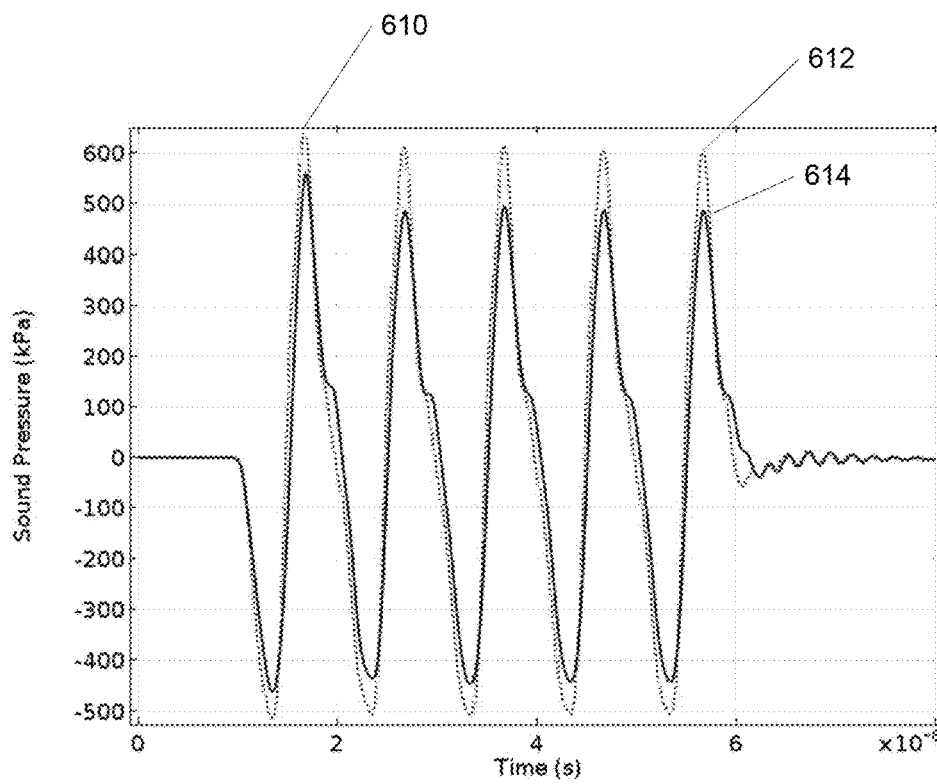
Figure 7A:
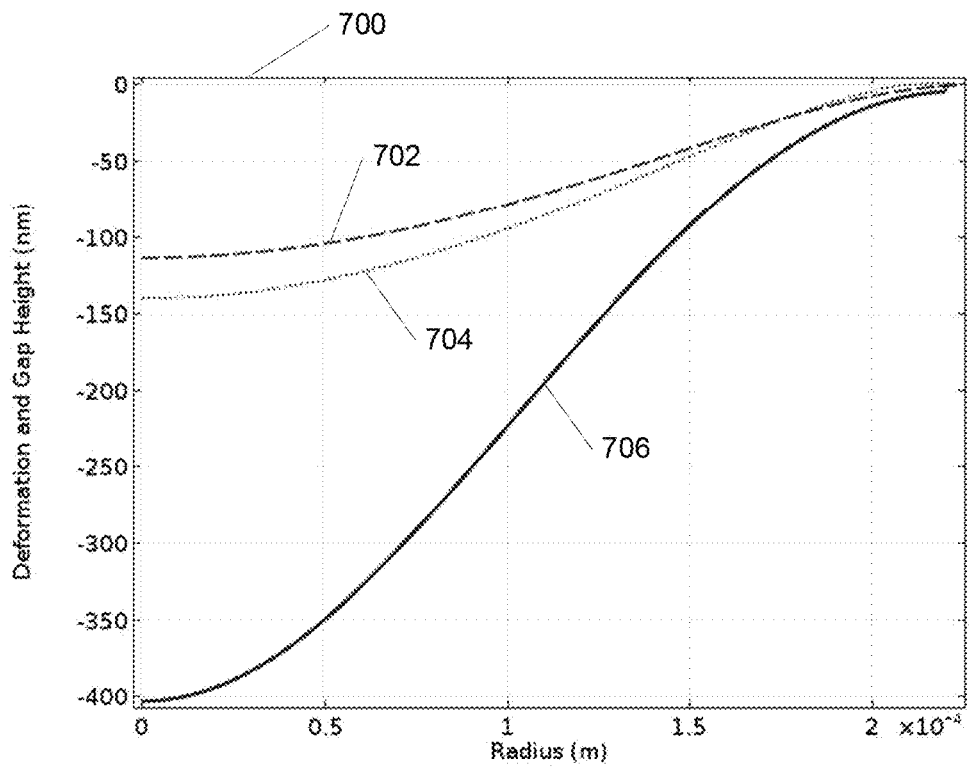
FIGS. 7A and 7B show, respectively, the cavity heights of a contoured electrode with a curved portion and contacting an outer edge of the plate operating in conventional mode, and the receive sensitivity of the contoured electrode compared to a flat electrode.
Figure 7B:
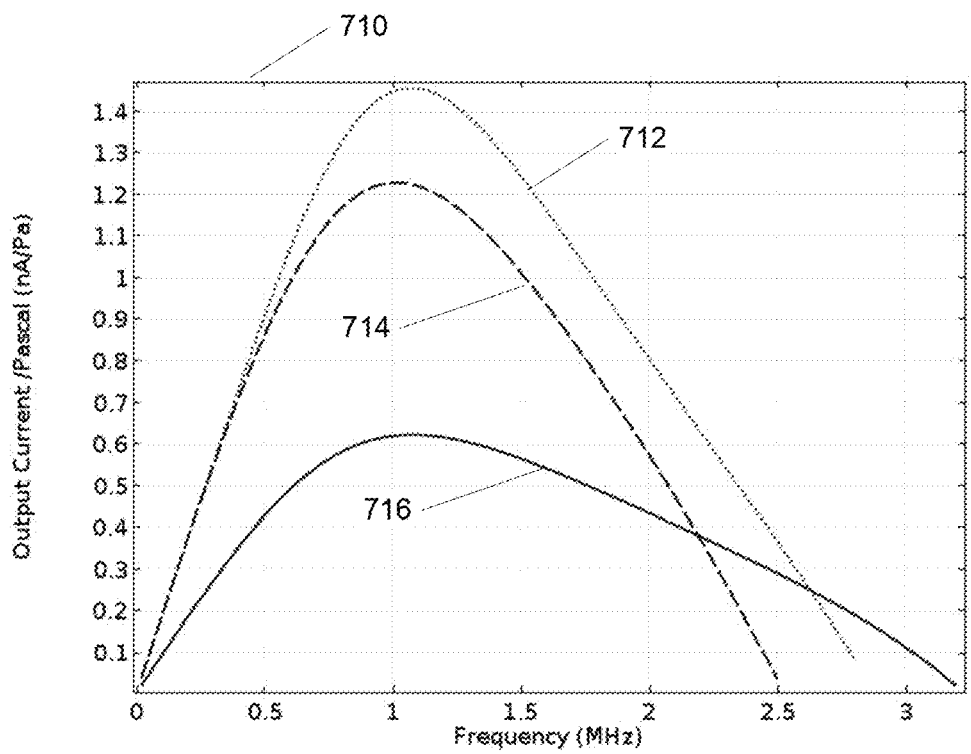

FIGS. 6A and 6B are data plots 600 and 610 showing, respectively, cavity heights for a contoured electrode contacting the plate at the outer edge with a curved portion, and output pressures for the contoured electrode versus a flat electrode. Example embodiments of such contoured electrodes are shown in FIGS. 1E and 1I. The CMUT is operating in conventional mode. The working frequency is 1.0 MHz. To decrease the geometric nonlinearity, a 20 µm thick plate is chosen. The radius is 220 µm for the CMUT with a flat electrode. The gap height is set to 0.4 µm to obtain a reasonable driving voltage. The pull-in voltage of the CMUT with a flat electrode (see, FIG. 1A) is 47.6 V. In contrast, the pull-in voltage of the CMUT with curved electrode would decrease by around 53%, benefitting from the larger active region. The curved electrode with contact at the edge is shown in FIG. 6A. The data line 602 corresponds to the deflected height and the line 604 (solid line) corresponds to the surface profile of the contoured electrode (e.g., see FIG. 1E). FIG. 6B shows the transmit output pressure generated by the CMUTs with the curved electrode at data line 612 in comparison with the traditional flat electrode at data line 614, The curved electrode can generate more than 1.2 times the output ultrasound pressure with lower DC and AC voltages FIGS. 7A and 7B show, respectively, the cavity heights of a contoured electrode with a curved portion and contact at the edge operating in conventional mode, and the receive sensitivity of the contoured electrode compared to a flat electrode. The DC bias is set to 90% of the pull-in voltage. Compared with the flat electrode CMUT operating in conventional mode, the receive sensitivity is improved more than 3.0 times with the contoured electrode. In FIG. 7A, the data line 702 corresponds to the deflection of a CMUT in the configuration shown in FIG. 1D, line 704 corresponds to the deflection of a CMUT in the configuration shown in FIG. 1E, and the line 706 (solid line) corresponds to the surface profile of the contoured electrode (e.g., see the CMUT shown in FIG. 1E). In FIG. 7B, the data line 712 corresponds to the contoured electrode with contacting portion at the outer edge (see FIG. 1E), line 714 corresponds to the contoured electrode without contacting portion at the outer edge (see FIG. 1D), and the data line 716 corresponds to the flat electrode (see FIG. 1A).

In some embodiments of a CMUT with a contoured electrode, the plate can be contacted at the edge, and the curvature of the curved substrate can be optimized to obtain linear response, Without considering fringing fields, the nonlinear electrostatic force is $$F_e = \frac{1}{2}\frac{\varepsilon_0 A}{(g-\Delta)^2}V_e^2,$$

where g is the initial gap of CMUT, A is the area of electrode, $\Delta$ is the single degree-of-freedom of the movable plate, $v_e$ is the driving voltage, and $\varepsilon_0$ is the permittivity of vacuum. The traditional CMUT has a linear elastic spring k, and the mechanical restoring force is $F_m = k\Delta$. Therefore, the traditional CMUT has a pull-in effect, i.e. the plate will collapse onto the electrode when the driving voltage is larger than the pull-in voltage. The equilibrium equation of the system is $$k\Delta = \frac{1}{2}\frac{\varepsilon_0 A}{(g-\Delta)^2}V_e^2.$$

To obtain a linear response, we can design a nonlinear spring in which the mechanical restoring force is given by $$F_m = \frac{1}{2}\frac{\varepsilon_0 A}{(g-\Delta)^2}\beta^2\Delta^2$$

Where $\beta$ is constant, then the equilibrium equation would take the form $$\frac{1}{2}\frac{\varepsilon_0 A}{(g-\Delta)^2}\beta^2\Delta^2 = \frac{1}{2}\frac{\varepsilon_0 A}{(g-\Delta)^2}$$

In this case the motion is linearly proportional to voltage, that is $\beta\Delta = v_e$. We can design and optimize the curvature of the contoured electrode to tune the spring constant with the plate radius shrinking when the plate contacts with the electrode and finally obtain linear response. Additionally, no pull-in will happen, so we can increase the driving voltage beyond the pull-in voltage and significantly improve the receive sensitivity.

B. Contoured Electrode Fabrication

The existing technologies for fabricating 3D structures are limited to the quality of 3D lithography and material etching, and thus, cannot be used for large scale fabrication. Various embodiments of a Local Oxidation of Silicon (LOCOS) method are described. The LOCOS method may be a microfabrication process where silicon dioxide is formed in selected areas on a silicon wafer having the Si—SiO2 interface at a lower point than the rest of the silicon surface. The LOCOS processes described herein with different patterns and a thick layer of silicon oxide as a passivation layer can precisely and uniformly control the profile of the 3D microstructures, and only needs one mask. Therefore, it is very suitable for large-scale fabrication.

Figure 8A:
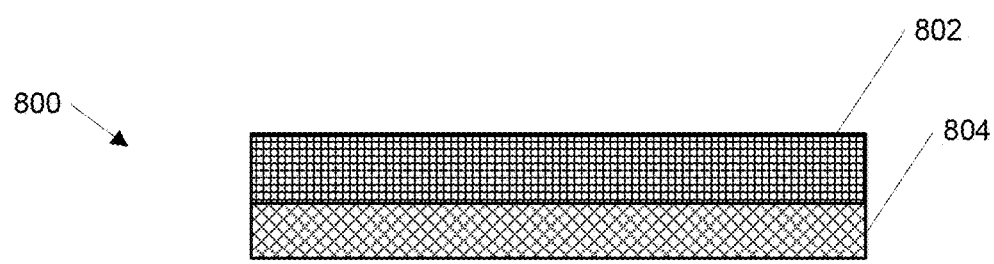
FIGS. 8A-8E depict sequential views of an embodiment of a method of grayscale lithography for fabricating a contoured substrate.
Figure 8B:
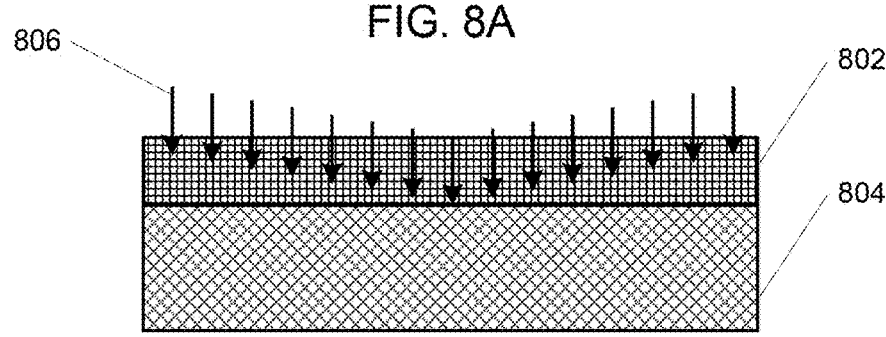
Figure 8C:
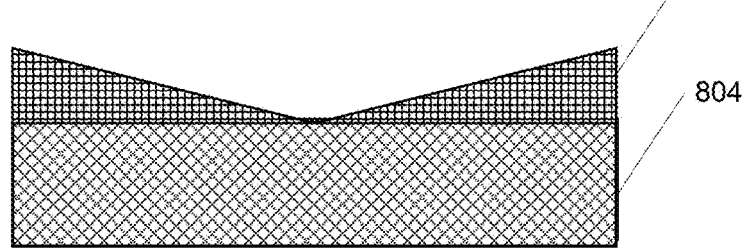
Figure 8D:
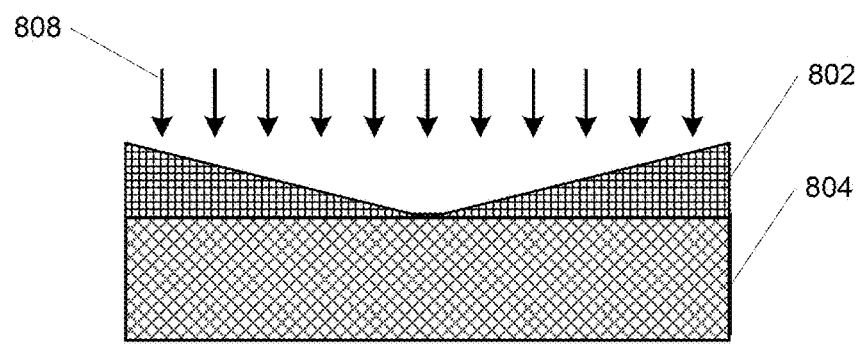
Figure 8E:
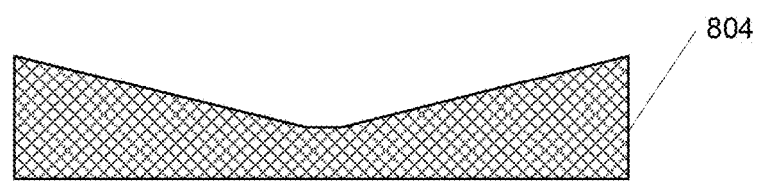

FIGS. 8A-8E depict sequential views of an embodiment of a grayscale lithography method 800 for fabricating 3D microstructures. The method 800 transfers a 3D pattern into the photoresist, first by exposure with spatially modulated light intensity, then followed by RIE (Reactive Ion Etching). Possible disadvantages include the 3D pattern cannot be precisely controlled, and the uniformity cannot be guaranteed, especially for fabricating large-scale CMUT arrays. FIG. 8A depicts the photoresist 902 application onto the substrate 904. FIG. 8B depicts UV exposure 906 with spatially modulated light intensity. FIG. 8C depicts the intensity gradient transferred into the resist topography. FIG. 8D depicts the RIE (Reactive Ion Etching) 908. FIG. 8E depicts the resist topography transferred into the substrate 904 topography.

Figure 9A:
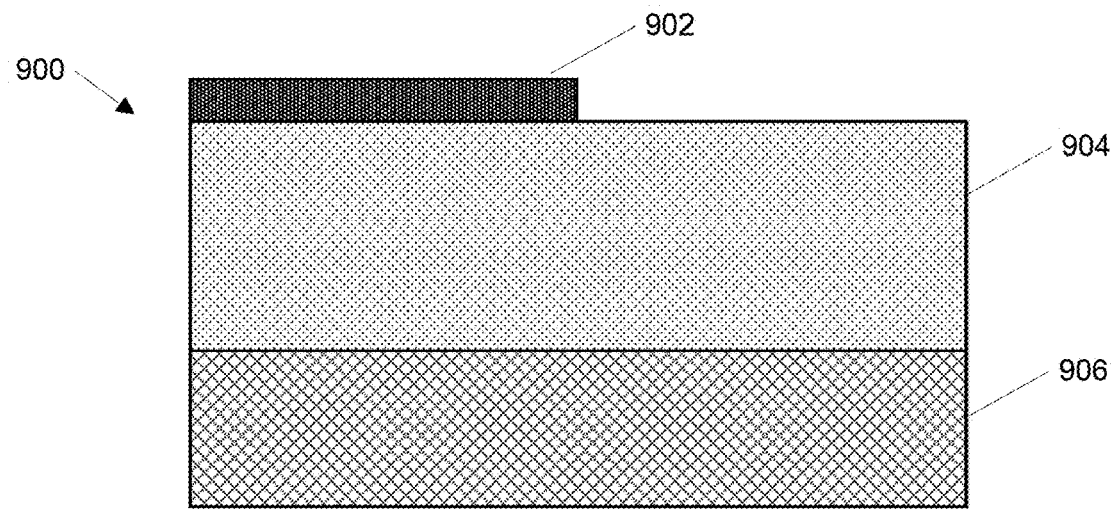
FIGS. 9A-9C depict sequential views of an embodiment of a method for a Local Oxidation of Silicon (LOCOS) process for fabricating the contoured substrate, with a flat thick silicon oxide passivation layer and using a single mask.
Figure 9B:
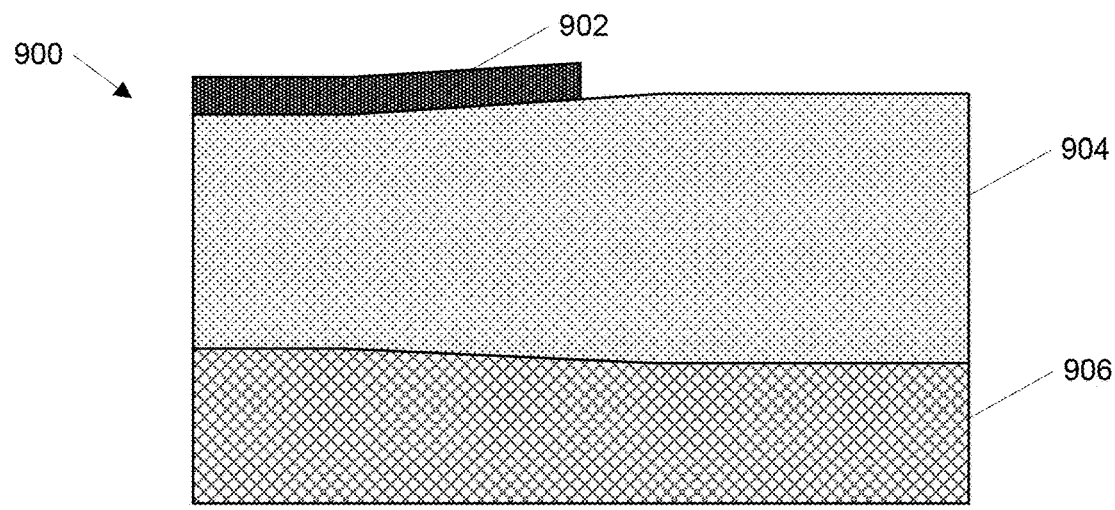
Figure 9C:
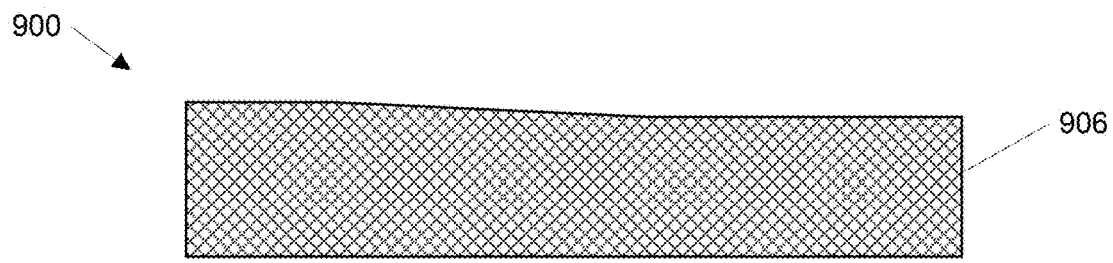

FIGS. 9A-9C depict an embodiment of a method 900 for a LOCOS process with a flat thick silicon oxide passivation layer using a single mask. In some embodiments, the LOCOS process uses a layer of thick silicon oxide passivation layer to precisely control the profile of the contoured substrate. Only one mask can be used to fabricate a 3D substrate, including the multiple-step substrate, the multiple-segment sloping substrate, and the curved substrate, such as those shown in and described with respect to FIGS. 1B-1I.

FIGS. 9A-9C show a mask with a thick silicon oxide passivation layer, which is used to fabricate a smoothly and uniformly profiled substrate by thermal oxidation process for the CMUTs with a small radius/gap ratio. The profile and the depth (gap height for CMUTs) can be defined by the thickness of the silicon oxide passivation layer and the oxidation time. FIG. 9A shows silicon nitride 902, silicon oxide 904, and silicon 906, with a selected pattern defined by the layer of silicon nitride 902. Next, FIG. 9B shows thermal oxidation with a passivation layer of thick silicon oxide 904. Finally, FIG. 9C shows the silicon 906 as a 3D profiled silicon substrate formed after removing the silicon nitride 902 and silicon oxide 904.

In some embodiments of the method 900 the thickness is 3.0 μm. After 6 hours of wet thermal oxidation, there forms a 220 nm high gap with a smooth profile, with a transition length around 13 μm. This method is suitable for fabricating the CMUTs with high frequency and small radius/gap ratio.

Figure 10A:
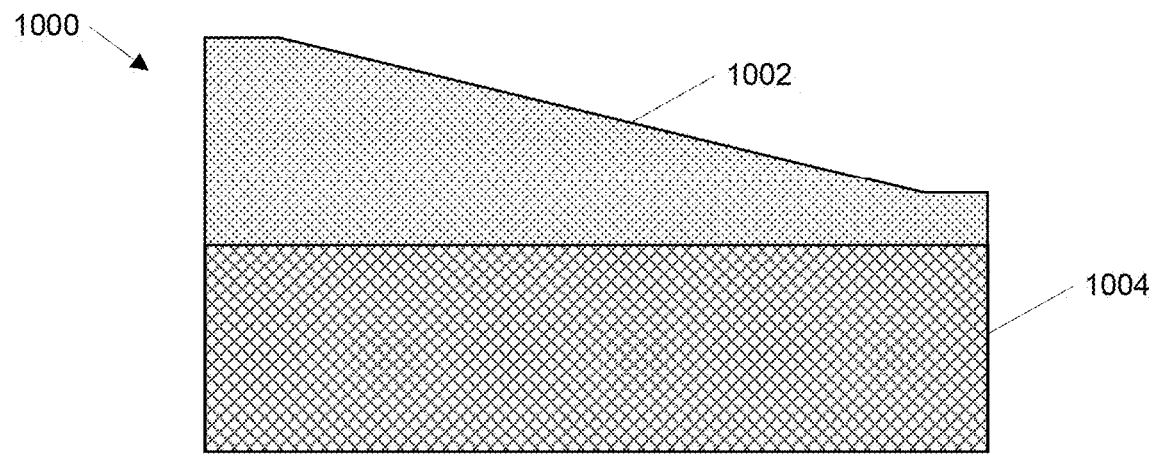
FIGS. 10A-10C depict sequential views of an embodiment of a method for a LOCOS process for fabricating the contoured substrate, with a flat thick silicon oxide passivation layer and using sloping oxide silicon as a mask.
Figure 10B:
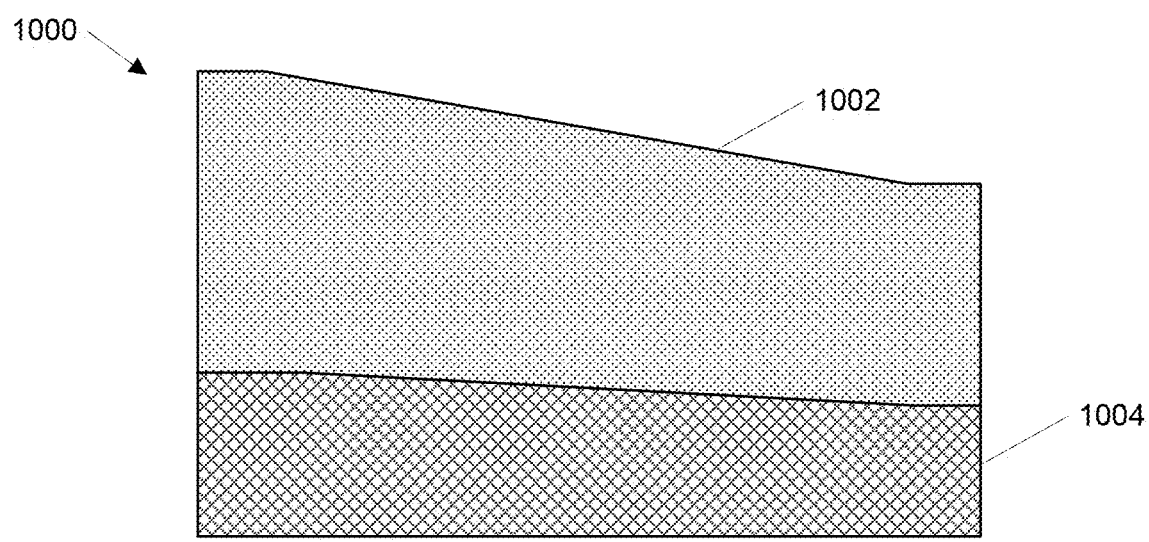
Figure 10C:
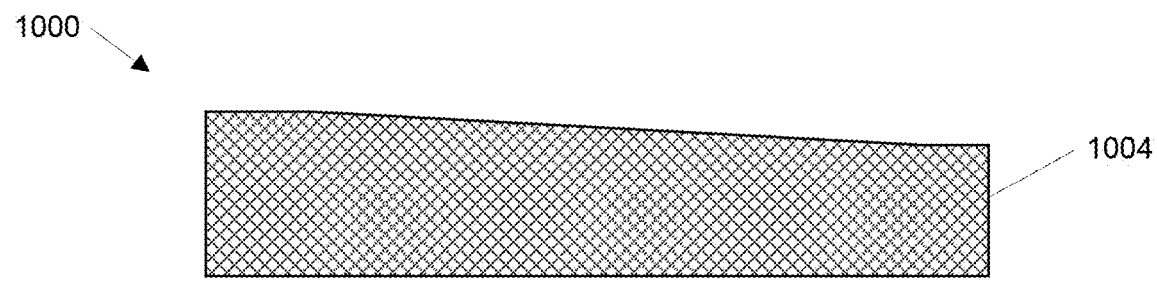

FIGS. 10A-10C depict sequential views of an embodiment of a method 1000 for a LOCOS process for fabricating the contoured substrate, with a flat thick silicon oxide passivation layer and using sloping oxide silicon as a mask. The oxide mask is non-uniform, which can be achieved by 3D grayscale lithography. After 8 hours of wet thermal oxidation, a 320 nm gap is formed, with a radius around 50 μm. This method is suitable for fabricating the CMUTs with both small and large radius/gap ratio. FIG. 10A depicts the sloping, thick silicon oxide 1002 and silicon 1004. Next, FIG. 10B depicts thermal oxidation with the sloping thick silicon oxide mask 1002. Finally, FIG. 10C depicts the 3D profiled substrate formed after removing silicon oxide.

Figure 11A:
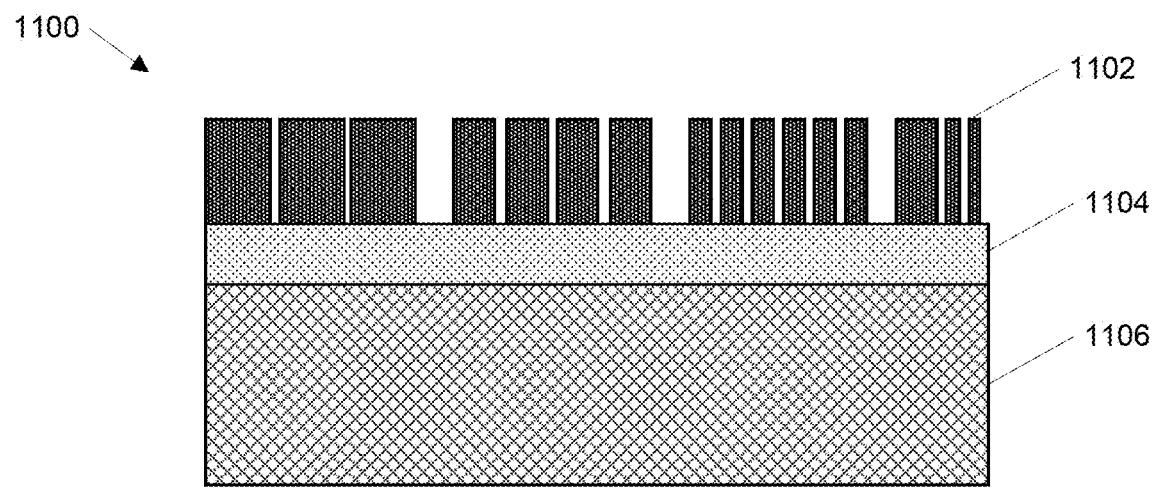
FIGS. 11A-11C depict sequential views of an embodiment of a method for a LOCOS process for fabricating the contoured substrate, with a diffusion pattern and thick oxide silicon as passivation.
Figure 11B:
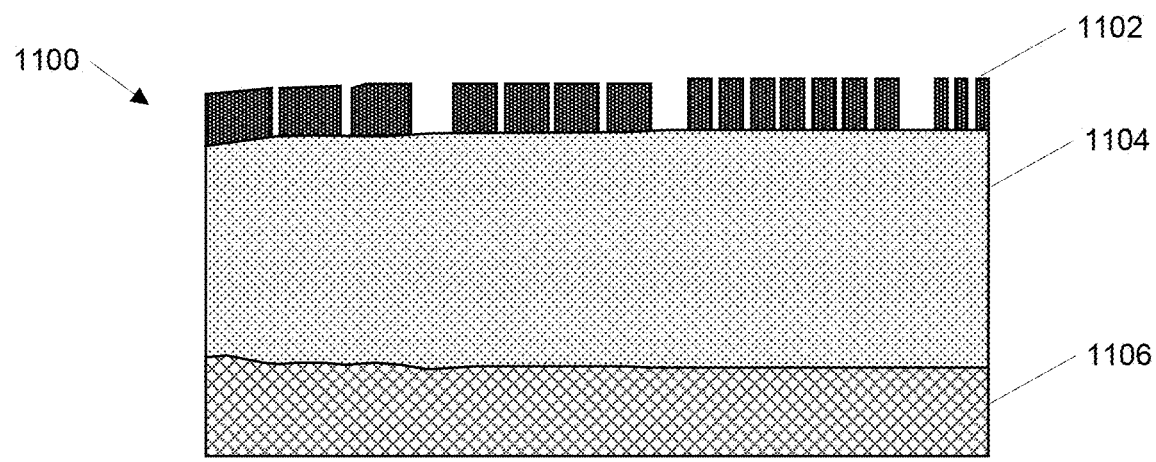
Figure 11C:
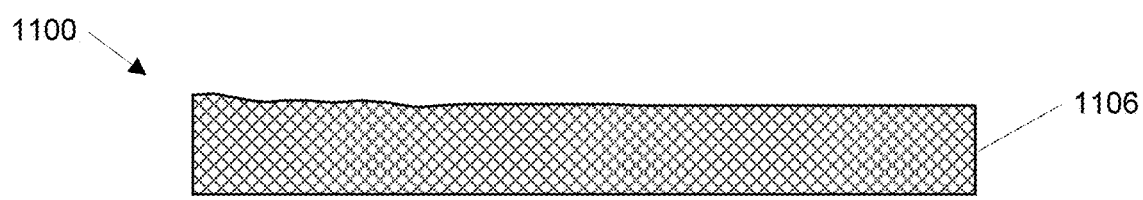

FIGS. 11A-11C depict sequential views of an embodiment of a method 1100 for a LOCOS process for fabricating the contoured substrate, with a diffusion pattern and thick oxide silicon as passivation. The oxide 1104 thickness is uniform. The size and distribution of the diffusion pattern is optimized to fabricate arbitrary contoured substrates with different sloping, multiple steps, or a smoothly curved profile. After 3 hours of wet thermal oxidation, a 126 nm high gap with triple steps forms. The triple steps have a smooth and nearly-flat surface, but with different heights. This method is suitable for fabricating the CMUTs with large radius/gap ratio. FIG. 11A depicts the silicon nitride 1102 diffuse pattern defined by a layer of silicon nitride, with silicon oxide 1104 and silicon 1106. Next, FIG. 11B depicts thermal oxidation with a passivation layer of thick silicon oxide 1104. Finally, FIG. 11C depicts a 3D profiled substrate of silicon 1106 formed after removing the silicon nitride 1102 and silicon oxide 1104.

The method 1100 may be used to fabricate a multiple-step or curved substrate for the CMUTs with a large radius/gap ratio. With these kinds of patterns, only one thermal oxidation is needed to achieve complicated 3D structures or contoured substrates as shown and described herein, for example in FIGS. 1B-1I. The oxidation time and the thickness of the silicon oxide passivation layer can be tuned to precisely control the depth (gap height), transition length, and 3D profile of the contoured substrate. The uniformity can be guaranteed due to the high uniformity of the thermal oxidation. Only one mask is needed for the proposed method 1100, which can significantly reduce the cost and guarantee the yield.

Figure 12:
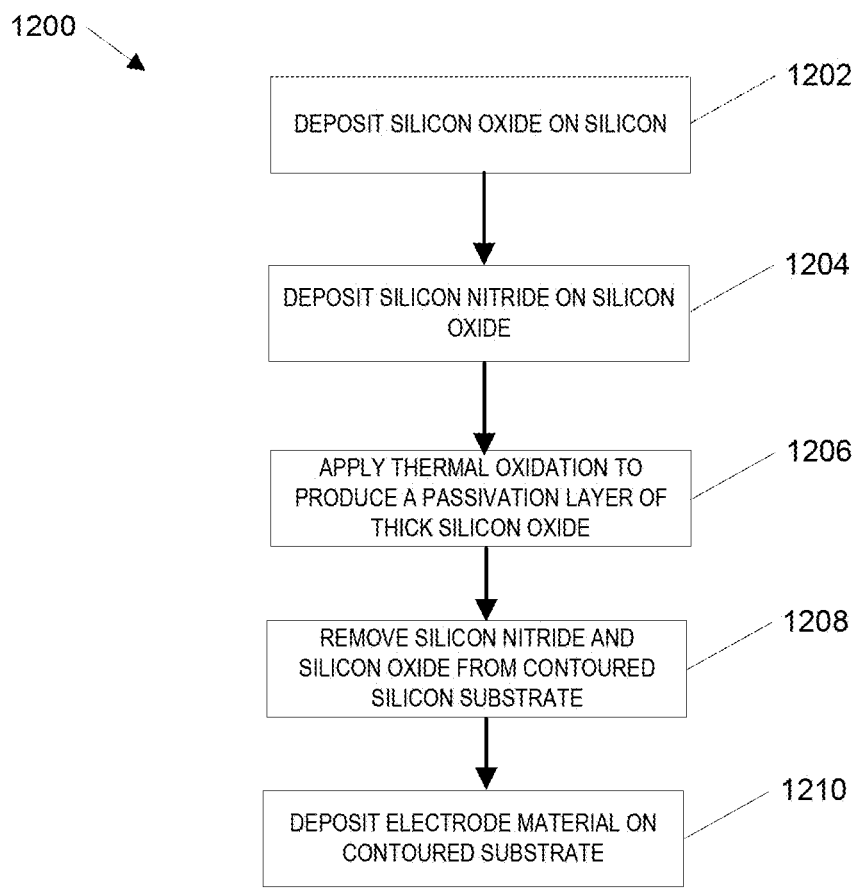
FIG. 12 is a flow chart showing an embodiment of a method of fabricating the various contoured electrodes described herein.

FIG. 12 is a flow chart showing a method 1200 of creating a contoured electrode. The electrodes in FIGS. 1B-1I may be produced using the method 1200. The method 1200 begins with step 1202 where a silicon oxide layer is deposited to create a silicon oxide layer thereon. The method 1200 next moves to step 1204 where a silicon nitride layer is deposited on the silicon oxide layer to create the mask. Any of the silicon nitride patterns or silicon oxide layers described herein may be used, for as shown in FIGS. 9A-11C. The method 1200 then moves to step 1206 where thermal oxidation is applied to produce a passivation layer of thick silicon oxide. The method 1200 then moves to step 1208 where the silicon nitride and silicon oxide are removed. The method 1200 then moves to step 1210 where an electrode material is deposited on the contoured substrate, to produce a contoured electrode. Any of the materials described herein for the electrodes of FIGS. 1A-2B may be used. It is understood that in some embodiments other suitable materials besides the silicon oxide, silicon nitride, and/or silicon may be used in the method 1200.

C. Pulse Train Excitation

Waveforms are disclosed herein with a half-wave pulse sequence or other pulse trains for exciting CMUTs to increase transmit output sound pressure and suppress one or more harmonics. Each pulse can be a voltage pulse. Pulse trains disclosed herein include pulses each having a pulse duration and a baseline between consecutive pulses. Each pulse of the pulse train is unipolar relative to the baseline in embodiments disclosed herein. Any suitable principles and advantages of the waveforms disclosed herein can be implemented with each other as suitable. Example waveforms for exciting a CMUT will now be discussed.

Figure 13A:
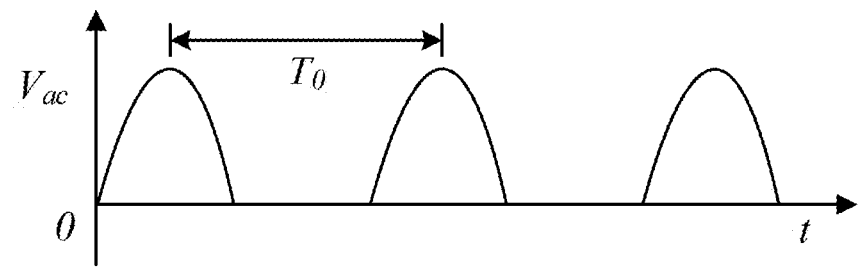
FIG. 13A is a graph of a half wave pulse train according to an embodiment.

FIG. 13A is a graph of a half wave pulse train according to an embodiment. Each pulse can be a voltage pulse. The half wave pulse has a pulse repetition period $T_0$. A pulse repetition frequency is $1/T_0$. Each pulse can have a pulse duration that is less than the pulse repetition period $T_0$. Accordingly, each pulse of the pulse train can be spaced apart in the time domain. If each pulse of the pulse train is shaped as a full-cycle sine pulse, then the pulse repetition period is greater than the pulse duration. The half-wave pulse has a baseline of zero amplitude period between half wave pulses in FIG. 13A. Each pulse of the pulse train is unipolar relative to the baseline. As shown in FIG. 13A, each pulse is positive relative to the baseline. The zero-amplitude period, in which elastic force dominates the dynamic behavior of a vibration plate of CMUT, can fully release the plate of the CMUT. Accordingly, a high and/or maximum output pressure due to the large amplitude vibration of the plate can be achieved. The waveform of FIG. 13A shows a pulse train without a DC bias. The baseline can be a DC bias voltage in some other embodiments, for example, as shown in FIG. 13B.

Figure 13B:
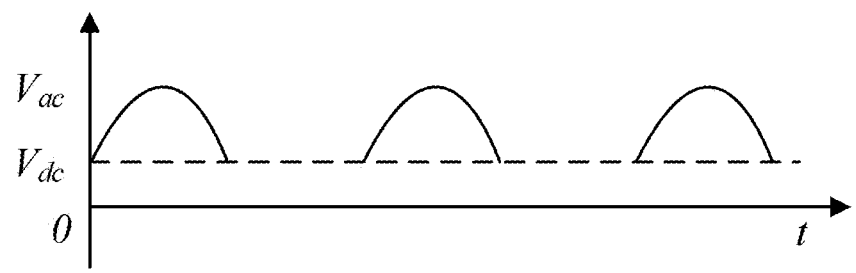
FIG. 13B is a graph of a half wave sine pulse train with a non-zero DC bias voltage according to an embodiment.

FIG. 13B is a graph of a half wave sine pulse train with a non-zero DC bias voltage according to an embodiment. The pulse sequence can be biased with a DC voltage, for example, as shown in FIG. 13B. In a DC amplitude period, elastic force can pull the plate of the CMUT to the DC biased position. The excitation waveform of FIG. 13B has pulses of a single polarity. A pulse train with unipolar pulses is unlike a conventional sine wave pulse excitation with dual polarity, an example of which is shown in FIG. 13C.

Figure 13C:
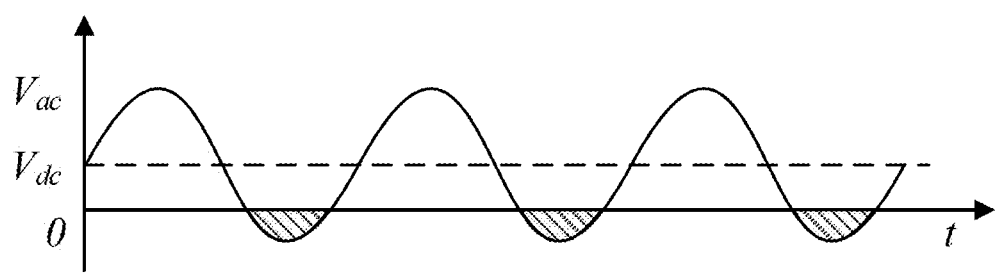
FIG. 13C illustrates a waveform of a full sine wave pulse train with a DC bias.

FIG. 13C illustrates a waveform of a full sine wave pulse train with a DC bias. The peak-to-peak amplitude for the waveform of FIG. 13B is significantly lower than the waveform of FIG. 13C. The waveform of FIG. 13B is also energy efficient relative to the waveform of FIG. 13C due to not including the negative half-wave, which can generate attractive electrostatic force and pull the plate of the CMUT toward the substrate of the CMUT. With the excitation waveform of FIG. 13B, excitation and power electronics associated with the CMUT can be simpler and easier to integrate.

Figure 13D:
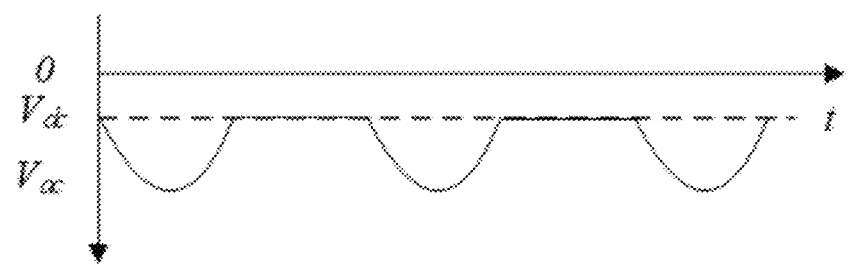
FIG. 13D is a graph of a negative half wave sine pulse train with a non-zero DC bias voltage according to an embodiment.

FIG. 13D is a graph of a negative half wave sine pulses with a non-zero DC bias voltage according to an embodiment. This waveform illustrates that a pulse train of unipolar pulses can have a negative polarity. Each of the pulses is negative related to a baseline, which is the DC bias voltage in FIG. 13D. Any suitable principles and advantages of pulse trains with unipolar pulses of positive polarity can be applied to pulse trains with unipolar pulses of negative polarity.

Figure 13E:
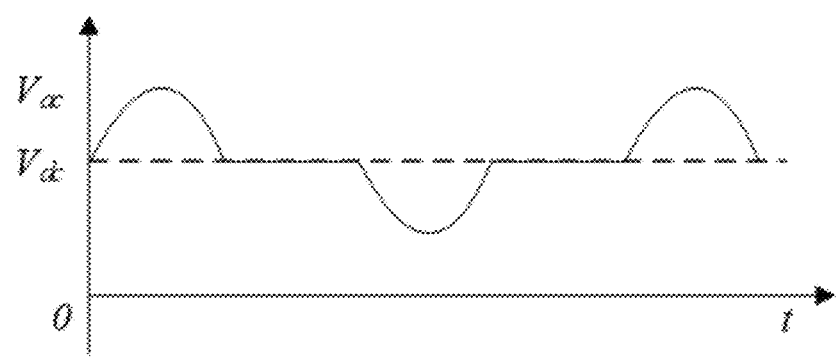
FIG. 13E is a graph of a pulse train with a non-zero DC bias voltage where each pulse is unipolar according to an embodiment.

FIG. 13E is a graph of a pulse train with a non-zero DC bias voltage where each pulse is unipolar according to an embodiment. In FIG. 13F, each individual pulse is unipolar although different pulses have a different polarity. As illustrated, two of the pulses have positive polarity and one of the pulses has a negative polarity.

Figure 14:
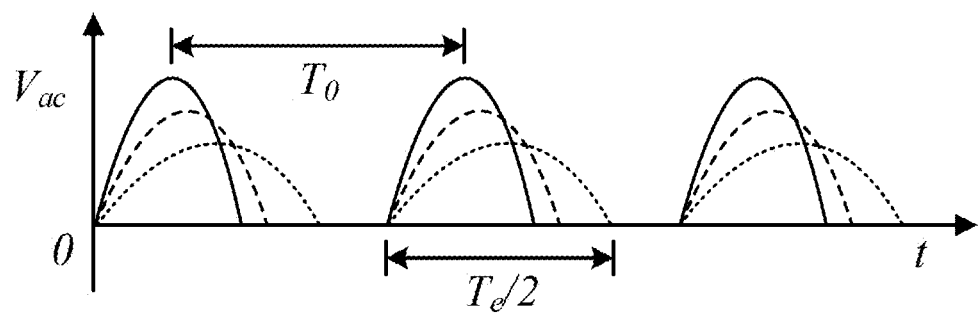
FIG. 14 illustrates pulse trains with different pulse durations according to embodiments.

FIG. 14 illustrates pulse trains with different pulse durations according to embodiments. The pulse duration can be selected to suppress one or more harmonics. The period of the excitation sequence can be different from the half-wave duration, for example, as shown in FIG. 14. The duration of a pulse can be increased to suppress the harmonics significantly. When adjusting the pulse duration, the amplitude can also be modified to get a similar vibration amplitude compared to the unadjusted pulse duration and unadjusted amplitude. The duration can be adjusted to decrease or increase the AC voltage. An excitation circuit can adjust pulse duration. An example excitation will be discussed with reference to FIG. 26.

Figure 15:
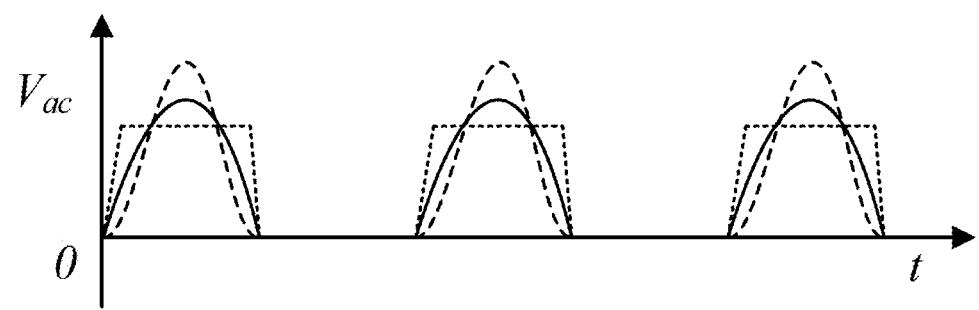
FIG. 15 illustrates examples of excitation waveforms with different types of unipolar pulses according to embodiments.

FIG. 15 illustrates examples of excitation waveforms with different types of unipolar pulses according to embodiments. Pulses of an excitation waveform can be of different types of pulses including, but not limited to, a sequence of half-sine pulses, half-biased-sine pulses, half-square pulses, Gaussian pulses, or the like. Of the pulses illustrated in FIG. 15, the half-square sequence has the lowest amplitude to achieve the same maximum displacement of the CMUT, which is suitable for managing electrical breakdown. The half-biased-sine sequence has the largest amplitude of the illustrated pulses. This can further enhance the electric field and increase the output pressure.

Figure 16A:
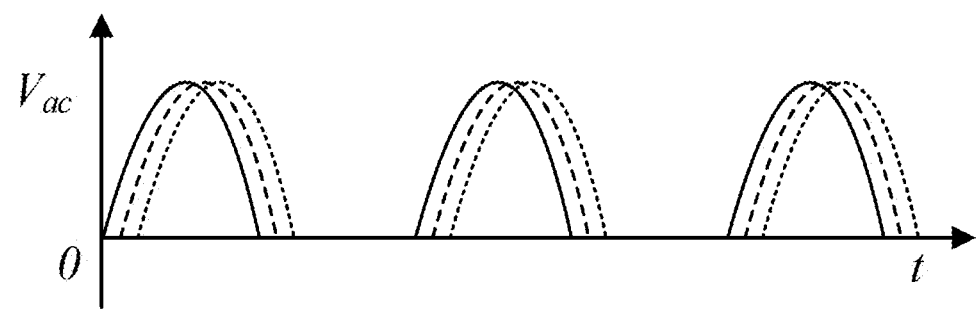
FIGS. 16A and 16B illustrate that an excitation pulse sequence can have a modified phase for excitation of HIFU and dual-mode CMUTs.
Figure 16B:
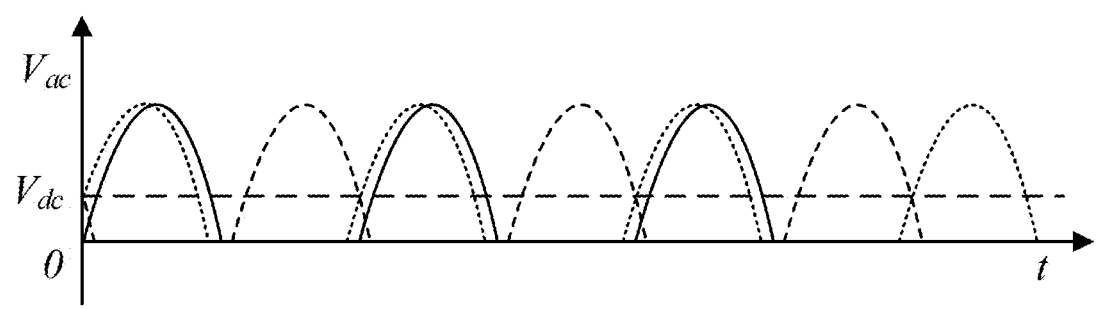

FIGS. 16A and 16B illustrate that an excitation pulse sequence can have a modified phase for excitation of HIFU and dual-mode CMUTs. The phase of the unipolar pulse sequence can be adjusted, for example, as shown in FIGS. 16A and 16B. An excitation circuit can adjust pulse phase. Adjusting phase can be useful for phased-arrays (for example, for imaging and/or therapeutic applications). The waveform of FIG. 16A can be used in phased-array applications. In such applications, different CMUTs in an array of CMUTs can receive pulse trains with different phases.

Phases of excitation pulses can be adjusting to enable switching between transmit and receive modes. The waveform of FIG. 16B can be used for dual-mode CMUTs arranged to operate in a transmit mode and a receive mode. In dual-mode CMUTs, both high receive sensitivity and high transmit output pressure are generally desired. Such sensitivity can be achieved at a different percentage of a pull-in voltage of the CMUT. To improve the receive sensitivity, DC bias can be set as high as possible, such as 90% of the pull-in voltage or even more. However, to achieve the maximum output pressure for the conventional sine wave excitation, the DC bias is usually set to 50% of the pull-in voltage. This involves extra switching electronics to toggle between receive and transmit modes.

For excitation pulse trains disclosed herein, through changing the phase to adjust the applied AC amplitude to match with the DC bias at the beginning cycle, either the plate can be pulled toward the substrate or the plate can be released completely. Thus, an ultrasound system with such CMUT excitation can smoothly toggle between the receive and transmit modes. This is not believed to be possible for the conventional sine wave excitation without switching electronics, since either the positive or negative voltage pulls the plate of the CMUT towards the substrate. The phase angle can be derived from the ratio of the DC value to the AC amplitude, for example, as represented by the following equation:

$$\theta = \arcsin(V_{dc}/V_{ac})$$

The phase angle can be θ to pull the plate of the CMUT towards the substrate or π−θ to release the plate completely at the beginning of a cycle.

In one example embodiment, a CMUT operates in a conventional mode. The working frequency is 1 megahertz (MHz). To decrease the geometric nonlinearity, a 20 μm thick plate is selected for the CMUT. The radius of the CMUT is 220 μm. The gap height is set to 0.4 μm to obtain a reasonable driving voltage. The pull-in voltage is 102.5 V.

Figure 17A:
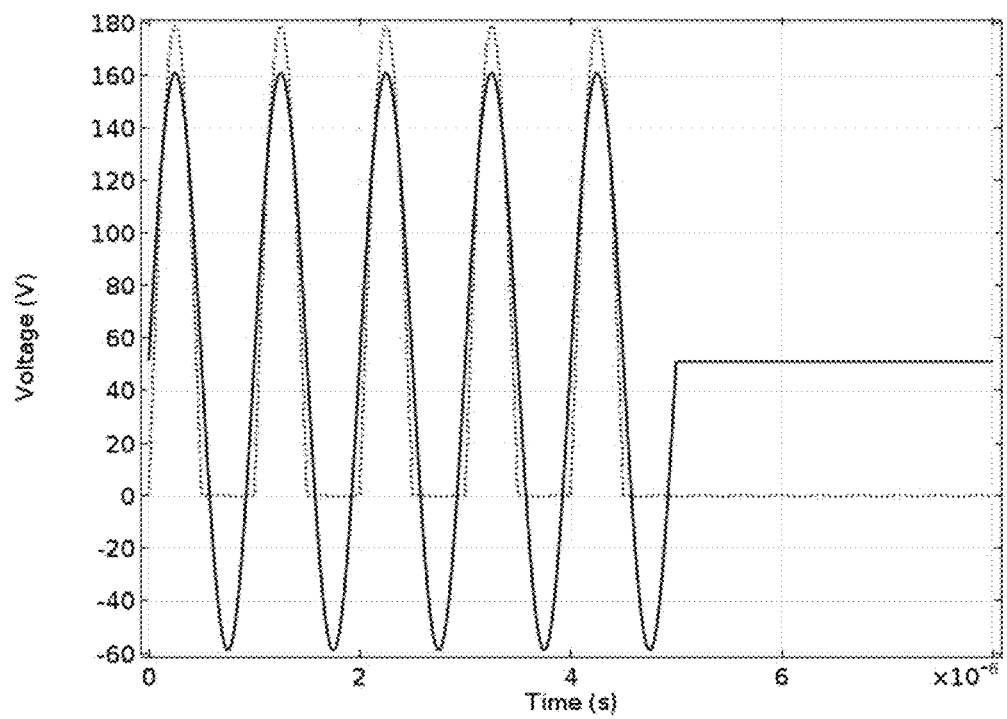
FIG. 17A shows excitation waveforms for the example embodiment and for a sine wave excitation.
Figure 17B:
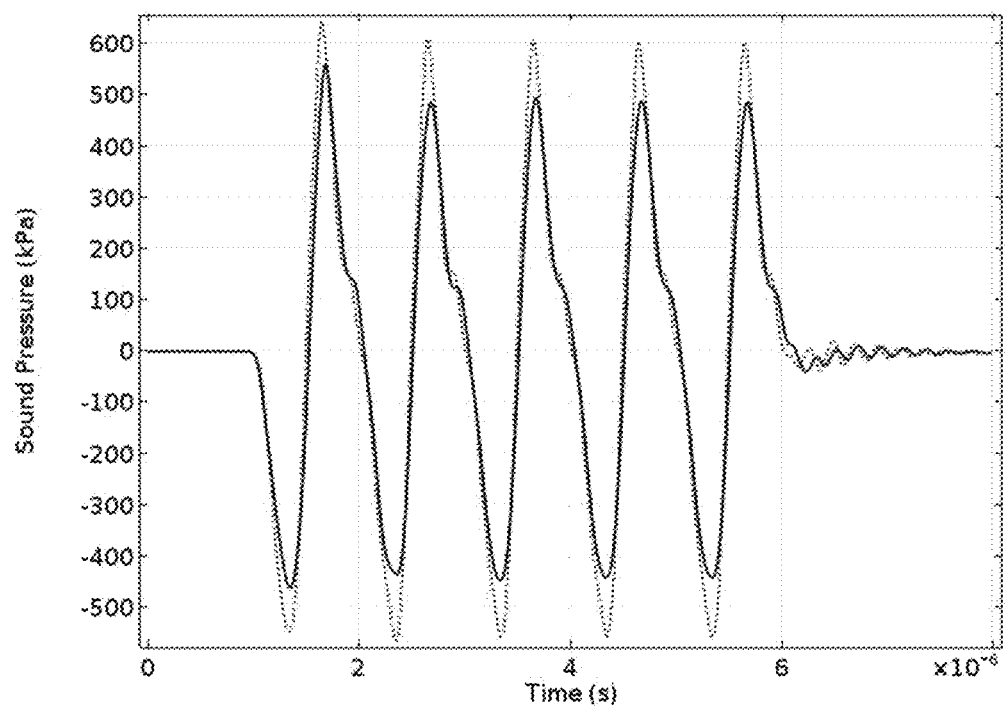
FIG. 17B shows transmit output pressure for the example embodiment and for the sine wave excitation.

FIG. 17A shows excitation waveforms for the example embodiment and for a sine wave excitation. FIG. 17B shows transmit output pressure for the example embodiment and for the sine wave excitation. The dotted curve corresponds to the example embodiment. The solid curve corresponds to sine wave excitation. For the sine wave excitation, the output pressure arrives at the maximum value when the DC bias is about 50% of the pull-in voltage. For a half-sine pulse sequence of the example embodiment, the maximum output pressure is when the DC bias is approximately zero Volts. FIG. 17B and other output pressure graphs herein correspond to a continuous wave mode of operation of a CMUT where the CMUT outputs a continuous wave of ultrasound energy. In the continuous wave mode, a CMUT can output a continuous wave for second or minutes in accordance with pulse train excitation disclosed herein.

Compared with the sine wave excitation, the obtained peak-peak pressure by the half-sine pulse sequence of the example embodiment is around 1.25 times greater. At the same time, the peak-peak amplitude of the driving signal for the half-sine pulse sequence of the example embodiment is only about 80% of the sine wave excitation. When the DC bias is set to 50% of the pull-in voltage, almost the same output pressure for the half-sine pulse sequence of the example embodiment compared with the sine wave excitation can be achieved.

Figure 18A:
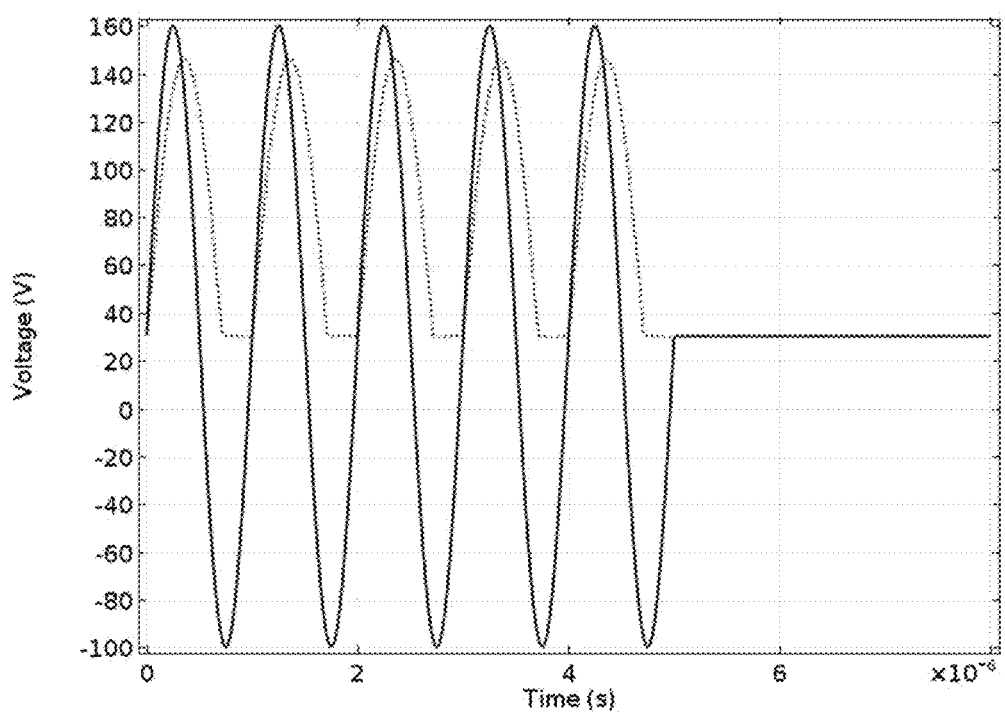
FIG. 18A shows excitation waveforms for the example embodiment with a DC bias and for a sine wave excitation.
Figure 18B:
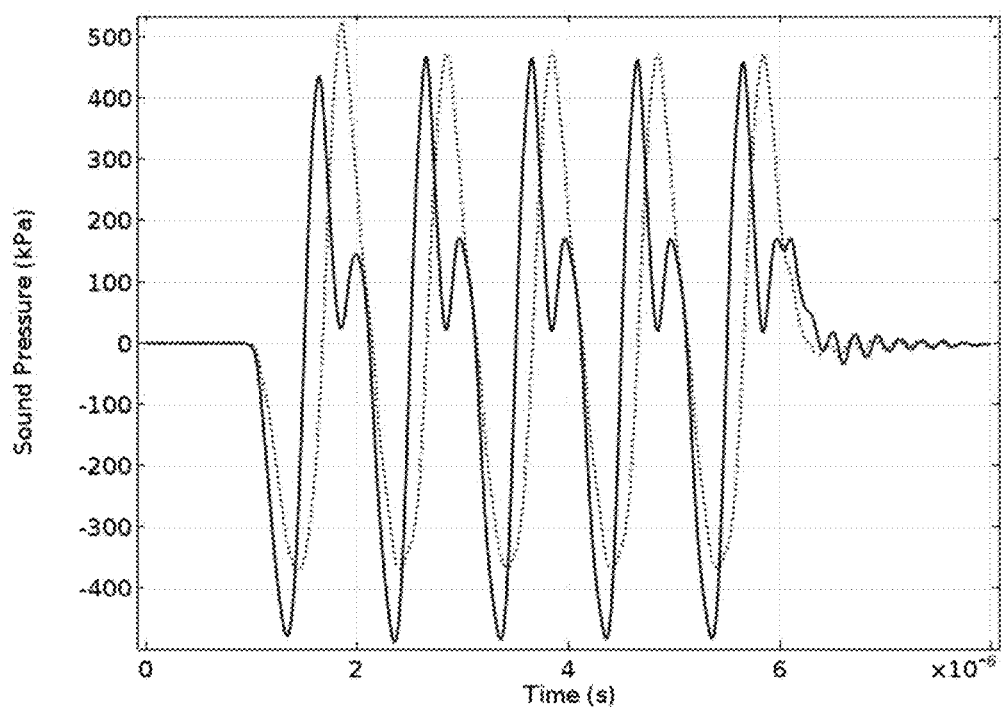
FIG. 18B shows transmit output pressure for the example embodiment with the DC bias and for the sine wave excitation.

FIG. 18A shows excitation waveforms for the example embodiment with a DC bias and for a sine wave excitation. FIG. 18B shows transmit output pressure for the example embodiment with the DC bias and for the sine wave excitation. The dotted curve corresponds to the example embodiment with the DC bias. The solid curve corresponds to sine wave excitation. As shown in FIG. 18B, a transmit output pressure signal with strongly suppressed harmonics can be generated by a pulse train excitation according to an embodiment.

The excitation duration of the pulses of a pulse train can be different from a resonance frequency of a plate of the CMUT. For the sine wave excitation, as shown by the solid curve in FIG. 18B, the output pressure signal has a strong second-order harmonic of about −2.5 dB. In contrast, the pulse train excitation of the example embodiment has a second-order harmonic of about −7.8 dB, in which case the excitation frequency is set to 1.0 MHz. For the dotted curve for the pulse train excitation to further suppress a harmonic, the duration of the pulses of the pulse train can be increased, in which case the excitation frequency can decrease to about 0.7 MHz. The second order harmonic can be suppressed further to less than about −13.6 dB. This harmonic suppression can reduce the output pressure by about 1.4 dB.

Figure 19A:
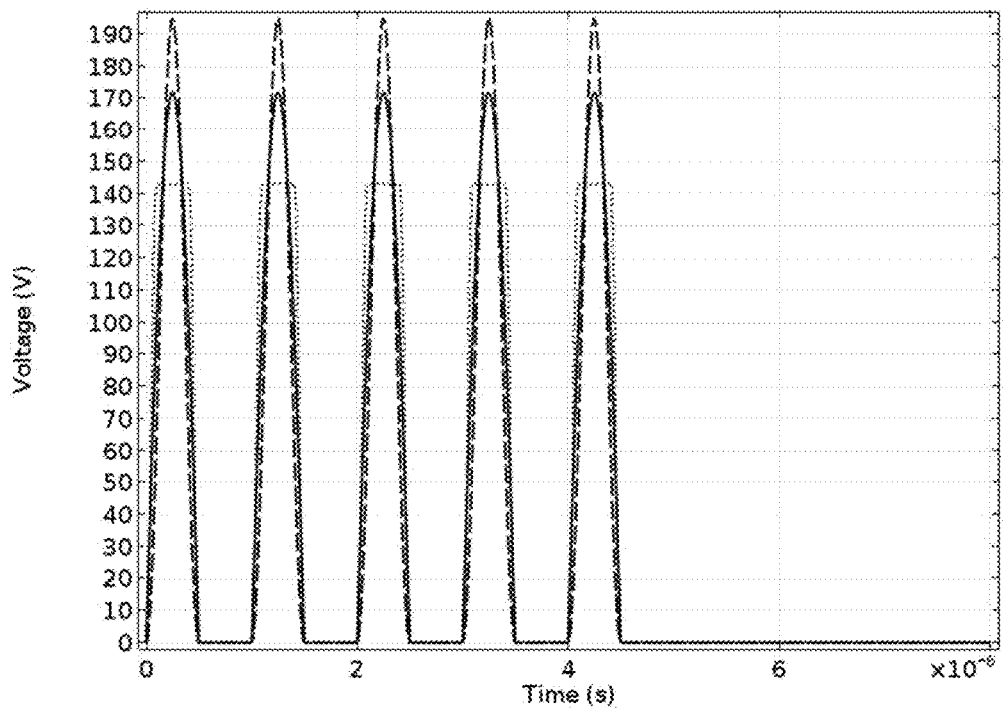
FIG. 19A shows excitation waveforms for different types of pulses according to embodiments.
Figure 19B:
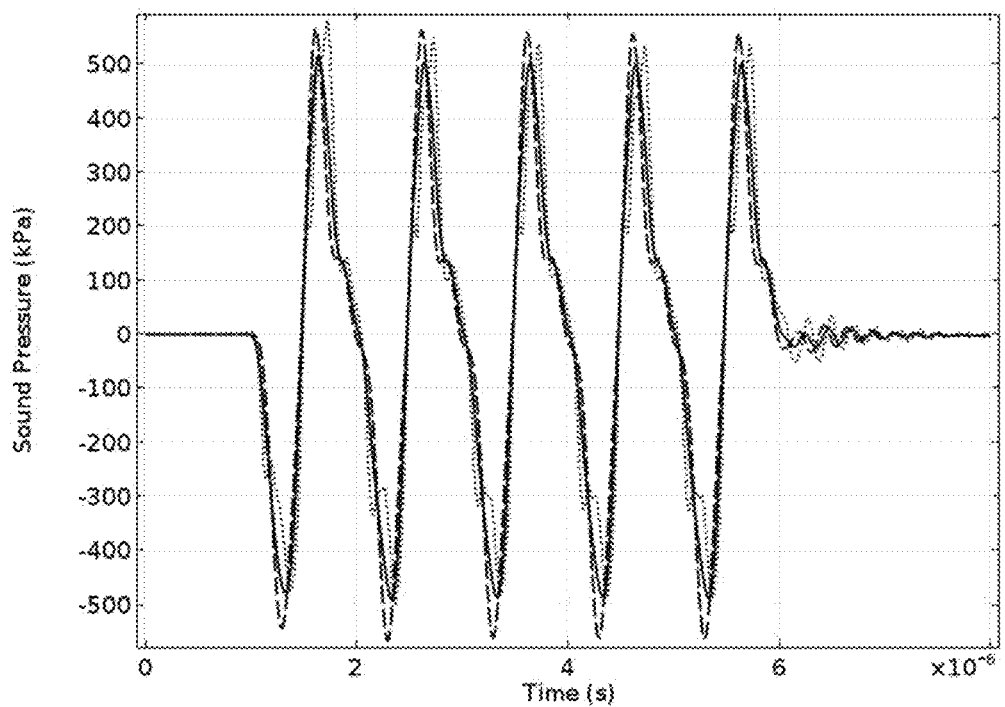
FIG. 19B shows transmit output pressure corresponding to the different types of pulses of FIG. 19A.

FIG. 19A shows excitation waveforms for different types of pulses according to embodiments. FIG. 19B shows transmit output pressure corresponding to the different types of pulses of FIG. 19A. The pulse train can include pulses of different types including a sequence of half-sine pulses as represented by a solid curve in FIG. 19A, half-biased-sine pulses as represented by a dashed curve in FIG. 19A, or half-square pulses as represented by a dotted curve in FIG. 19A.

Figure 20A:
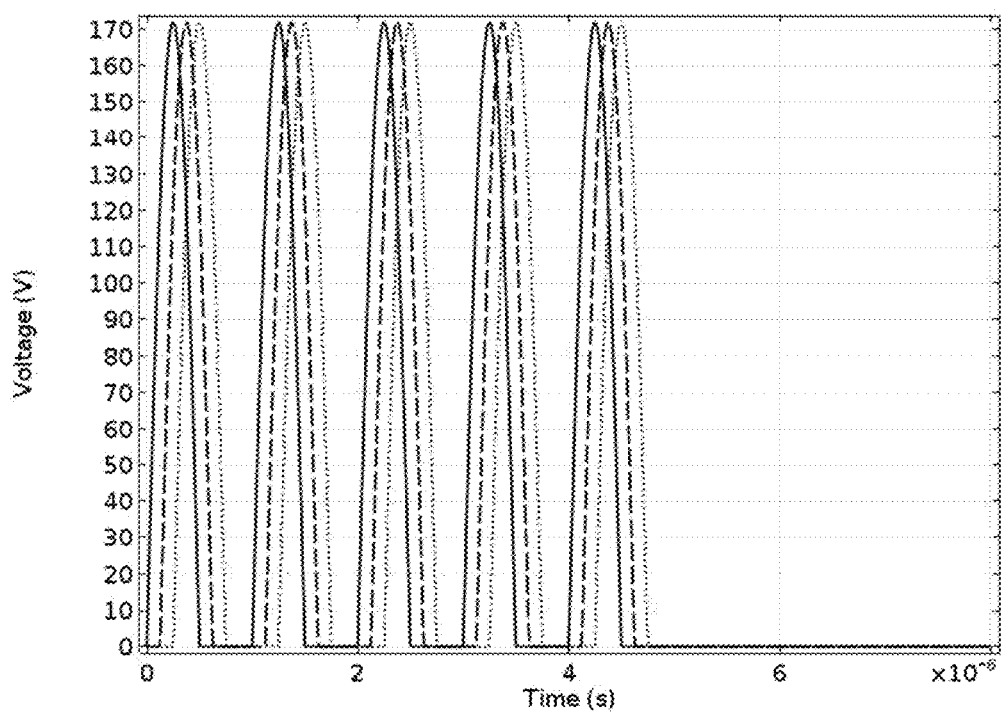
FIG. 20A shows excitation waveforms for pulses with different phases according to embodiments.
Figure 20B:
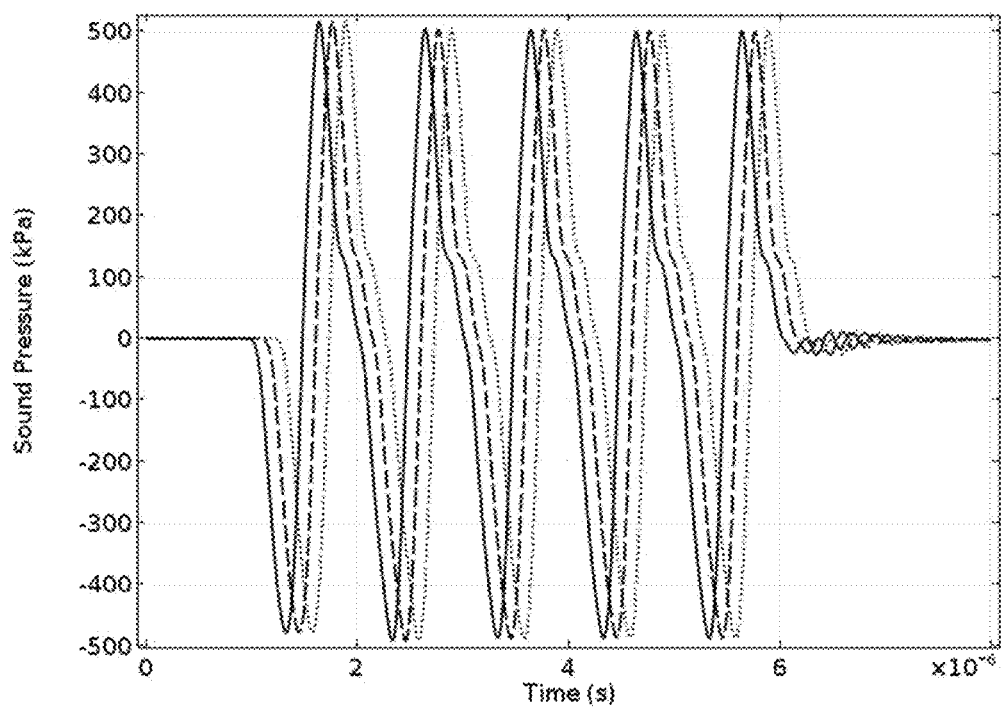
FIG. 20B shows transmit output pressure corresponding to the pulses of FIG. 20A.

FIG. 20A shows excitation waveforms for pulses with different phases according to embodiments. FIG. 20B shows transmit output pressure corresponding to the pulses of FIG. 20A being applied to a CMUT. The phase of the pulses of a pulse train can be adjusted, for example, as shown in FIG. 20A. Adjusting the phase of pulses can be useful for phased array applications, such as phased array applications for imaging and/or therapeutic applications. In FIG. 20A, pulses represented by a solid curve have zero phase, pulses with a π/4 phase delay are represented by a dashed curve, and pulses with a π/2 phase delay are represented by a dotted curve. FIG. 20B is a graph of output pressures of these pulses in which output pressure for pulses with zero phase is represented by a solid curve, output pressure for pulses with a π/4 phase delay is represented by a dashed curve, and output pressure for pulses with a π/2 phase delay is represented by a dotted curve.

Figure 21A:
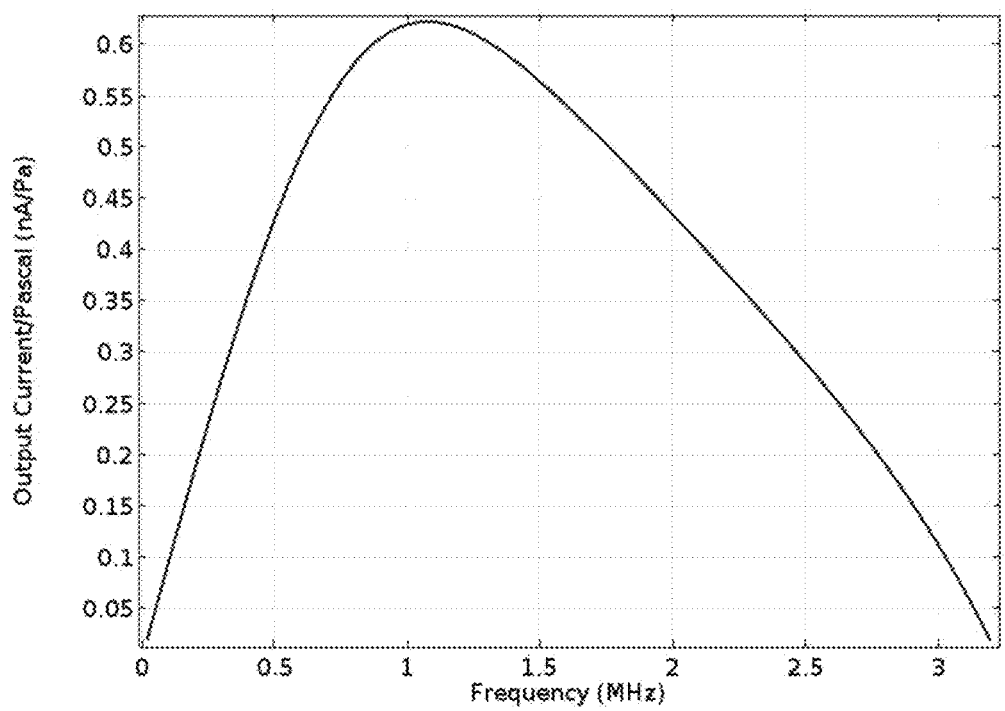
FIG. 21A is a graph of receive sensitivity for a CMUT as measurement by output current over pressure versus frequency.

For achieving both high receive sensitivity and high and/or maximum output pressure, the phase of pulses of an excitation pulse train can be adjusted to toggle between receive and transmit modes without electronic switches. FIG. 21A is a graph of receive sensitivity for a CMUT as measurement by output current over pressure versus frequency. This graph corresponds to a DC bias for the pulse train being set at 90% of the pull-in voltage of the CMT. The graph of FIG. 21A represents a relatively high receive sensitivity.

Figure 21B:
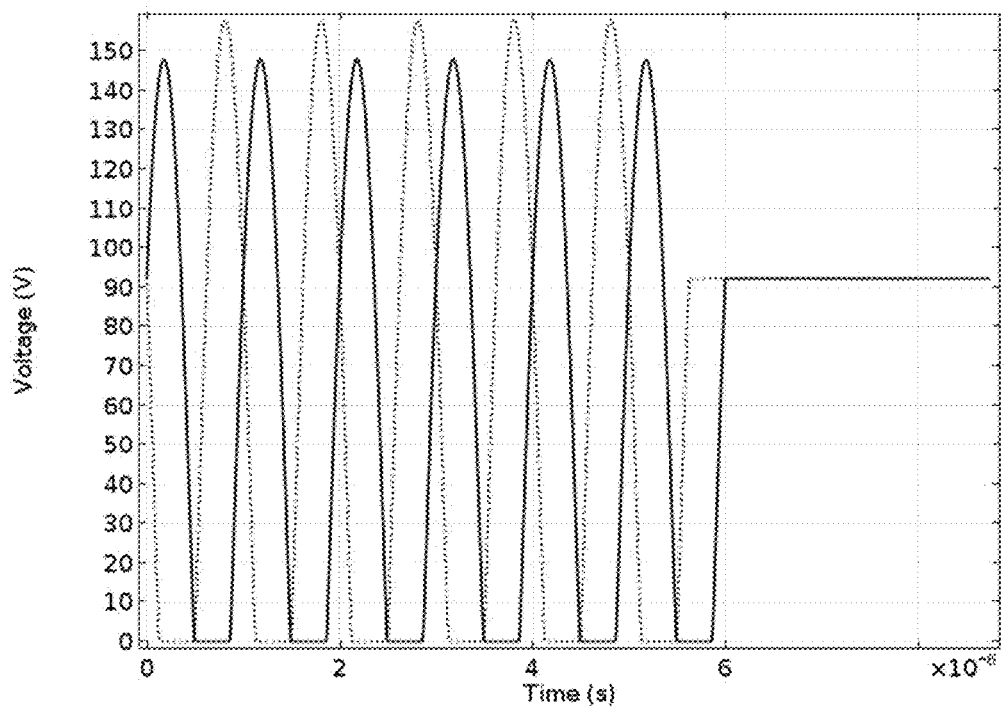
FIG. 21B shows two pulse trains with different phases.
Figure 21C:
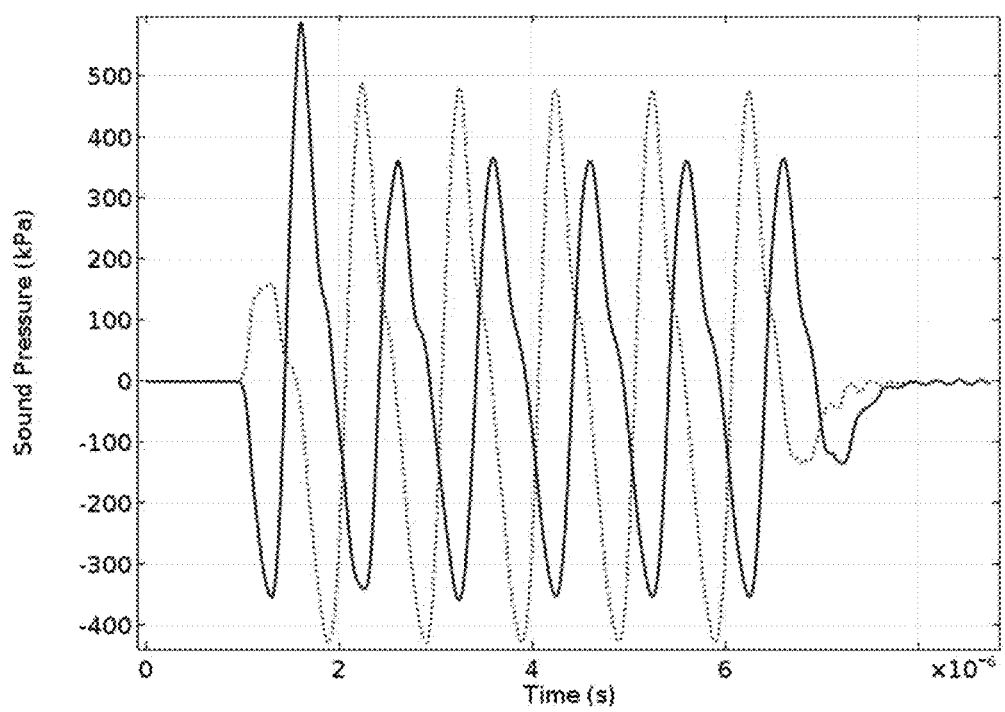
FIG. 21C is a graph of sound pressure corresponding to the pulse trains of FIG. 21B.

FIG. 21B shows two pulse trains with different phases. The solid curve represents a pulse train with a phase of 35.7 degrees. The dotted curve represents a pulse train with a phase of 144.3 degrees. FIG. 21C is a graph of sound pressure corresponding to the pulse trains of FIG. 21B. The solid curve in FIG. 21C represents sound pressure for the pulse train with a phase of 35.7 degrees. The dotted curve in FIG. 21C represents sound pressure for the pulse train with a phase of 144.3 degrees.

By adjusting the phase of an excitation pulse train in advance, the plate of a CMUT can be further pulled forward or completely released. When the excitation phase is 144.3 degrees in advance, the applied AC voltage can reach a maximum value (e.g., 172 Volts in FIG. 21B) and the output pressure can also be at a maximum (e.g., as shown in FIG. 21C). FIGS. 21B and 21C show that both high receive sensitivity and high output pressure can be achieved by adjusting the phase of a half-wave pulse sequence excitation waveform.

As a second example embodiment, a CMUT operates in a collapse mode. The operating frequency of the CMUT is 1 MHz. A 20 μm thick plate for the CMUT is selected. The CMUT has a radius of 372 μm. The gap height is set to 0.7 μm to obtain a reasonable driving voltage. The pull-in voltage is 48.0 V. The DC bias is set to approximately 1.3 times the pull-in voltage, which causes the plate of the CMUT to collapse down onto the substrate.

Figure 22A:
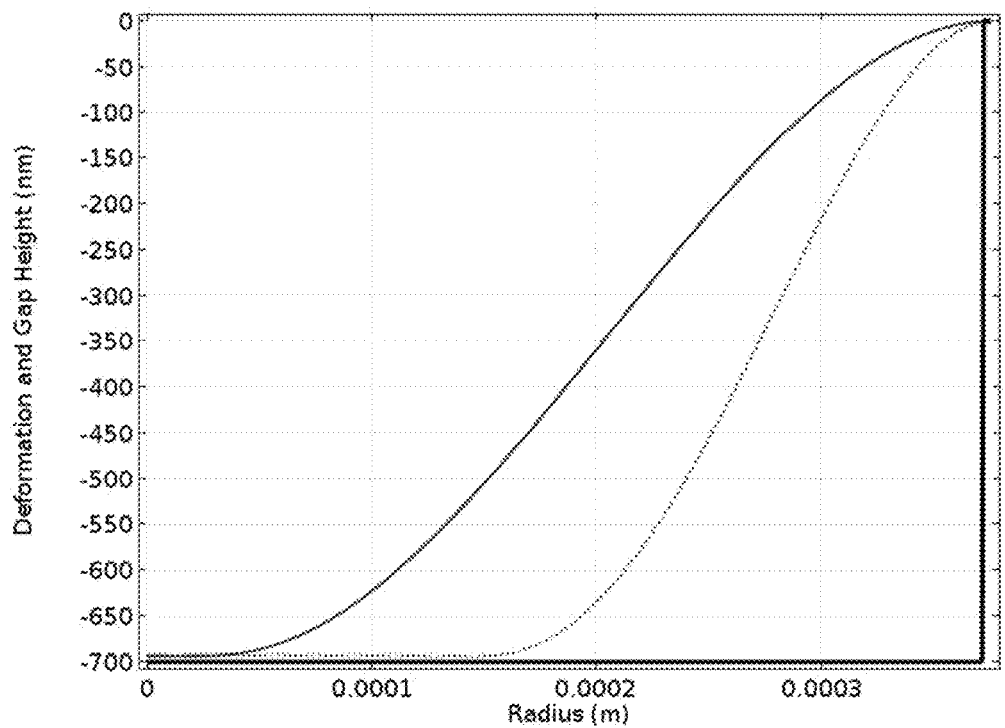
FIG. 22A is a graph of deformation and gap height versus radius for the second example embodiment biased by a pulse train of unipolar pulses.
Figure 22B:
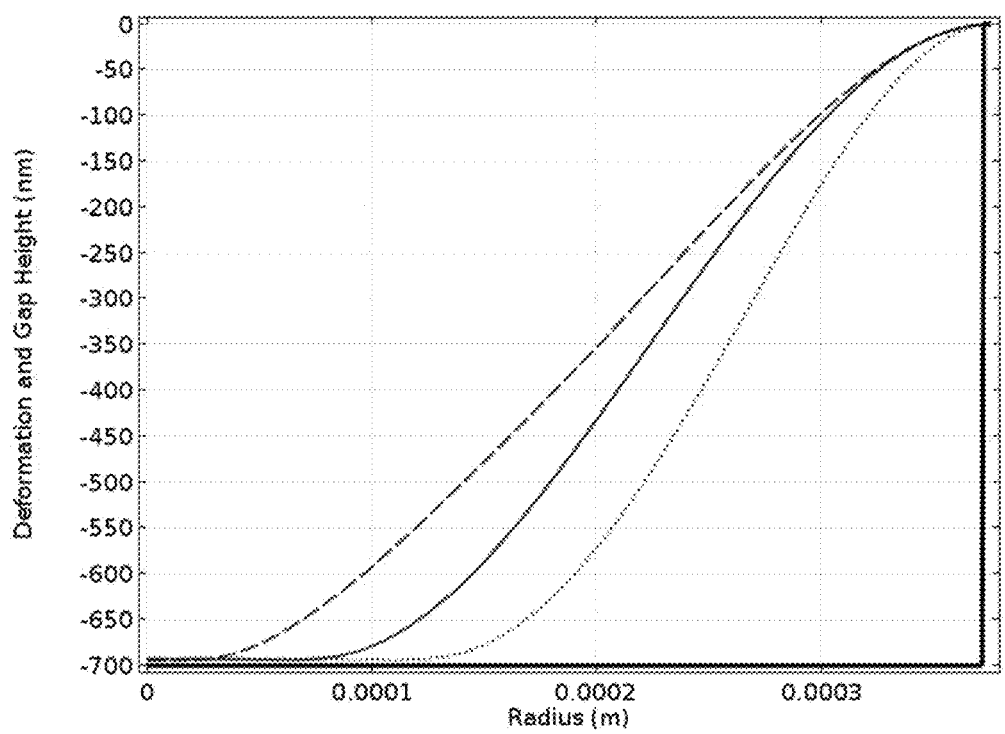
FIG. 22B is a graph of deformation and gap height versus radius for sine wave excitation.

FIG. 22A is a graph of deformation and gap height versus radius for the second example embodiment biased by a pulse train of unipolar pulses. The static deformation after collapsing is represented by the solid curve in FIG. 22A. FIG. 22B is a graph of deformation and gap height versus radius for sine wave excitation. In FIGS. 22A and 22B, the DC bias for the CMUT is approximately 1.3 times the pull-in voltage. For sine wave excitation, a maximum output pressure can be limited by the vibration amplitude to the biased DC position, for example, as shown in FIG. 22B. The dashed and dotted curves show the extremes of the plate deflection in response to the sine wave excitation. The pulse train excitation with unipolar pulses disclosed herein can achieve a larger vibration amplitude as represented by the dotted curve in FIG. 22A. The plate deflection profile upper extreme is represented by the solid curve and the lower extreme is represented by the dotted curve. Accordingly, with such pulse train excitation, output pressure can be significantly increased. In this case, the output pressure can be about 1.4 times of output pressure for sine wave excitation.

Figure 23A:
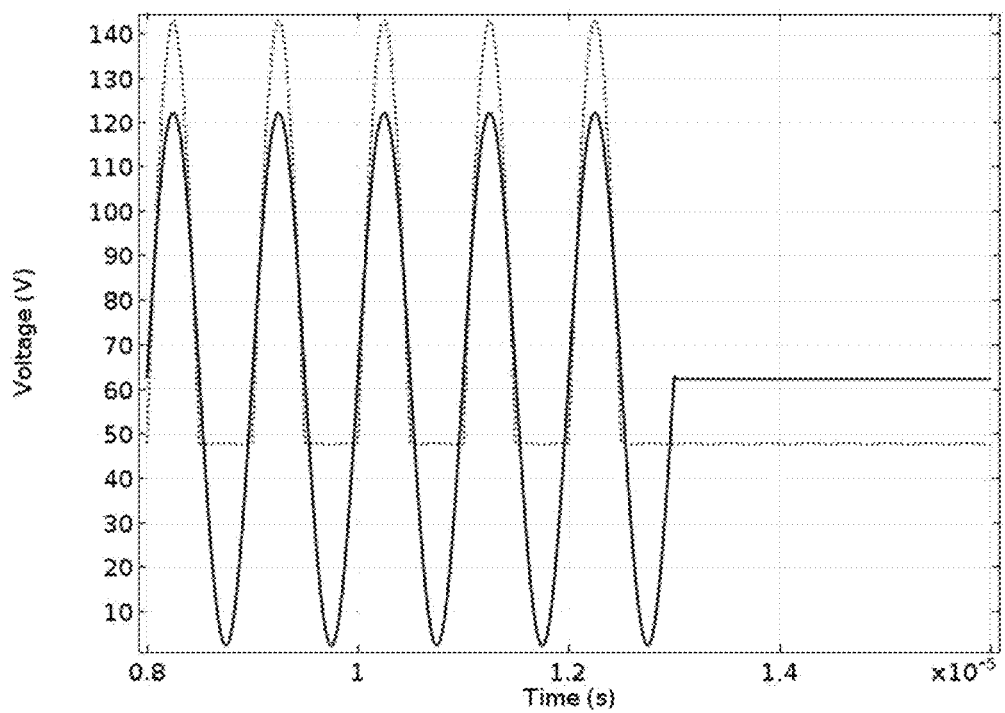
FIG. 23A shows excitation waveforms associated with a collapse mode for the second example embodiment and for a sine wave excitation.
Figure 23B:
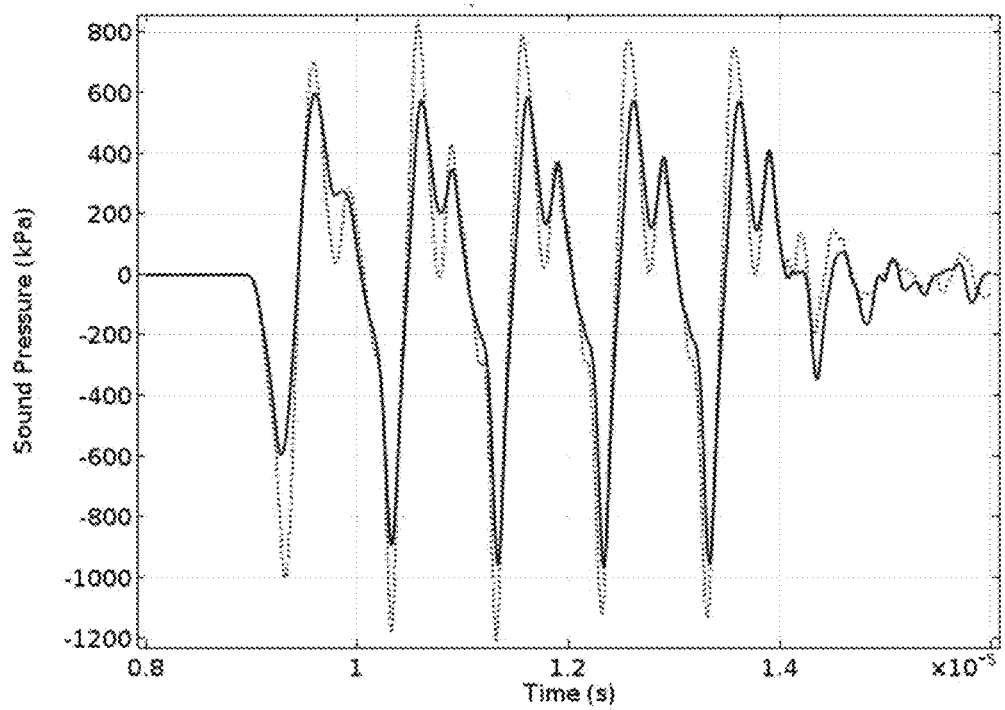
FIG. 23B shows transmit output pressure for the example embodiment and for the sine wave excitation.

FIG. 23A shows excitation waveforms associated with a collapse mode CMUT for the second example embodiment and for a sine wave excitation. FIG. 23B shows transmit output pressure for the example embodiment and for the sine wave excitation. The dotted curve corresponds to the example embodiment. The solid curve corresponds to sine wave excitation. FIG. 23B indicates that output pressure is increased with the excitation for the second example embodiment compared to the full sine wave excitation in the collapse mode.

Pulse train excitation with unipolar pulses can be applied to a CMUT with a contoured electrode in accordance with any suitable principles and advantages disclosed herein.

Figure 24A:
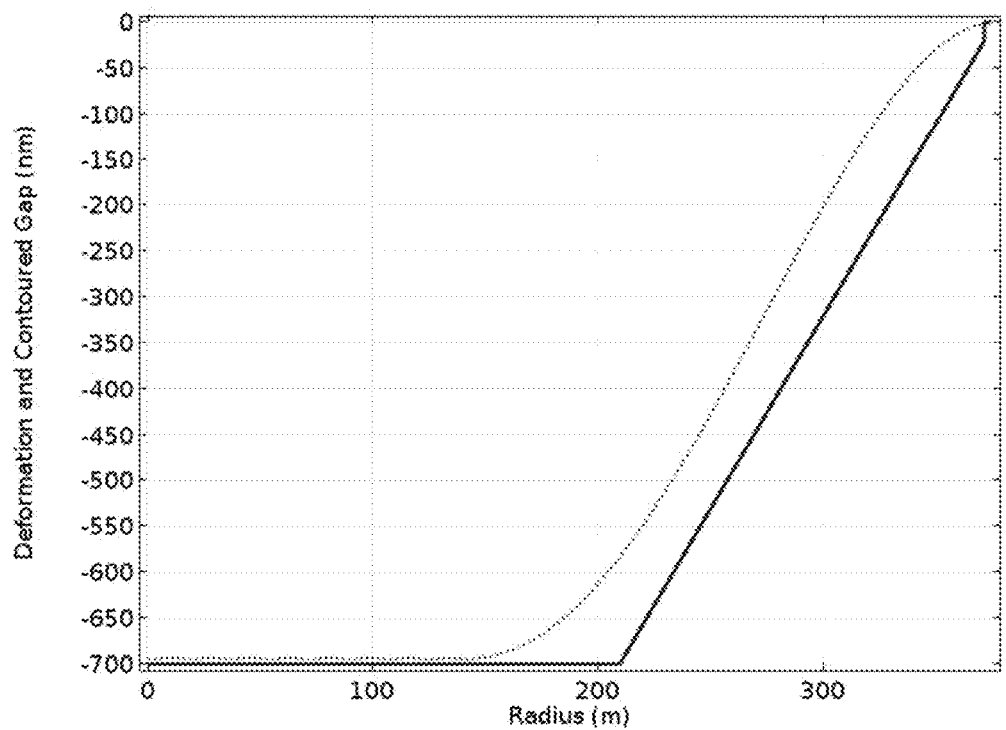
FIG. 24A is a graph of deformation and gap height versus radius.
Figure 24B:
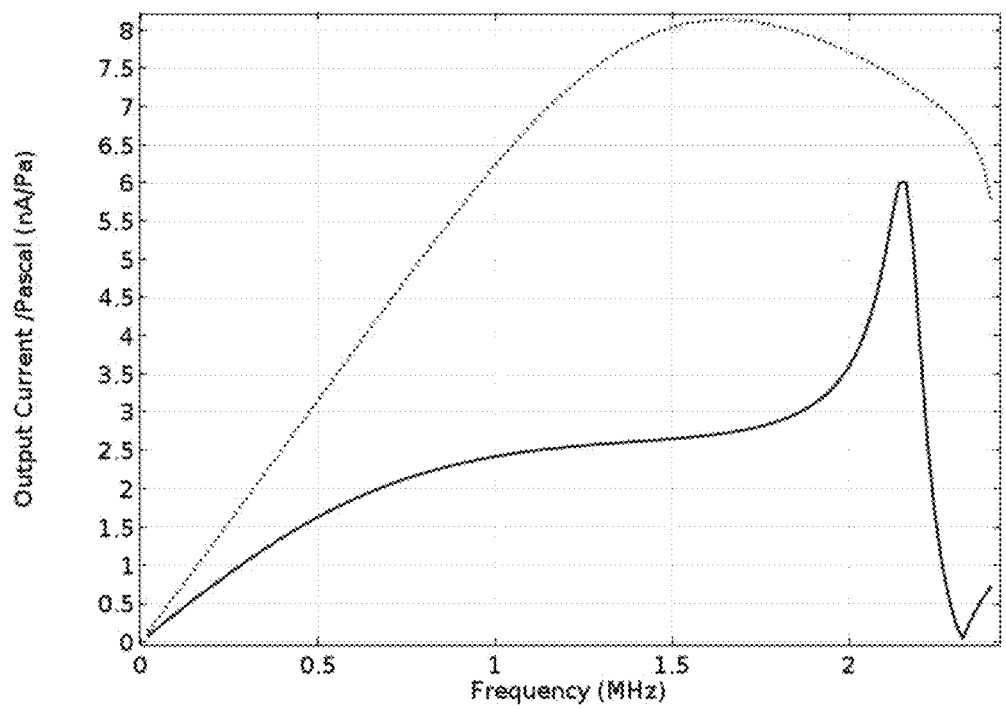
FIG. 24B is a graph of receive sensitivity versus frequency.

Receive sensitivity can be significantly improved with a CMUT having a contoured electrode. FIG. 24A is a graph of deformation and gap height versus radius. FIG. 24B is a graph of output current over pressure versus frequency. In FIGS. 24A and 24B, the driving voltage can be increased to 1.77 times of pull-in voltage of the CMUT to increase the electrical field significantly. The receive sensitivity has been improved around 2.6 times at 1 MHz.

Figure 24C:
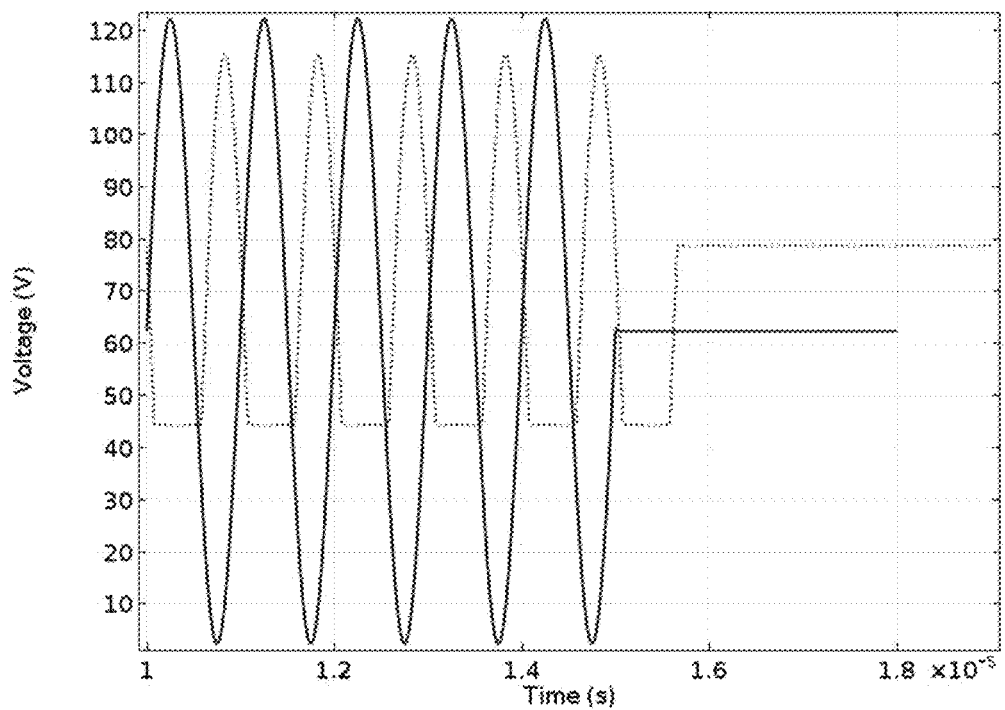
FIG. 24C shows an excitation waveform according to an embodiment and a full sine wave excitation waveform.
Figure 24D:
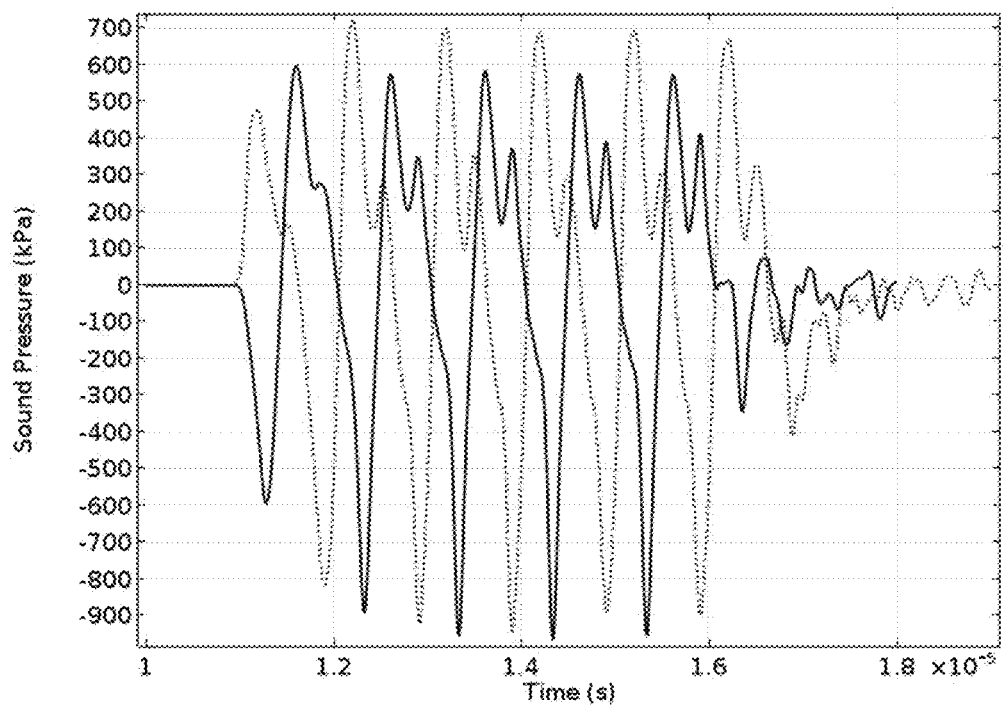
FIG. 24D is a graph of output pressure over time corresponding to the excitation waveforms of FIG. 24C.

FIG. 24C shows an excitation waveform according to an embodiment and a full sine wave excitation waveform. FIG. 24D is a graph of output pressure over time corresponding to the excitation waveforms of FIG. 24C. The dotted curve in FIG. 24D shows an output pressure for the dotted excitation waveform of FIG. 24C being applied to a CMUT with a contoured electrode that is improved related to the solid curve in FIG. 24D corresponding to the solid waveform of FIG. 24C being applied to the CMUT with the contoured electrode. With pulse train excitation and phase adjustment of FIG. 24C, more than about 1.3 times an increase of the transmit output pressure can be achieved.

Figure 25A:
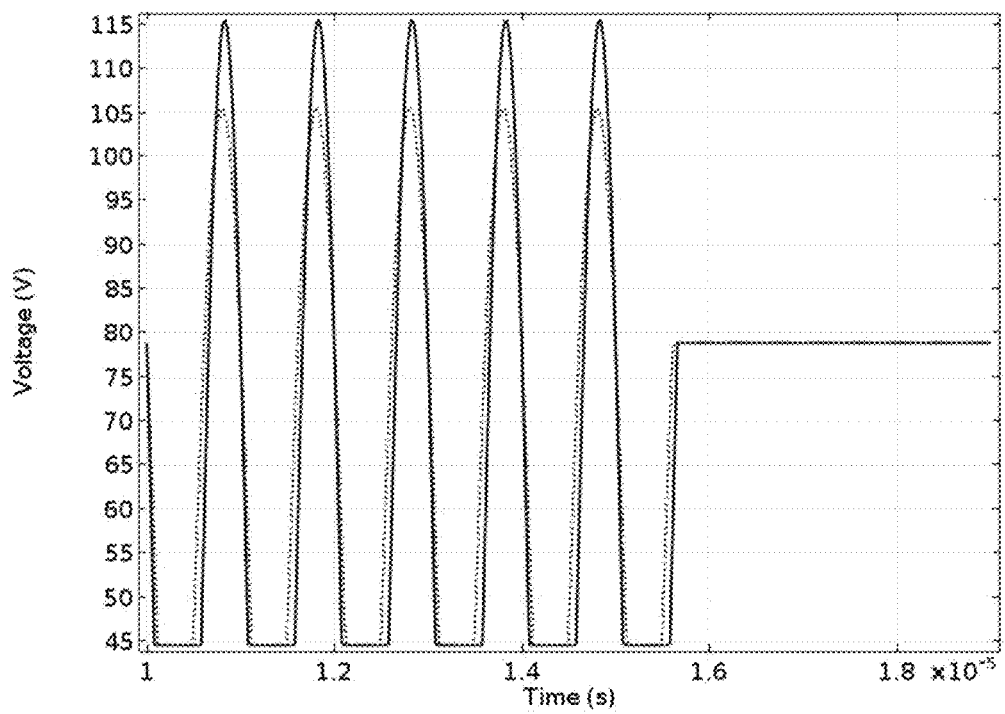
FIG. 25A shows excitation waveforms according to an embodiment.
Figure 25B:
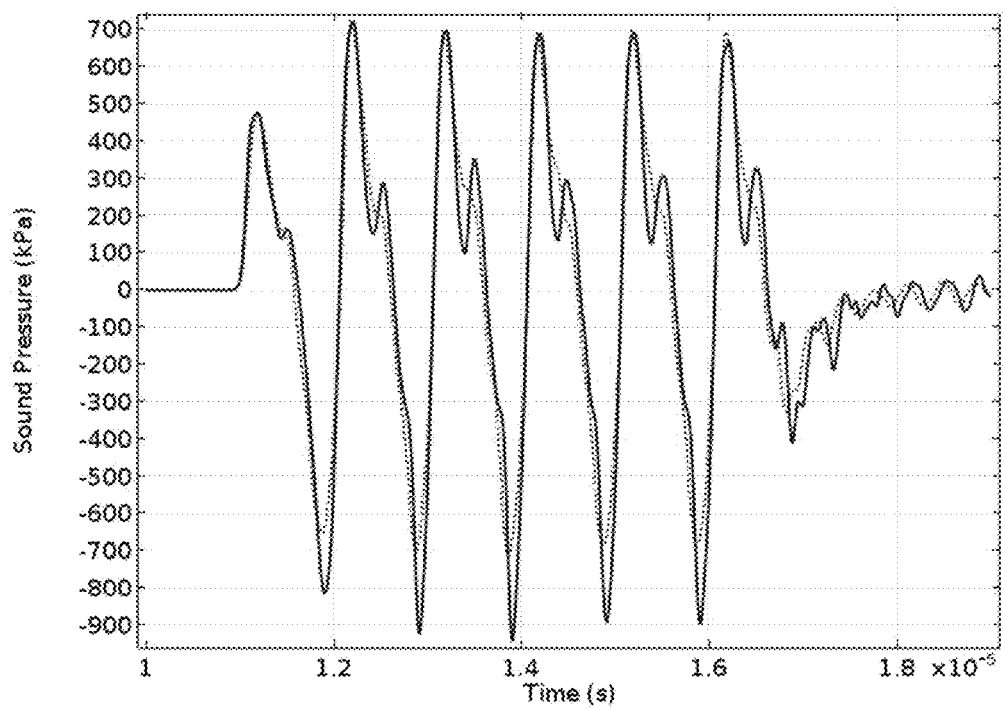
FIG. 25B is a graph of output pressure over time corresponding to the excitation waveforms of FIG. 25A being applied to a CMUT with a contoured substrate.

FIG. 25A shows excitation waveforms according to an embodiment. FIG. 25B is a graph of output pressure over time corresponding to the excitation waveforms of FIG. 25A being applied to a CMUT with a contoured substrate. FIGS. 25A and 25B indicate that applying a pulse train with unipolar pulses to a CMUT with a contoured substrate can significantly suppress harmonics. The excitation frequency or width of the excitation pulse can be set to 0.8 MHz to suppress the harmonics significantly.

Figure 26:
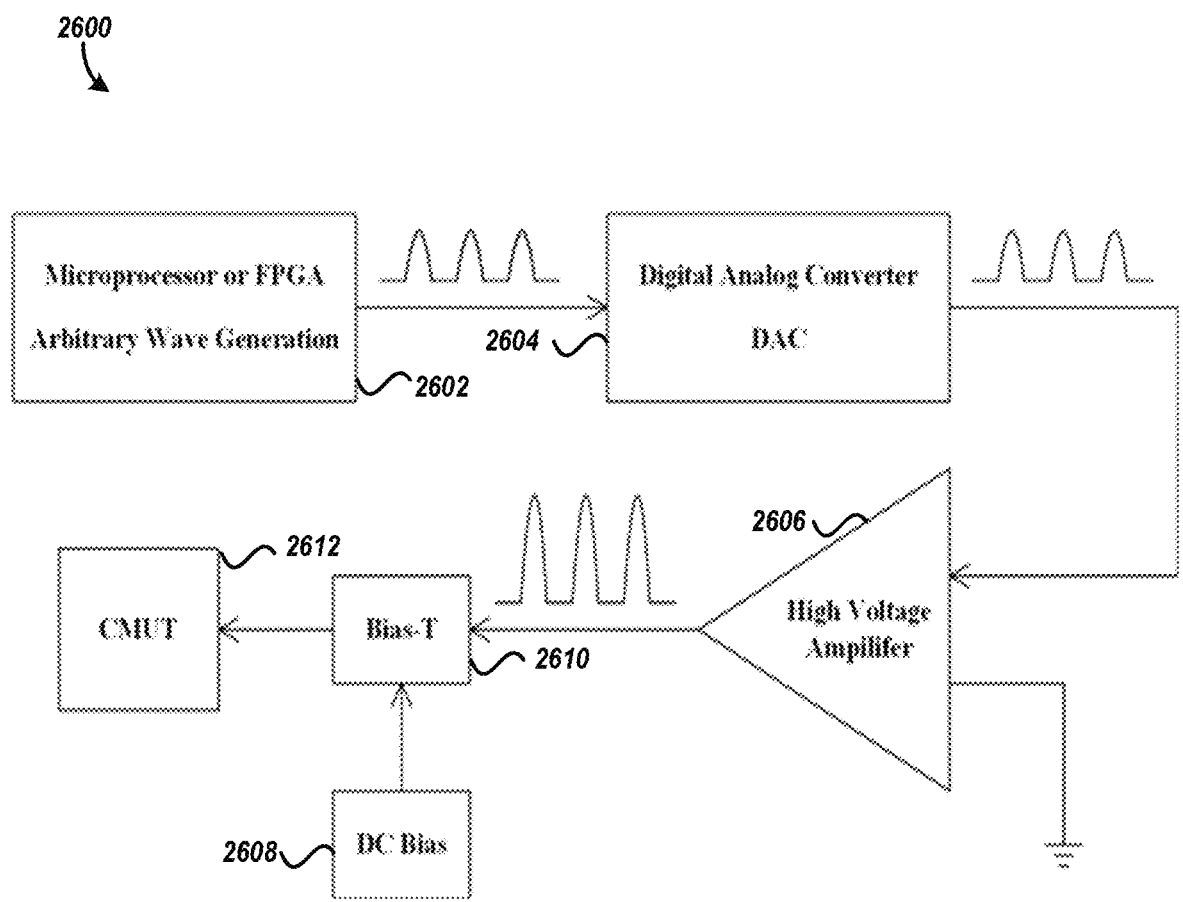
FIG. 26 is a schematic diagram of an ultrasound system that includes example excitation circuitry and a CMUT according to an embodiment.

Pulse trains with unipolar pulses according to embodiments can be generated by any suitable excitation circuitry. FIG. 26 is a schematic diagram of an ultrasound system 2600 that includes example excitation circuitry and a CMUT according to an embodiment. The excitation circuitry can control a phase of the pulses of the pulse train. The excitation circuitry can control an amplitude of the pulses of the pulse train. In the ultrasound system 2600, the excitation circuitry can be configured to generate a pulse train of unipolar pulses in accordance with any suitable principles and advantages disclosed herein.

As illustrated in FIG. 26, the excitation circuitry includes a waveform generator 2602, a digital-to-analog converter (DAC) 2604, an amplifier 2606, a DC bias circuit 2608, and a biasing transistor 2610. The waveform generator 2602 can generate a digital pulse train of unipolar pulses. The waveform generator 2602 can generate any suitable unipolar pulse shape. The waveform generator 2602 can include a microprocessor. The waveform generator 2602 can include a field programmable gate array (FPGA). The DAC 2604 can convert the digital pulse train from the waveform generator 2602 to an analog pulse train. The amplifier 2606 can amplify the analog pulse train provided by the DAC 2604. The amplifier 2606 can be a high voltage amplifier. The DC bias circuit 2608 can generate a DC bias voltage for the pulse train. The DC bias circuit 2608 can adjust the DC bias voltage, for example, to implement any suitable features of the waveforms disclosed herein. The biasing transistor 2610 includes one or more transistors configured to apply an excitation pulse train to the CMUT 2612. The biasing transistor 2610 can apply the output signal from the amplifier 2606 superimposed on a DC bias voltage provided by the DC biasing circuit 2608.

The CMUT 2612 can output a continuous wave of ultrasound energy when excited by the pulse train of unipolar pulses. The CMUT 2612 can operate in conventional mode. The CMUT 2612 can operate in collapse mode. In certain embodiments, the CMUT 2612 has a contoured electrode in accordance with any suitable principles and advantages disclosed herein.

In another embodiment, excitation circuitry can include an amplifier that is DC coupled and generates a DC bias as well as generating a pulse train with unipolar pulses.

Figure 27A:
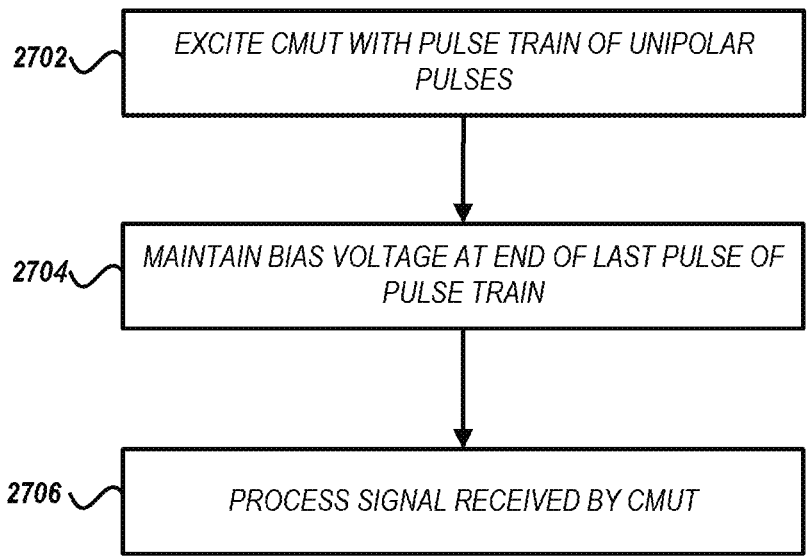
FIG. 27A is a flow diagram for a method of using a CMUT according to an embodiment.

FIG. 27A is a flow diagram for a method 2700 of using a CMUT according to an embodiment. The method 2700 includes electrically exciting the CMUT with a pulse train of unipolar pulses at block 2702. The pulse train can include any suitable features of the pulse trains of unipolar pulses disclosed herein. Any suitable excitation circuitry, such as the excitation circuitry of FIG. 26, can generate the pulse train. The CMUT can be any suitable CMUT. In certain embodiments, the CMUT has a contoured electrode in accordance with an embodiment disclosed herein. A final pulse of the pulse train starts at a first bias voltage and ends at a second bias voltage that is different from the first bias voltage. Pulse trains in FIGS. 17A, 21B, 24C, and 25A illustrate examples of such a final pulse. The second bias voltage can be a bias voltage for receive mode of the CMUT. The second bias voltage can have a larger magnitude than the first bias voltage. The second bias voltage can be less than a pull-in voltage of the CMUT.

At block 2704, the second bias voltage is maintained after the final pulse ends. Examples of maintaining the second bias voltage are also shown in FIGS. 17A, 21B, 24C, and 25A. A DC bias circuit, such as the DC bias circuit 2608 of FIG. 26, can maintain the second bias voltage. The second bias voltage can be a voltage for imaging. Maintaining the second bias voltage at the end of the pulse train can be used for transitioning from HIFU to imaging.

A signal received by at least the capacitive micromachined ultrasonic transducer operating in a receive mode can be processed at block 2706. The received signal is an ultrasound signal. The signal is received by the capacitive micromachined ultrasonic transducer while the second bias voltage is applied to the capacitive micromachined ultrasonic transducer. The receive signal can be used for imaging.

In the method 2700, the excitation pulse train can end at a bias voltage for receive mode. With the method 2700, an ultrasound system can switch between transmit mode and receive mode without switching electronics.

Figure 27B:
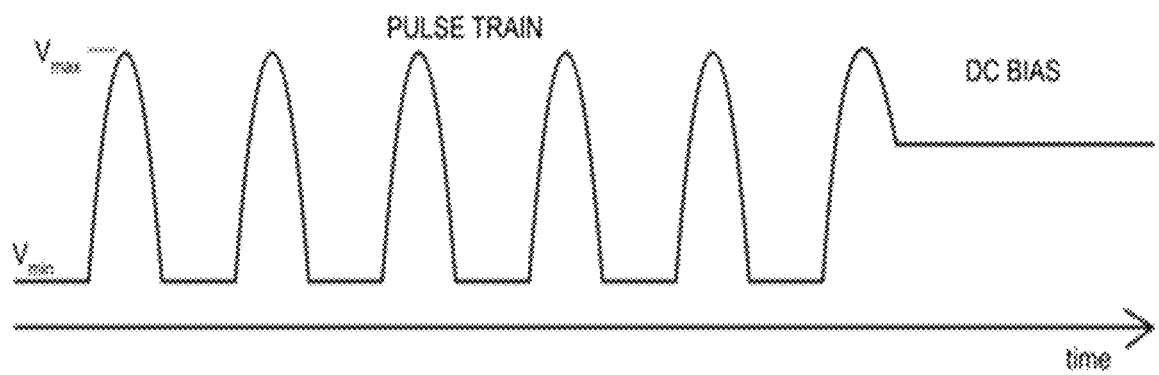
FIG. 27B illustrates an example pulse train associated with the method of FIG. 27A.

FIG. 27B illustrates an example pulse train associated with the method 2700. In FIG. 27B, a transition for the pulse train excitation to a DC bias is shown. HIFU can be transmitted by a CMUT excited with the illustrated pulse train. The transition to the DC bias can be for transitioning from HIFU to imaging. The CMUT can be used for imaging when the DC bias is applied.

The pulse train excitation in accordance with any suitable principles and advantages disclosed herein can be implemented in a variety of ultrasound systems and applications. For example, pulse train excitation disclosed herein can be applied to any suitable capacitive ultrasonic transducer and/or any suitable array of capacitive ultrasonic transducers. Pulse train excitation disclosed herein can be used in HIFU applications, HIFU and imaging applications where an array of CMUTs is used for both HIFU and imaging, and haptic applications, among others. Excitation methods disclosed herein can facilitate improved CMUT design and excitation. Such methods are suitable for large-scale commercialization of such CMUT design based on the excitation methods disclosed herein.

D. Ultrasound Systems Incorporating CMUT with Contoured Electrode and/or Pulse Train Excitation The CMUTs and excitation methods disclosed herein can be implemented in a variety of ultrasound systems. Such ultrasound systems can be configured for a variety of applications, such as ultrasound imaging, HIFU, HIFU and imaging, haptic applications, and the like. Ultrasound can be transmitted and/or received in air, water, tissues, or any other suitable medium in such systems. CMUTs disclosed herein can be implemented as an ultrasonic transducer for any suitable ultrasound application. Pulse train excitation with unipolar pulses disclosed herein can be applied to any suitable CMUT.

Figure 28A:
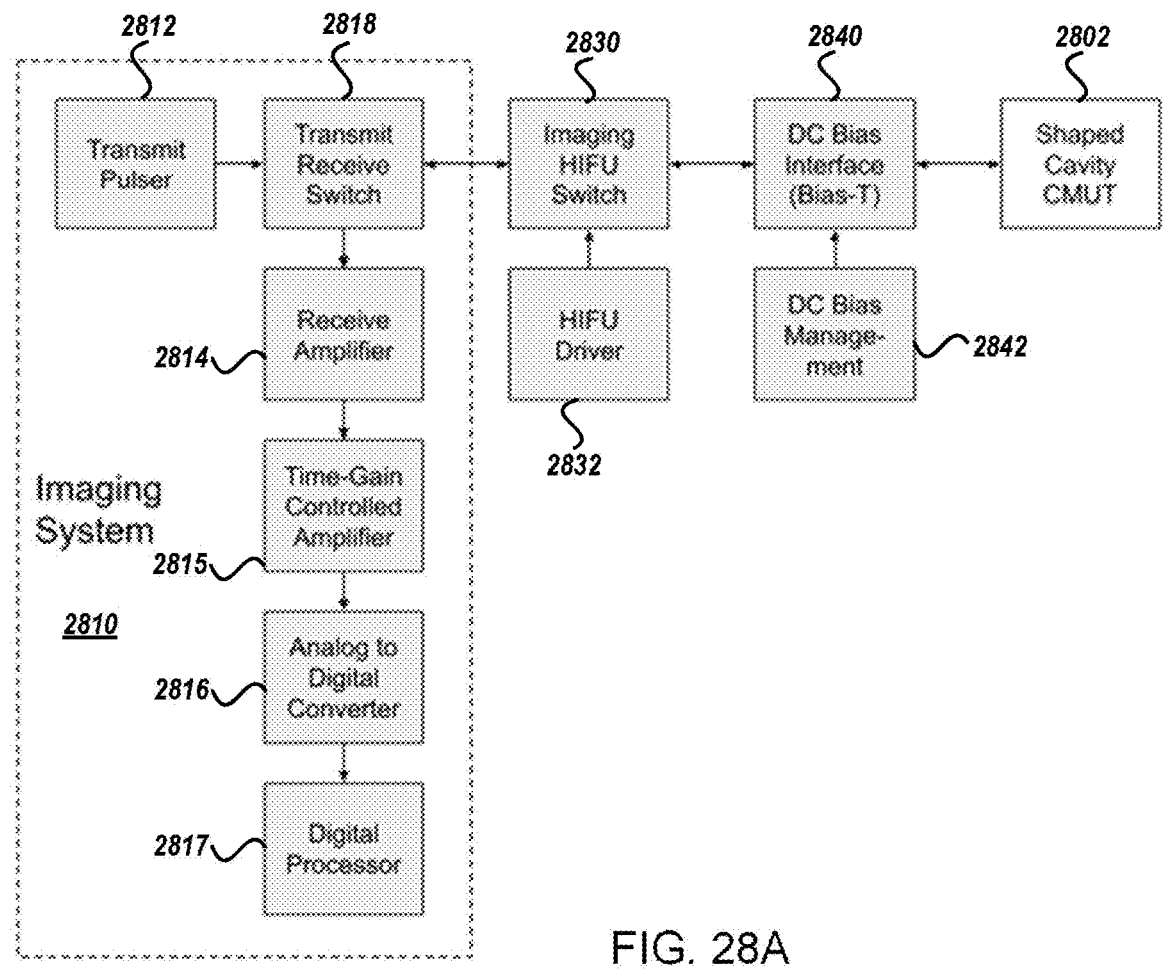
FIG. 28A is a schematic block diagram of an example ultrasound system according to an embodiment.

FIG. 28A is a schematic block diagram of an example ultrasound system 2800 according to an embodiment. The ultrasound system 2800 is configured to perform ultrasound imaging and to apply HIFU.

The ultrasound imaging system 2800 includes CMUT 2802. The CMUT 2802 has a shaped cavity in accordance with any suitable principles and advantages disclosed herein. The CMUT 2802 can include a contoured electrode of any of the embodiments disclosed herein.

The ultrasound system 2800 includes an imaging system 2810. The imaging system 2810 includes transmit circuitry and receive circuitry. The transmit circuitry includes a transmit pulser 2812. The receive circuitry includes a receive amplifier 2814, a time-gain controlled amplifier 2815, an analog-to-digital converter (ADC) 2816, and a digital signal processor 2817. The digital signal processor 2817 can output image data associated with an ultrasound signal received by the system 2800. A transmit/receive switch 2818 of the imaging system 2810 can toggle the imaging system 2810 between transmit and receive mode. In the transmit mode, the transmit circuitry of the imaging system 2810 can be electrically connected to an imaging/HIFU switch 2830 of the ultrasound system 2800. In the receive mode, the received circuitry of the imaging system 2810 can be electrically connected to an imaging/HIFU switch 2830 of the ultrasound system 2800.

The imaging/HIFU switch 2830 can toggle the ultrasound system 2800 between imaging mode where the ultrasound system 2800 performs imaging and HIFU mode where the ultrasound system 2800 applies HIFU. The ultrasound system 2800 includes a HIFU driver 2832. The HIFU driver 2832 can generate a voltage for applying HIFU.

The ultrasound imaging system 2800 includes a DC bias interface 2840. The DC bias management circuit 2842 can generate a DC bias voltage and provide the DC bias voltage to the DC bias interface 2840. The DC bias interface 2840 can apply the DC bias. Accordingly, the CMUT 2802 can receive a pulse train with a DC bias. The CMUT 2802 can also receive a DC bias for imaging mode.

Figure 28B:
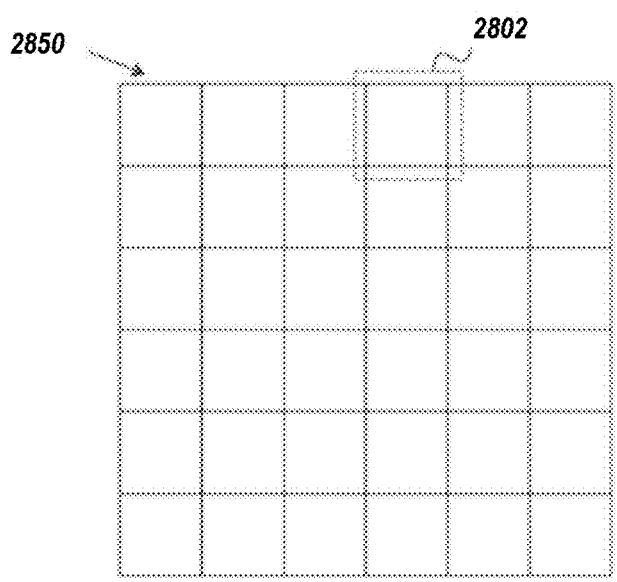
FIG. 28B illustrates an example CMUT array.

FIG. 28B illustrates an example CMUT array 2850. The CMUT 2802 of FIG. 28A can be included in the CMUT array 2850. FIG. 28A illustrates circuitry in communication with the CMUT 2802. Any suitable circuitry can be connected to other CMUTs of the CMUT array 2850 for transmitting and/or receiving ultrasound. The illustrated CMUT array 2850 is a 2-dimensional array. In other applications, the CMUT 2802 of FIG. 28A can be included in a 1-dimensional array. The CMUT 2802 can be included in array with any suitable number of CMUTs.

E. Other Considerations

Various modifications to the implementations described in this disclosure will be readily apparent to those skilled in the art, and the generic principles defined herein can be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "example" is used exclusively herein to mean "serving as an example, instance, or illustration." Any implementation described herein as "example" is not necessarily to be construed as preferred or advantageous over other implementations, unless otherwise stated.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Additionally, other implementations are within the scope of the following claims. In some cases, the actions recited in the claims can be performed in a different order and still achieve desirable results.

It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. A capacitive micromachined ultrasound transducer (CMUT), comprising:
    a contoured electrode defining a central axis, the contoured electrode extending from a central electrode region that intersects the central axis to an outer electrode region;
    a substrate supporting the contoured electrode; and
    a plate at least partially axially spaced apart from the contoured electrode forming a cavity therebetween, the plate extending from a central plate region that intersects the central axis to an outer plate region, wherein a voltage applied across the contoured electrode and the plate deflects the plate from an undeflected configuration into a deflected configuration,
    wherein the substrate comprises one or more of the following: glass, quartz, sapphire, diamond, and metal,
    wherein, in the undeflected configuration, a first axial distance from a point within the central plate region to a point within the central electrode region is greater than a second axial distance from a point within the outer plate region to a point within the outer electrode region, and
    wherein, in the undeflected configuration, at least a portion of the outer electrode region of the contoured electrode contacts at least a portion of the outer plate region of the plate.

2. The CMUT of claim 1, wherein a two-dimensional cross-sectional profile of the contoured electrode is one or more of: piece-wise linear, curved, and stepped.

3. The CMUT of claim 1, the contoured electrode including one or more of the following: at least one planar portion, at least one concave portion, and at least one convex portion.

4. A CMUT array comprising a plurality of the CMUTs of claim 1.

5. A capacitive micromachined ultrasonic transducer (CMUT), comprising:
a contoured electrode defining a central axis, the contoured electrode extending from a central electrode region that intersects the central axis to an outer electrode region;
a substrate supporting the contoured electrode; and
a plate at least partially axially spaced apart from the contoured electrode forming a cavity therebetween, the plate extending from a central plate region that intersects the central axis to an outer plate region, wherein a voltage applied across the contoured electrode and the plate deflects the plate from an undeflected configuration into a deflected configuration,
wherein the substrate comprises one or more of the following: glass, quartz, sapphire, diamond, and metal,
wherein, in the undeflected configuration, a first axial distance from a point within the central plate region to a point within the central electrode region is greater than a second axial distance from a point within the outer plate region to a point within the outer electrode region, and
wherein the first axial distance when the plate is undeflected is between 10 nanometers and 200 microns.

6. The CMUT of claim 5, wherein, when the plate is deflected, the first and second axial distances each decrease at least 10% relative to when the plate is undeflected.

7. The CMUT of claim 5, wherein a two-dimensional cross-sectional profile of the contoured electrode has varying heights.

8. The CMUT of claim 5, wherein a two-dimensional cross-sectional profile of the contoured electrode is one or more of: piece-wise linear, curved, and stepped.

9. The CMUT of claim 5, the contoured electrode including one or more of the following: at least one planar portion, at least one concave portion, and at least one convex portion.

10. The CMUT of claim 5, the plate comprising metal.

11. The CMUT of claim 5, wherein the substrate comprises an electrically conductive substrate, and the contoured electrode is a contoured surface of the electrically conductive substrate.

12. The CMUT of claim 5, the contoured electrode comprising metal on the substrate.

13. The CMUT of claim 5, wherein a two-dimensional cross-sectional profile of the contoured electrode has a shape that generally corresponds to a configuration of the plate when the plate is in the deflected configuration.

14. The CMUT of claim 5, wherein a thickness of the plate is between 0.1 and 200 microns.

15. The CMUT of claim 5, further comprising a plate support surrounding the contoured electrode and contacting the plate.

16. A capacitive micromachined ultrasonic transducer (CMUT), comprising:
a contoured electrode having a central electrode region, a mid electrode region, and an outer electrode region;
a substrate supporting the contoured electrode; and
a plate at least partially spaced apart from the contoured electrode forming a cavity therebetween, the plate having a central plate region, a mid plate region, and an outer plate region, wherein an electrical potential between the contoured electrode and the plate deflects the plate from an undeflected configuration into a deflected configuration, wherein, when the plate is undeflected, a first distance between the central plate region and the central electrode region is greater than a second distance between the mid plate region and the mid electrode region, and the second distance is greater than a third distance between the outer plate region and the outer electrode region, wherein at least one of the substrate or the plate comprises metal, and wherein the first distance when the plate is undeflected is between 10 nanometers and 200 microns.

17. The CMUT of claim 16, wherein a two-dimensional cross-sectional profile of the contoured electrode is one or more of: piece-wise linear, curved, and stepped.

18. The CMUT of claim 16, the contoured electrode including one or more of the following: at least one planar portion, at least one concave portion, and at least one convex portion.

19. The CMUT of claim 16, wherein, when the plate is deflected, the first, second and third distances each decrease at least 10% relative to when the plate is undeflected.

20. The CMUT of claim 16, wherein a thickness of the plate is between 0.1 and 200 microns.

* * * * *